(12) United States Patent
Smalley

(10) Patent No.: US 8,601,405 B2
(45) Date of Patent: *Dec. 3, 2013

(54) METHODS OF AND APPARATUS FOR ELECTROCHEMICALLY FABRICATING STRUCTURES VIA INTERLACED LAYERS OR VIA SELECTIVE ETCHING AND FILLING OF VOIDS

(75) Inventor: Dennis R. Smalley, Newhall, CA (US)

(73) Assignee: Microfabrica Inc., Van Nuys, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/432,964

(22) Filed: Mar. 28, 2012

(65) Prior Publication Data

US 2012/0261267 A1    Oct. 18, 2012

Related U.S. Application Data

(63) Continuation of application No. 12/851,811, filed on Aug. 6, 2010, now abandoned, which is a continuation of application No. 11/544,899, filed on Oct. 6, 2006, now Pat. No. 7,828,952, which is a continuation of application No. 10/434,519, filed on May 7, 2003, now Pat. No. 7,252,861.

(60) Provisional application No. 60/379,130, filed on May 7, 2002.

(51) Int. Cl.
*G06F 17/50*     (2006.01)

(52) U.S. Cl.
USPC ................ 716/54; 716/51; 716/55

(58) Field of Classification Search
USPC ............................. 716/51, 54–55
See application file for complete search history.

(56) References Cited

U.S. PATENT DOCUMENTS

| | | | |
|---|---|---|---|
| 3,620,933 A | 11/1971 | Grunwald et al. | |
| 5,190,637 A | 3/1993 | Guckel | |
| 5,824,374 A | 10/1998 | Bradley, Jr. et al. | |
| 6,027,630 A | 2/2000 | Cohen | |
| 6,029,096 A * | 2/2000 | Manners et al. | 700/120 |
| 6,197,181 B1 | 3/2001 | Chen | |
| 6,235,624 B1 | 5/2001 | Sasaki et al. | |
| 6,287,968 B1 | 9/2001 | Yu et al. | |

(Continued)

OTHER PUBLICATIONS

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

(Continued)

*Primary Examiner* — Naum Levin
(74) *Attorney, Agent, or Firm* — Dennis R. Smalley

(57) ABSTRACT

Multi-layer structures are electrochemically fabricated by depositing a first material, selectively etching the first material (e.g. via a mask), depositing a second material to fill in the voids created by the etching, and then planarizing the depositions so as to bound the layer being created and thereafter adding additional layers to previously formed layers. The first and second depositions may be of the blanket or selective type. The repetition of the formation process for forming successive layers may be repeated with or without variations (e.g. variations in: patterns; numbers or existence of or parameters associated with depositions, etchings, and or planarization operations; the order of operations, or the materials deposited). Other embodiments form multi-layer structures using operations that interlace material deposited in association with some layers with material deposited in association with other layers.

1 Claim, 61 Drawing Sheets

(56) References Cited

U.S. PATENT DOCUMENTS

| | | | |
|---|---|---|---|
| 6,355,147 | B1 | 3/2002 | Griffiths et al. |
| 6,518,664 | B2 | 2/2003 | Miyamoto |
| 6,562,656 | B1 | 5/2003 | Ho |
| 6,572,742 | B1 | 6/2003 | Cohen |
| 6,740,222 | B2 | 5/2004 | Cohn |
| 6,858,121 | B2 | 2/2005 | Basol |
| 6,998,358 | B2 | 2/2006 | French et al. |
| 7,160,429 | B2 | 1/2007 | Cohen et al. |
| 7,163,614 | B2 * | 1/2007 | Cohen ............ 205/118 |
| 7,229,542 | B2 | 6/2007 | Bang |
| 7,239,219 | B2 * | 7/2007 | Brown et al. ........ 333/156 |
| 7,250,101 | B2 | 7/2007 | Thompson et al. |
| 7,252,861 | B2 | 8/2007 | Smalley |
| 7,259,640 | B2 | 8/2007 | Brown et al. |
| 7,288,178 | B2 | 10/2007 | Cohen et al. |
| 7,303,663 | B2 | 12/2007 | Cohen et al. |
| 7,372,616 | B2 | 5/2008 | Bang et al. |
| 7,384,530 | B2 | 6/2008 | Cohen et al. |
| 7,527,721 | B2 | 5/2009 | Lembrikov et al. |
| 7,828,952 | B2 | 11/2010 | Smalley |
| 7,830,228 | B2 * | 11/2010 | Brown et al. ........ 333/160 |
| 2001/0014409 | A1 | 8/2001 | Cohen |
| 2003/0221968 | A1 | 12/2003 | Cohen et al. |
| 2004/0000489 | A1 | 1/2004 | Zhang et al. |
| 2004/0004001 | A1 | 1/2004 | Cohen et al. |
| 2004/0065550 | A1 | 4/2004 | Zhang |
| 2004/0065555 | A1 | 4/2004 | Zhang |

OTHER PUBLICATIONS

Adam L. Cohen, et al., "EFAB: Rapid, Low-Cost Desktop Micromachining of High Aspect Ratio True 3-D MEMS", Proc. $12^{th}$ IEEE Micro Electro Mechanical Systems Workshop, IEEE, Jan. 17-21, 1999, pp. 244-251.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Adam L. Cohen, "3-D Micromachining by Electrochemical Fabrication", Micromachine Devices, Mar. 1999, pp. 6-7.

Gang Zhang, et al., "EFAB: Rapid Desktop Manufacturing of True 3-D Microstructures", Proc. $2^{nd}$ International Conference on Integrated MicroNanotechnology for Space Applications, The Aerospace Co., Apr. 1999.

F. Tseng, et al., "EFAB: High Aspect Ratio, Arbitrary 3-D Metal Microstructures Using a Low-Cost Automated Batch Process", $3^{rd}$ International Workshop on High Aspect Ratio Microstructure Technology (HARMST'99), Jun. 1999.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

"Microfabrication—Rapid Prototyping's Killer Application", Rapid Prototyping Report, CAD/CAM Publishing, Inc., Jun. 1999, pp. 1-5.

Harshbarger, Eric, "The Desk . . . ", http://www.ericharshbarger.org/lego/desk, Aug. 25 2000.

* cited by examiner

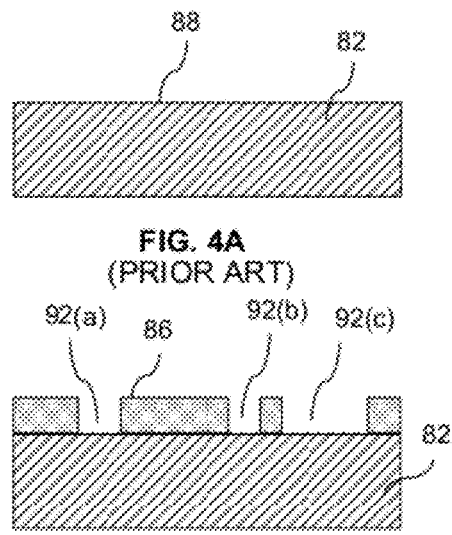
FIG. 4A
(PRIOR ART)
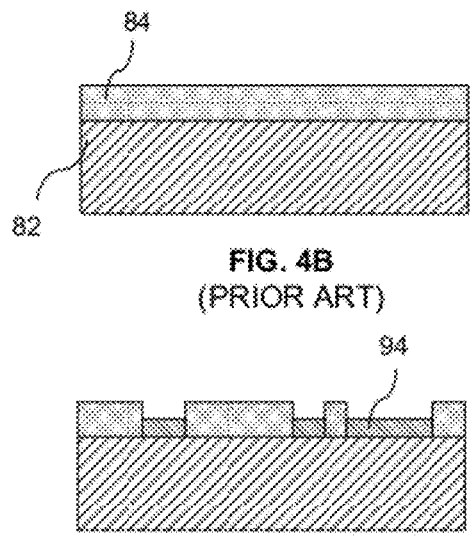
FIG. 4B
(PRIOR ART)
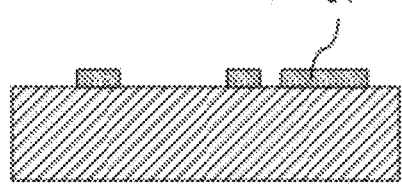
FIG. 4C
(PRIOR ART)
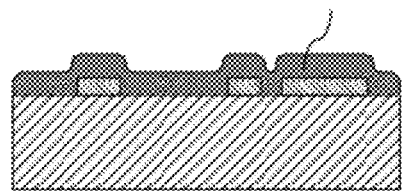
FIG. 4D
(PRIOR ART)
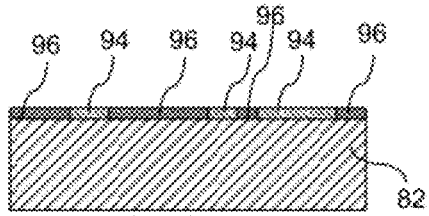
FIG. 4E
(PRIOR ART)
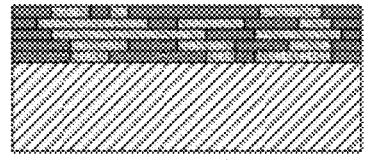
FIG. 4F
(PRIOR ART)
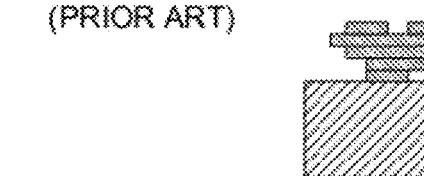
FIG. 4G
(PRIOR ART)
FIG. 4H
(PRIOR ART)
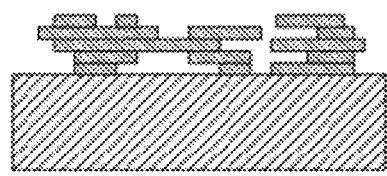
FIG. 4I
(PRIOR ART)

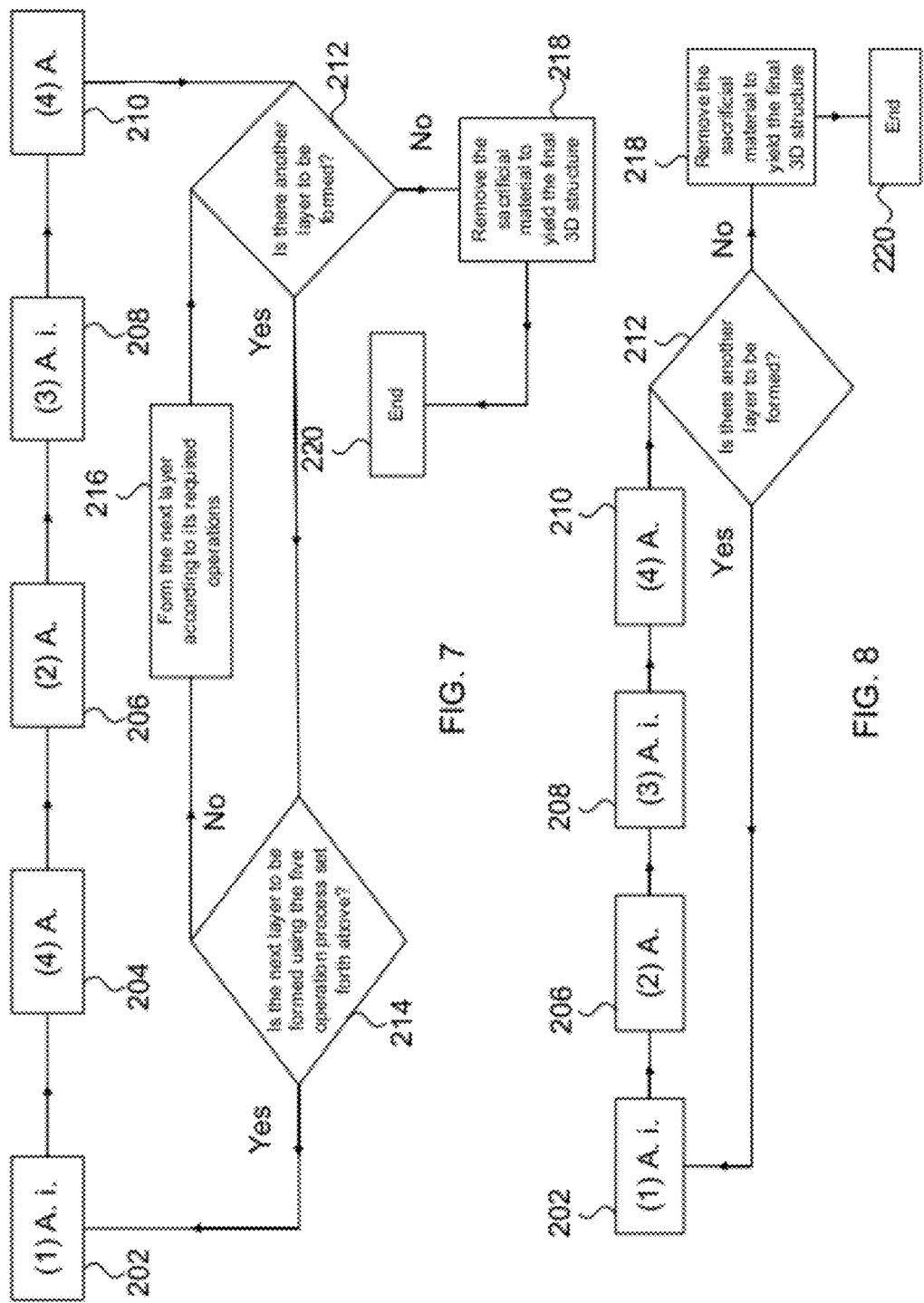

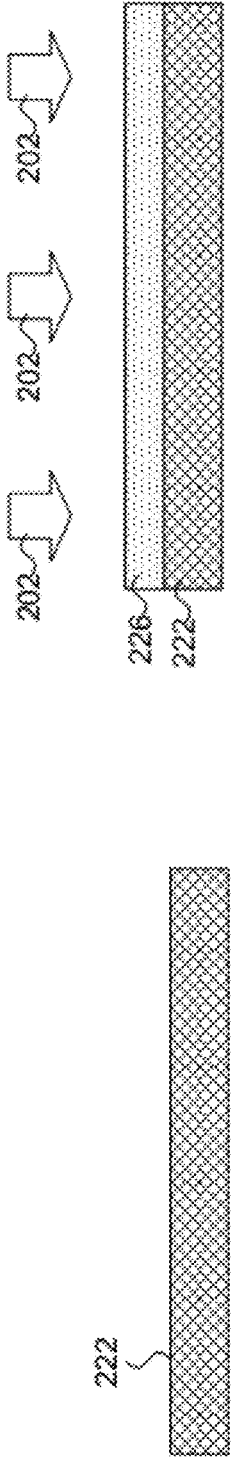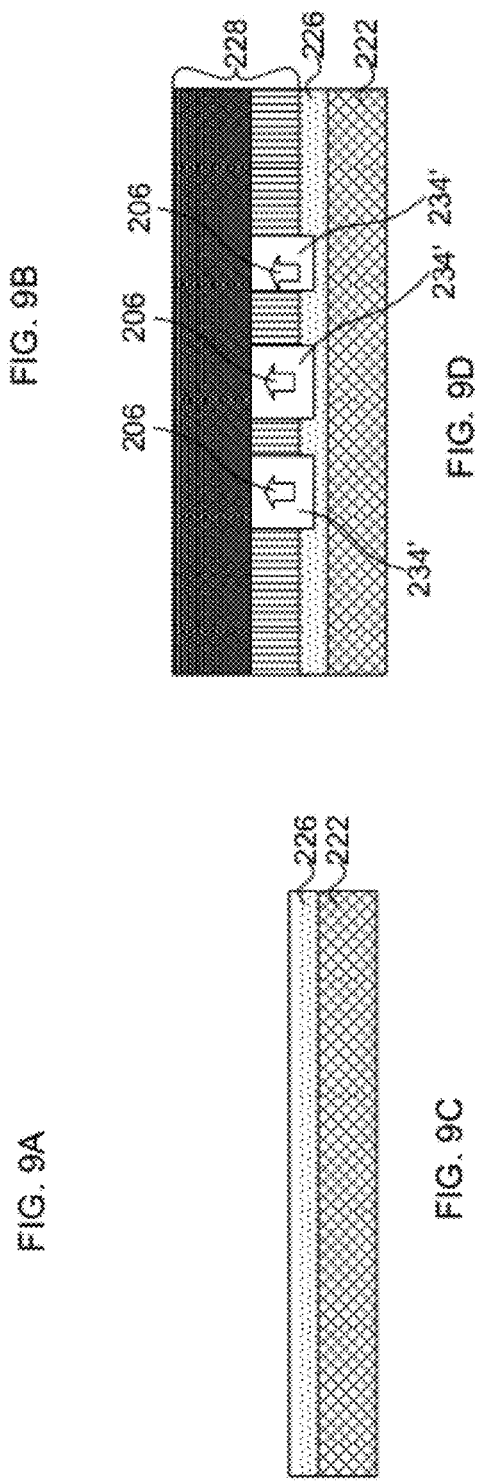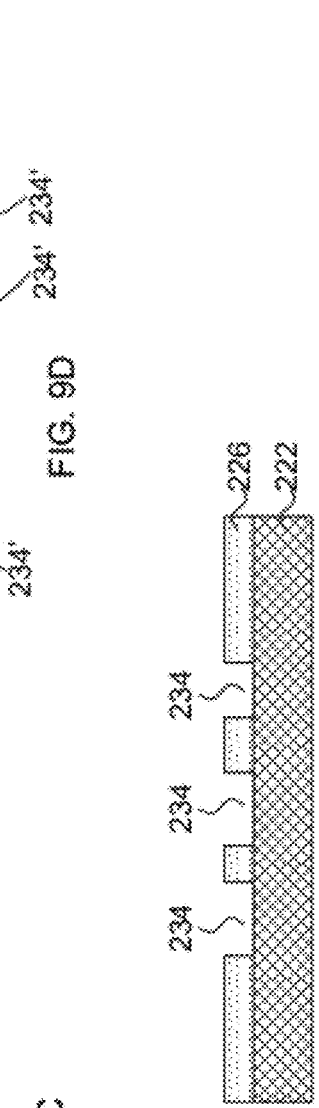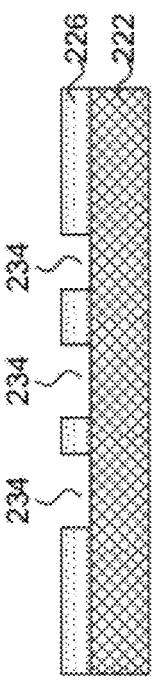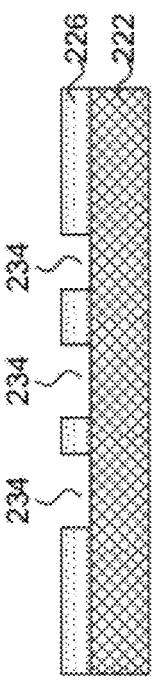

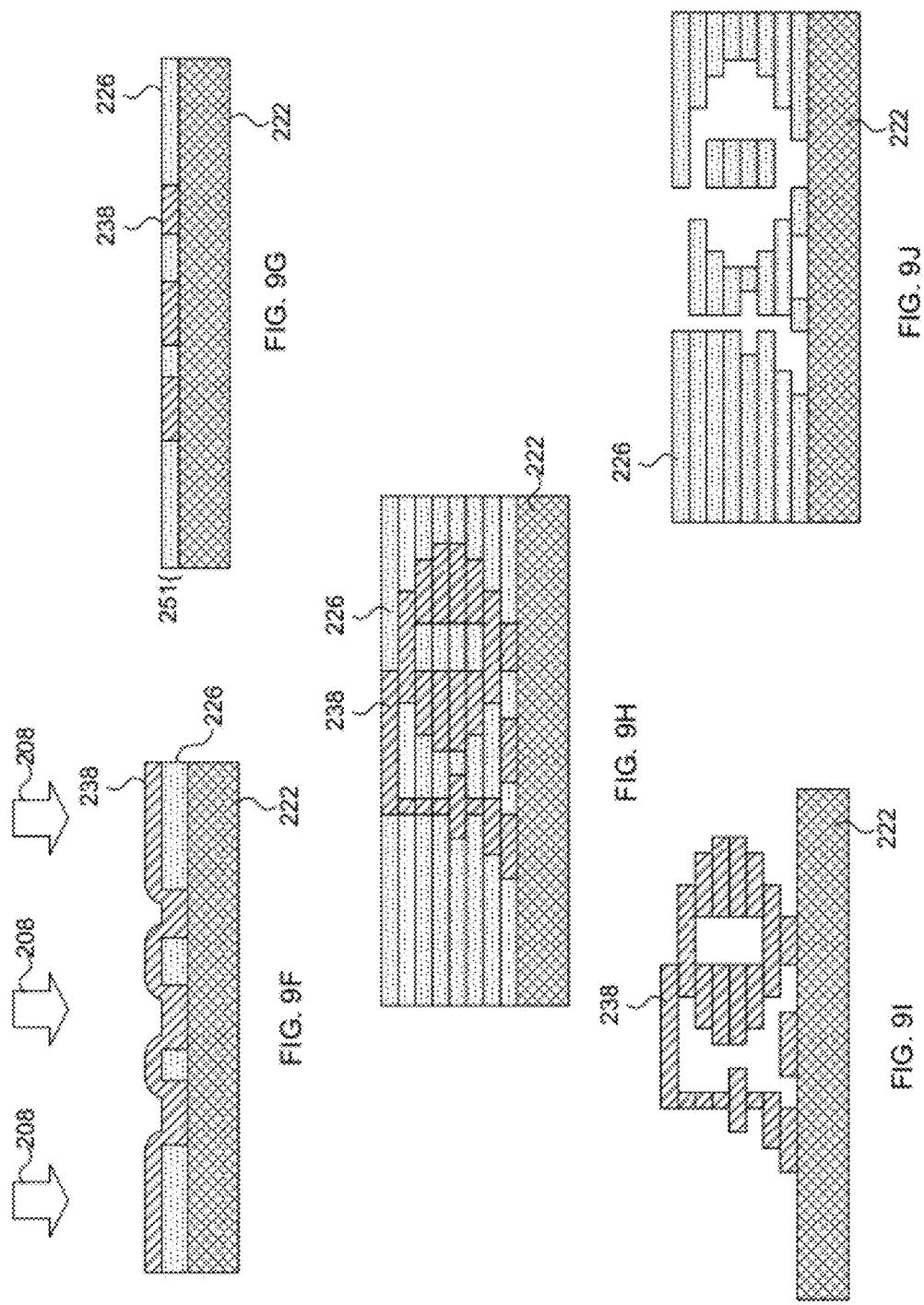

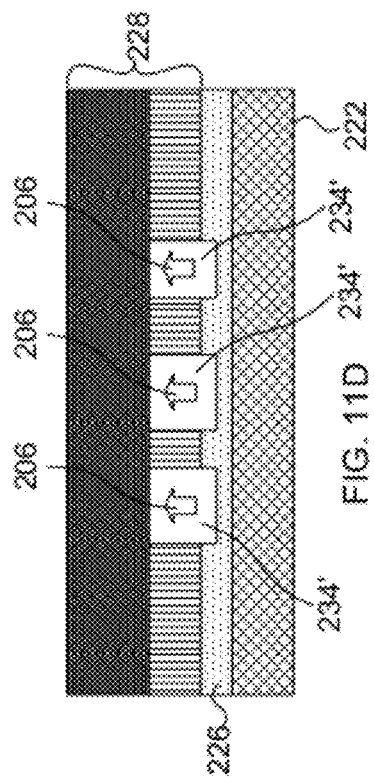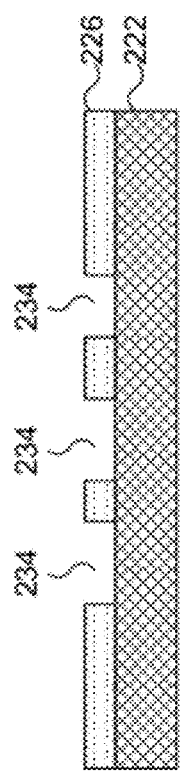

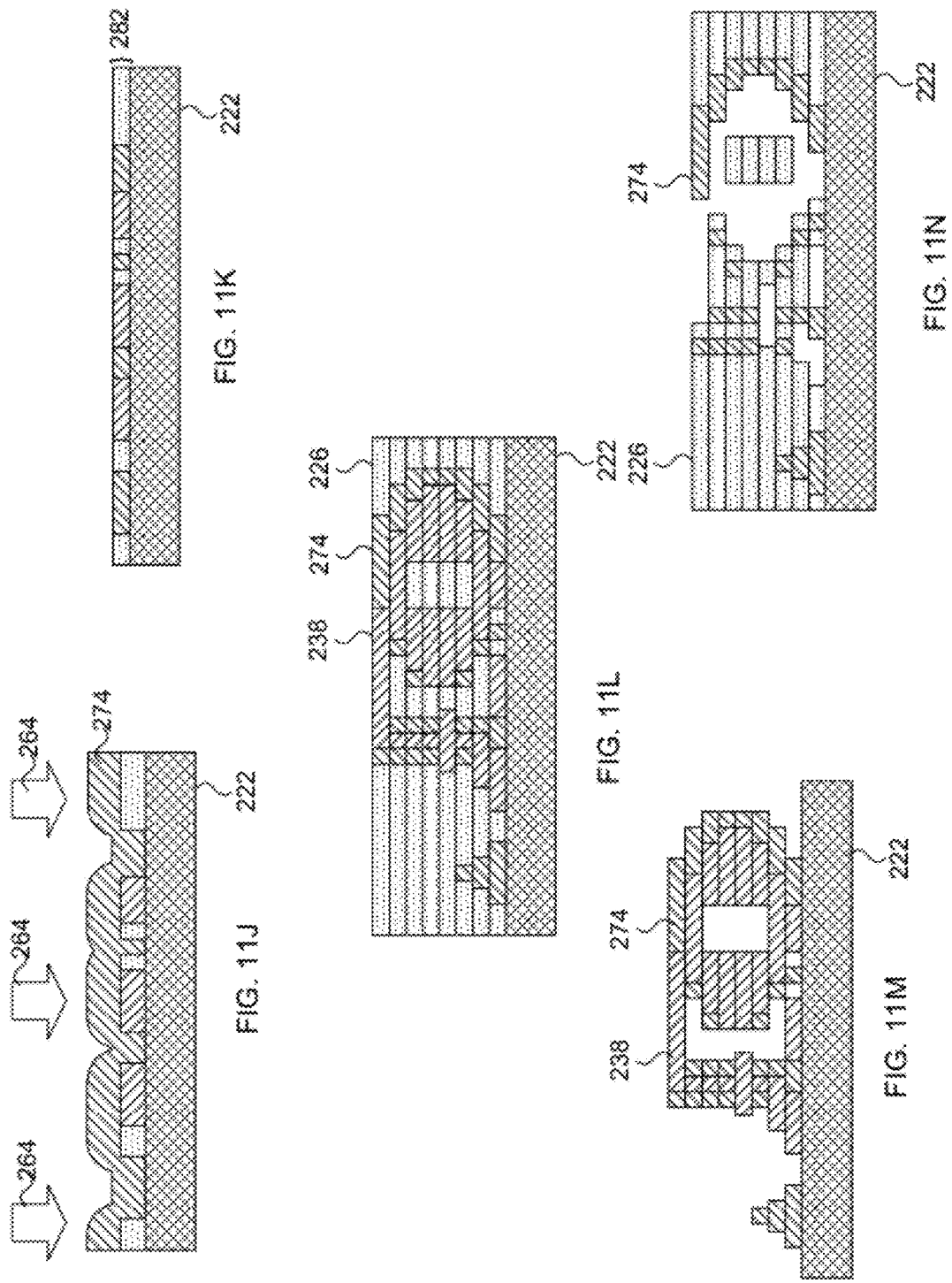

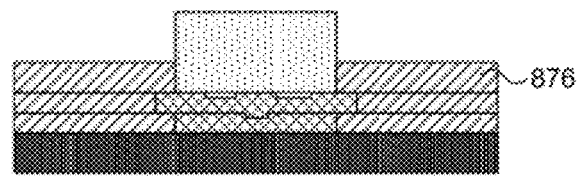
FIG. 27Y
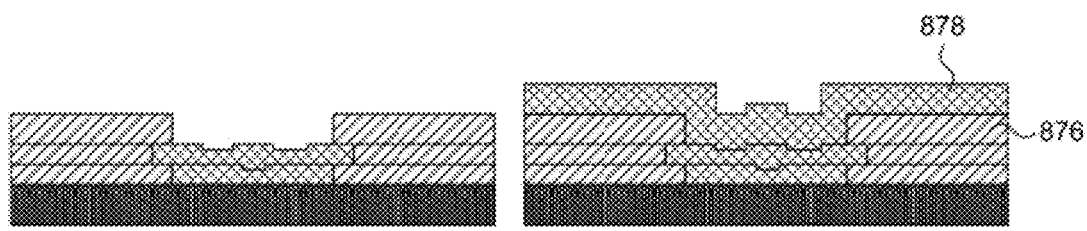
FIG. 27Z
FIG. 27AA
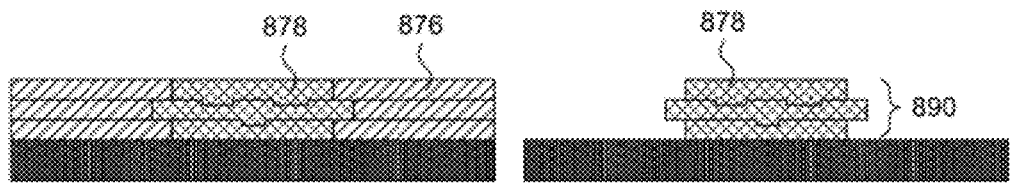
FIG. 27BB
FIG. 27CC

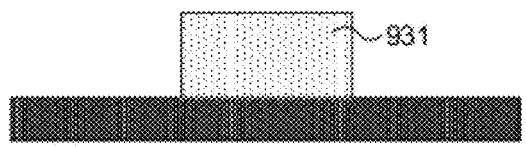
FIG. 29A
FIG. 29B
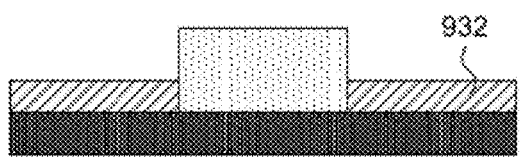
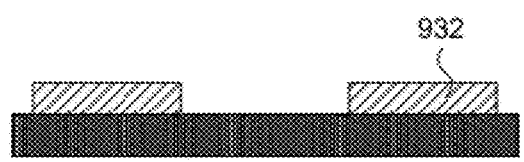
FIG. 29C
FIG. 29D
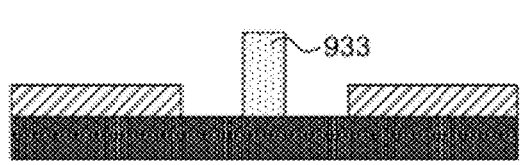
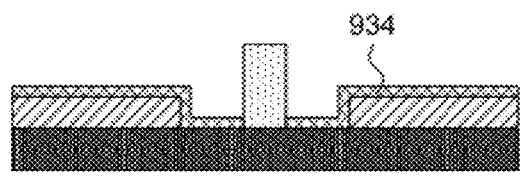
FIG. 29E
FIG. 29F

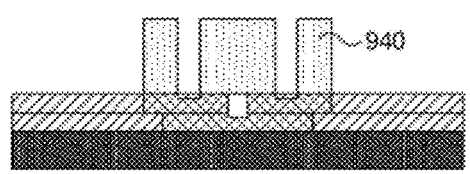 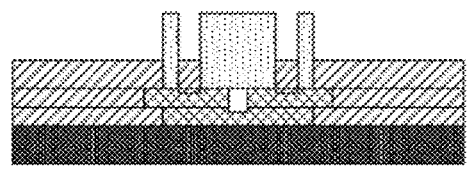
FIG. 29Y        FIG. 29Z
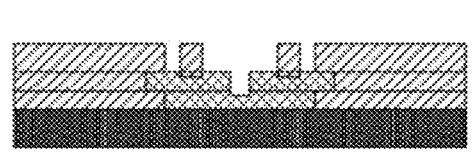 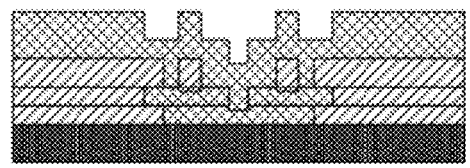
FIG. 29AA       FIG. 29BB
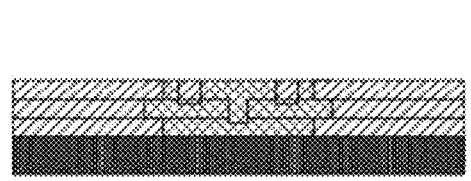 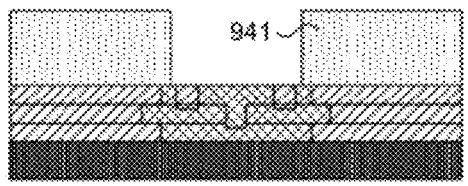
FIG. 29CC       FIG. 29DD

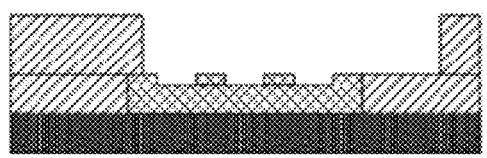
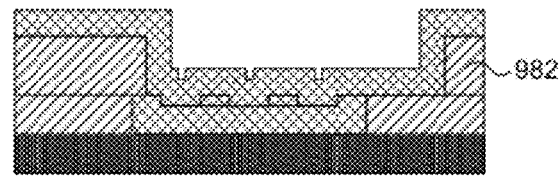
FIG. 31M            FIG. 31N
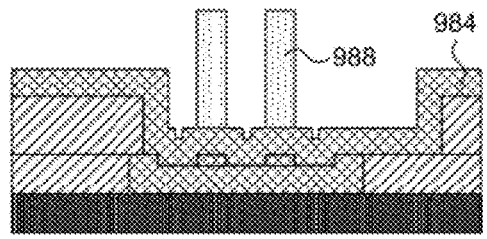
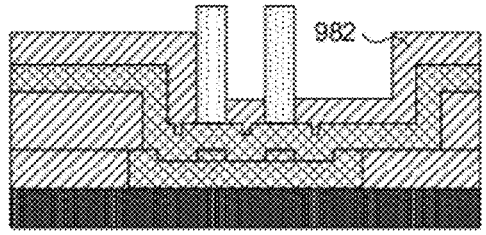
FIG. 31O            FIG. 31P
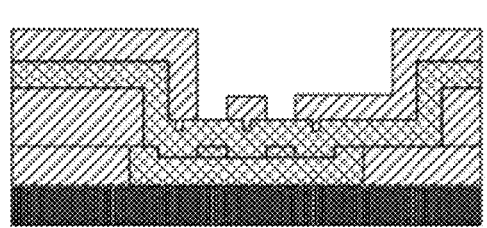
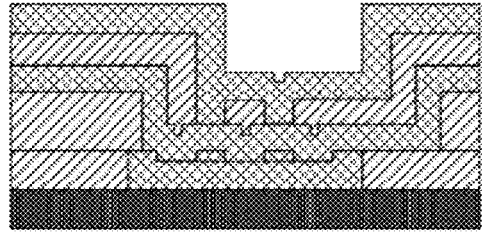
FIG. 31Q            FIG. 31R

METHODS OF AND APPARATUS FOR ELECTROCHEMICALLY FABRICATING STRUCTURES VIA INTERLACED LAYERS OR VIA SELECTIVE ETCHING AND FILLING OF VOIDS

RELATED APPLICATIONS

This application is a continuation of U.S. patent application Ser. No. 12/851,811, filed Aug. 6, 2010 now abandoned. The '811 application is a continuation of U.S. patent application Ser. No. 11/544,899, filed Oct. 6, 2006, now U.S. Pat. No. 7,828,952. The '899 application is a continuation of U.S. patent application Ser. No. 10/434,519, filed May 7, 2003, now U.S. Pat. No. 7,252,861. The '519 application claims benefit of U.S. Provisional Patent Application No. 60/379,130, filed May 7, 2002. Each of these applications is incorporated herein by reference as if set forth in full herein.

FIELD OF THE INVENTION

The embodiments of various aspects of the invention relate generally to the formation of three-dimensional structures using electrochemical fabrication methods via a layer-by-layer build up of deposited materials where the layer-by-layer build up may form completed layers prior to beginning operations that form subsequent layers or may include completion of partially formed layers in association with operations that form at least portions of subsequent layers. In particular some embodiments relate to methods and apparatus for forming such three-dimensional structures using deposition techniques, etching techniques, and planarization techniques.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. of Burbank, California under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFABTM)", Chapter 19 of The MEMS Handbook, edited by Mohamed Gad-El-Hak, CRC Press, 2002.
9. "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source (not shown) for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers. This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals which complete formation of a first two-material layer. Formation of a second layer may then begin by applying a photoresist layer over the first layer and then repeating the process used to produce the first layer. The process is then repeated until the entire structure is formed. After formation of all layers of the structure, the secondary metal is removed by etching. The photoresist used in forming each layer is formed over the plating base or previous layer by casting and the voids in the photoresist are formed by exposure of the photoresist through a patterned mask via X-rays or UV radiation.

Even though electrochemical fabrication methods as taught and practiced to date, have greatly enhanced the capabilities of microfabrication, and in particular added greatly to the number of metal layers that can be incorporated into a structure, electrochemical fabrication can still benefit from techniques that allow a greater range of materials to be used and from techniques that are not limited by some of the difficulties, problems, or short comings associated with the selective deposition of materials by CC mask plating or the selective deposition of material by plating through a photoresist mask.

SUMMARY OF THE DISCLOSURE

It is an object of various aspects of the invention to provide a new electrochemical fabrication technique that is not limited by some of the difficulties, problems, or shortcomings involved in the selective deposition of a desired material by deposition through a mask that is contacted or placed in proximity to a substrate.

It is an object of various aspects of the invention to provide a new electrochemical fabrication technique that is not limited by some of the difficulties, problems, or shortcomings involved in the selective deposition of a desired material by deposition through openings in a mask adhered to a substrate.

It is an object of various aspects of the invention to provide enhanced electrochemical fabrication techniques that can be used to supplement the formation capabilities associated with selective deposition of a desired material via plating through a contact or proximally located mask.

It is an object of various aspects of the invention to provide enhanced electrochemical fabrication techniques that can be used to supplement the formation capabilities associated with selective deposition of a desired material via plating through an adhered mask.

It is an object of various aspects of the invention to provide enhanced electrochemical formation capabilities.

It is an object of various aspects of the invention to expand the range of materials that can be used in an electrochemical fabrication process and/or to expand the properties obtainable from materials deposited in an electrochemical fabrication process.

It is an object of various aspects of the invention to provide enhanced adhesion between layers of structural material deposited in an electrochemical fabrication process.

It is an object of various aspects of the invention to provide a reduced number of process operations per layer formed in an electrochemical fabrication process.

It is an object of various aspects of the invention to provide an enhanced technique for forming a three-dimensional structures where structural formation may deviate from a strict layer-by-layer built up process (i.e. where each layer is completed in its entirety prior to beginning formation of a subsequent layer) such that a more preferable formation process may be used and/or such that enhanced properties of the structure may be obtained.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively may not address any of the objects set forth above but instead address some other object ascertained from the teachings herein. It is not intended that all of these objects be addressed by any single aspect of the invention even though that may be the case with regard to some aspects.

In a first aspect of the invention a fabrication process for forming a multi-layer three-dimensional structure includes: (a) forming and adhering a layer of material to a previously formed layer or to a substrate; and (b) repeating the forming and adhering operation of (a) a plurality of times to build up a three-dimensional structure from a plurality of adhered layers; wherein the formation of at least a plurality of layers, comprise: (1) depositing a first material onto a substrate or previously formed layer; (2) selectively etching the first material to a desired depth to create voids; (3) depositing a second material at least into the voids created by the selective etching operation (2), and wherein at least one of the depositing operations is an electrodeposition operation.

In a variation of the first aspect the depositing of the first material for a given layer comprises an electroplating of the first material via a selective deposition or a blanket deposition; and/or wherein the depositing of the second material for a given layer comprises an electroplating of the second material via a selective deposition or a blanket deposition.

In a second aspect of the invention a fabrication process for forming a multi-layer three-dimensional structure includes: (a) forming and adhering a layer of material to a previously formed layer and/or to a substrate; and (b) repeating the forming and adhering operation of (a) a plurality of times to build up a three-dimensional structure from a plurality of adhered layers; wherein the formation of at least a given layer and a subsequent layer adjacent to the given layer comprises: (1) in association with a layer level for the given layer, depositing a first material onto a substrate or previously formed layer; (2) planarizing the surface of the deposited first material to a layer level that bounds the given layer; (3) selectively etching the first material to a desired depth to create voids in the given layer; (4) depositing a second material to reach a layer level at least as great as a level that bounds the subsequent layer; (5) planarizing the surface of the deposited second material to the layer level that bounds the subsequent layer; and (6) selectively etching the second material to a desired depth to create voids in the subsequent layer.

In a variation of the second aspect at least one of the depositing of the first material or the depositing of the second material for at least one layer comprises an electrodeposition operation. In another variation the formation of a plurality of additional pairs of layers involves repeating operations (1)-(6) during the formation of each pair of layers. In another variation the second material is deposited into the voids created by the selective etching operation (3) to form a portion of the given layer as well as a portion of the subsequent layer, and in a further variation the first material is deposited into voids created by the etching operation (6) to form a portion of the subsequent layer.

In a third aspect of the invention a fabrication process for forming a multi-layer three-dimensional structure includes: (a) forming and adhering a given layer of material to a previously formed layer and/or to a substrate; and (b) repeating the forming and adhering operation of (a) a plurality of times to build up a three-dimensional structure from a plurality of adhered layers; wherein the formation of at least a plurality of layers, comprises beginning a deposition operation to form a portion of a subsequent layer prior to completing formation of a previous layer.

In a variation of the third aspect the formation of the given layer includes electrodeposition of a material and/or the formation of the previous layer includes electrodeposition of a material. In another variation of the third aspect the formation of the previous layer, includes: (c) depositing one or more structural materials; (d) depositing one or more sacrificial materials; (e) planarizing at least one deposited material such that the resulting position of the deposited material bounds a level of the previous layer; and (f) etching into at least one of the structural materials at one or more positions and to one or more depths to form at least one or more voids in the previous layer such that the one or more voids. In yet another variation the formation of the previous layer and subsequent layer includes depositing at least one of the structural materials to form part of the subsequent layer while simultaneous depositing material into the one or more voids formed in the previous layer. In another variation the formation of at least a plurality of layers includes beginning a deposition operation to form a portion of a successive layer prior to completing formation of an earlier layer that is separated from the successive layer by at least one intermediate layer.

In a fourth aspect of the invention a fabrication process for forming a multi-layer three-dimensional structure, includes: (a) forming and adhering a material for a given layer to a previously formed layer and/or to a substrate; (b) repeating the forming and adhering operation of (a) a plurality of times to build up a three-dimensional structure from a plurality of adhered layers; wherein for a plurality of layers, a deposition of material in association with a given layer results in deposition of material into voids in a previous layer that was only partially completed.

In a variation of the fourth aspect the formation of the given layer includes electrodeposition of a material. In another variation the previous layer did not receive deposition of appropriate material at each location until formation of the given layer is initiated and in a further variation a material different from an appropriate material is made to temporarily fill in a void location in the previous layer, the temporary fill material is thereafter removed to create a void, and the appropriate material is made to fill the void during a process associated with the formation of the given layer. In another variation during deposition associated with the previous layer, the previous layer did receive deposition of appropriate material at each location but wherein an etching operation was performed that removed a portion of the material from the previous layer after it was nominally completed so as to allow material deposited in association with the given layer to fill at least one void created by the removal of material such that the formation of the previous layer was not complete until beginning formation of the given layer.

In a fifth aspect of the invention a fabrication process for forming a multi-layer three-dimensional structure, includes: (a) forming and adhering a layer of material to a previously formed layer and/or to a substrate; and (b) repeating the forming and adhering operation of (a) a plurality of times to build up a three-dimensional structure from a plurality of adhered layers; wherein for a plurality of layers, interlacing of material deposited in association with adjacent layers occurs whereby an inter-connection of material between at least some pairs of layers is enhanced.

In a variation of the fifth aspect the formation of a plurality of layers comprises electrodeposition of a material. In another variation, the inter-connection of material occurs from a given layer through an intermediate layer to a previous layer.

In another variation the inter-connection of material occurs in a staggered manner through a plurality of layers such that interconnection of layers occurs via a plurality of interlacing elements that each connect at least three layers and such that an inter-connected network extending a greater distance than the height of any single interlacing element occurs. In yet another variation some interlacing elements have different heights and in a further variation the height of at least some interlacing elements is dictated, at least in part, by the location of the interlacing elements relative to outward facing-surfaces of the structure, or of outward facing surfaces associated with a single structural material or a particular group of structural materials, or the interference between the interlacing elements and other interlacing elements.

In variations of various aspects of the invention at least some voids are formed with undercuts. In other variations of various aspects selective patterning for forming voids or for selectively depositing a selected material utilizes one or more of a contact mask, a proximity mask, and/or an adhered mask. In still other variations forming a void or voids that penetrate a boundary level separating two layers are done intentionally so that inter-connection of the two layers is enhanced when the void or voids are deposited into from the later layer or higher into the former layer.

Other aspects of the invention will be understood by those of skill in the art upon reviewing the teachings herein. Other aspects of the invention may involve apparatus that can be used in implementing one or more of the above method aspects of the invention. These other aspects of the invention may involve various combinations of the aspects presented above, addition of various features of one or more embodiments, as well as other configurations, structures, functional relationships, and processes that have not been specifically set forth above.

BRIEF DESCRIPTION OF THE DRAWINGS

FIGS. 4A-4F schematically depict the formation of a first two-material layer of a structure using adhered mask plating where the blanket deposition of a second material overlays both the openings between deposition locations of a first material and the first material itself FIG. 4G depicts the completion of formation of the first two-material layer resulting from planarizing the deposited materials to a desired level.

FIGS. 4H and 4I respectively depict the state of the process after formation of the multiple layers of the structure and after release of the structure from the sacrificial material.

FIG. 7 depicts a process flowchart for a non-interlacing, two material embodiment of some aspects of the invention.

FIG. 8 depicts a process flowchart for a simplified, non-interlacing, two-material embodiment of some aspects of the invention.

FIGS. 9A-9J schematically depict side views of various stages in the process of forming multiple layers of a structure according to the process of the flowchart of FIG. 7.

FIG. 21A depicts a perspective view of the structure of FIG. 20A while

DETAILED DESCRIPTION

Figure 1A:
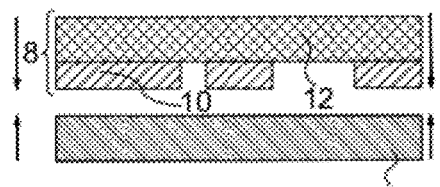
FIGS. 1A-1C schematically depict side views of various stages of a CC mask plating process, while FIGS. 1D-1G schematically depict a side views of various stages of a CC mask plating process using a different type of CC mask.
Figure 1B:
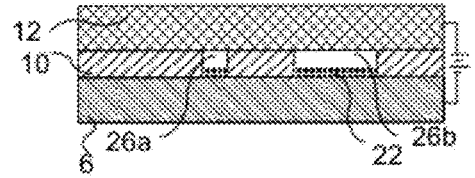
Figure 1C:
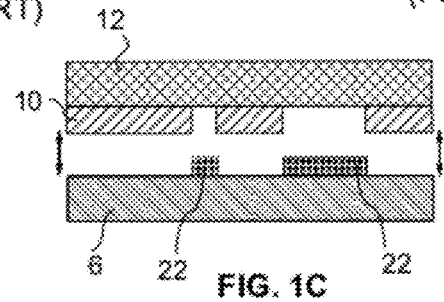
Figure 1D:
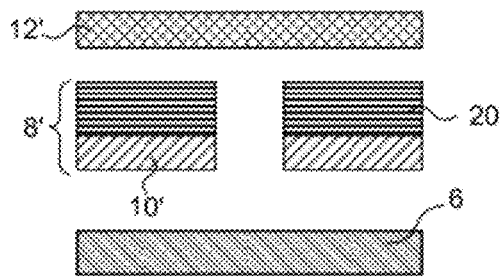
Figure 1E:
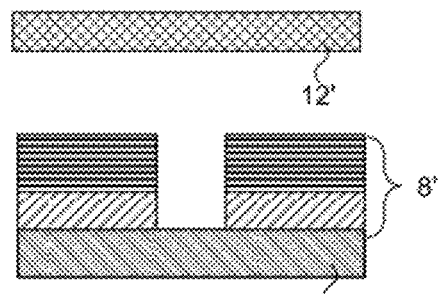
Figure 1F:
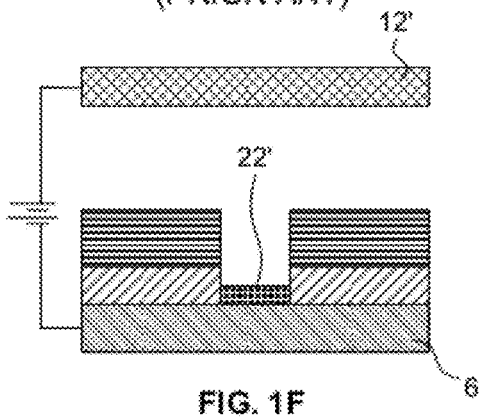
Figure 1G:
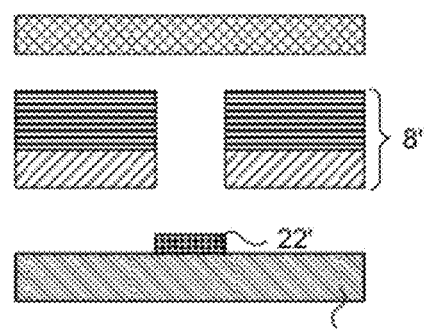
Figure 2A:
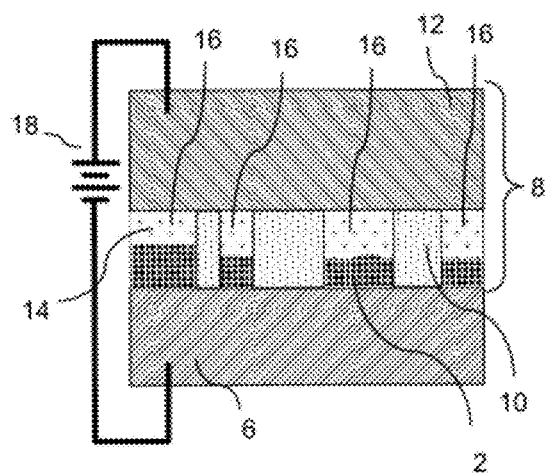
FIGS. 2A-2F schematically depict side views of various stages of an electrochemical fabrication process as applied to the formation of a particular structure where a sacrificial material is selectively deposited while a structural material is blanket deposited.
Figure 2B:
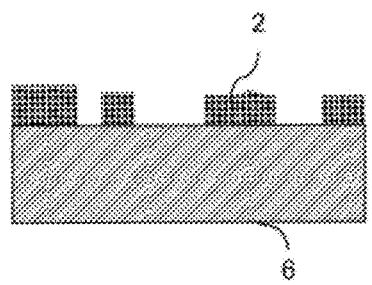
Figure 2C:
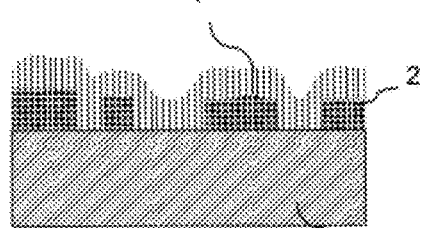
Figure 2D:
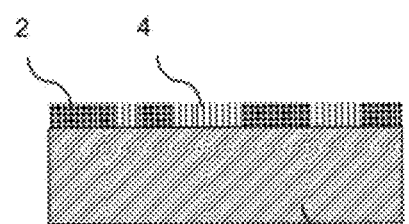
Figure 2E:
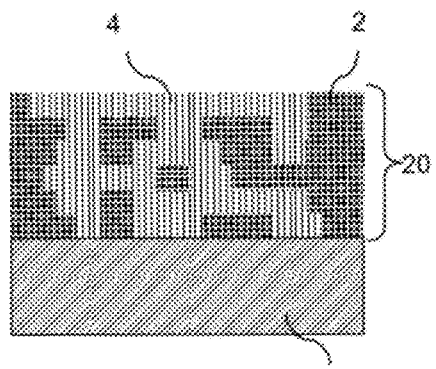
Figure 2F:
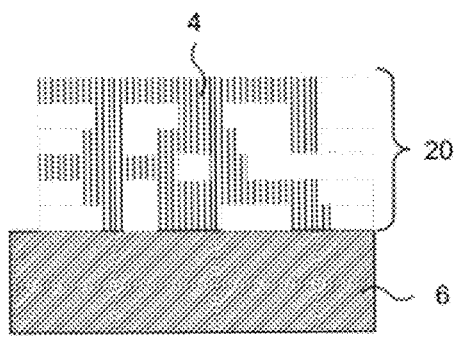
Figure 3A:
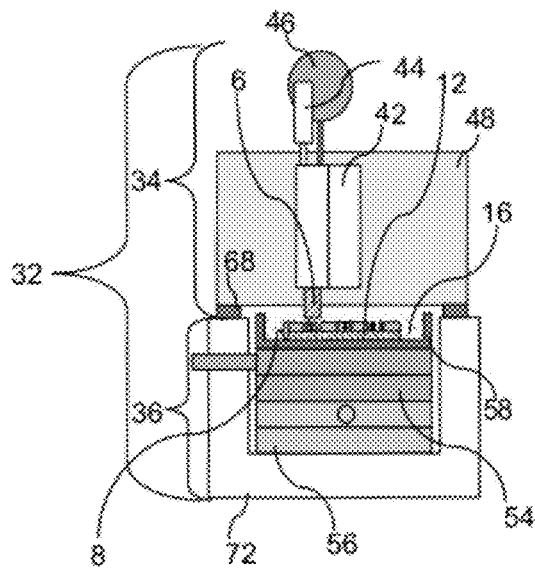
FIGS. 3A-3C schematically depict side views of various example subassemblies that may be used in manually implementing the electrochemical fabrication method depicted in FIGS. 2A-2F.
Figure 3B:
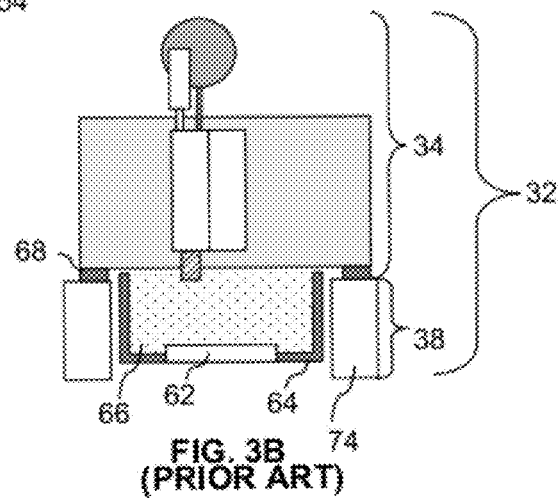
Figure 3C:
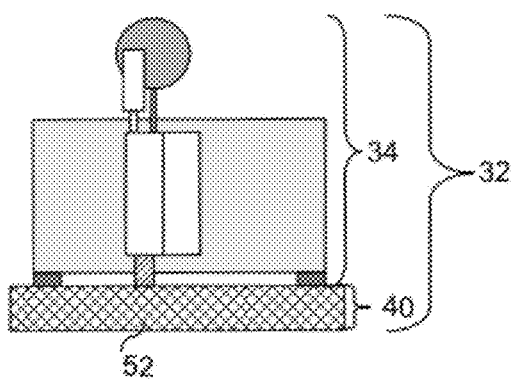

FIGS. 1A-1G, 2A-2F, and 3A-3C illustrate various features of one form of electrochemical fabrication. Other electrochemical fabrication techniques are set forth in the '630 patent referenced above, in the various previously incorporated publications, in various other patents and patent applications incorporated herein by reference. Still others may be derived from combinations of various approaches described in these publications, patents, and applications, or are otherwise known or ascertainable by those of skill in the art from the teachings set forth herein. All of these techniques may be combined with those of the various embodiments of various aspects of the invention to yield enhanced embodiments. Still other embodiments may be derived from combinations of the various embodiments explicitly set forth herein.

FIGS. 4A-4I illustrate various stages in the formation of a single two-material layer of a multi-layer fabrication process where a second metal is deposited on a first metal as well as in openings in the first metal so that the first and second metal form part of the two-material layer. In FIG. 4A a side view of a substrate 82 is shown onto which patternable photoresist 84 is cast as shown in FIG. 4B. In FIG. 4C a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D a metal 94 (e.g. nickel) is shown as having been electroplated into the openings 92(a)-92(c). In FIG. 4E the photoresist has been removed (i.e. chemically stripped) from the substrate to expose regions of the substrate 82 which are not covered with the first metal 94. In FIG. 4F a second metal 96 (e.g. silver) is shown as having been blanket electroplated over the entire exposed portions of the substrate 82 (which is conductive) and over the first metal 94 (which is also conductive). FIG. 4G depicts the completed first multi-material layer of the structure which has resulted from the planarization of the first and second metals down to a height that exposes the first metal and sets a thickness for the first layer. In FIG. 4H the result of repeating the process steps shown in FIGS. 4B-4G several times to form a multi-layer structure are shown where each layer consists of two materials. For most applications, one of these materials is removed as shown in FIG. 4I to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations (i.e. operations that use masks that at least partially selectively shield a substrate by their proximity to the substrate even if contact is not made) may be used, non-conformable masks and masking operations (i.e. masks and operations based on masks whose contact surfaces are not significantly conformable) may be used, and adhered masks and masking operations (masks and operations that use masks that are adhered to a substrate onto which selective deposition or etching is to occur as opposed to only being contacted to it) may be used.

Unless specified otherwise in the various embodiments set forth herein, the following terms shall have the following definitions.

The "build axis" or "build orientation" is the axis or orientation that is perpendicular to the planes of the layers that are used in building up structures. The build axis points in the direction of layer build up.

An "up-facing feature" is an element dictated by the cross-sectional data for a given layer "n" and a next layer "n+1" that is to be formed from a given material that exists on the layer "n" but does not exist on the immediately succeeding layer "n+1". For convenience the term "up-facing feature" will apply to such features regardless of whether the layers are stacked one above the other, one below the other, or along any other orientation of the build axis.

A "down-facing feature" is an element dictated by the cross-sectional data for a given layer "n" and a preceding layer "n−1" that is to be formed from a given material that exists on layer "n" but does not exist on the immediately preceding layer "n−1". As with up-facing features, the term "down-facing feature" shall apply to such features regardless of whether the layers are stacked one above the other, one below the other, or along any other oriented build axis.

A "continuing region" is the portion of a given layer "n" that is dictated by the cross-sectional data for a given layer "n", a next layer "n+1" and a preceding layer "n−1" that is neither up-facing nor down-facing for that layer "n".

Various embodiments of various aspects of the invention are directed to formation of three-dimensional structures from materials some of which are to be electrodeposited. Some of these structures may be formed form a single layer of one or more deposited materials while others are formed from a plurality of layers of deposited materials (e.g. 2 or more layers, more preferably five or more layers, and most preferably ten or more layers). In some embodiments structures having features positioned with micron level precision and minimum features size on the order of tens of microns are to be formed. In other embodiments structures with less precise feature placement and/or larger minimum features may be formed. In still other embodiments, higher precision and smaller minimum feature sizes may be desirable.

Various embodiments disclosed herein or portions of those embodiments may supplement the above incorporated and known techniques by adding to them (for the formation of any given structure) processes that involve the selective etching of deposited material (e.g. via contact masks, e.g. of the conformable contact type or the non-conformable contact type, or via adhered masks, e.g. of the photoresist type, ablatable type, transfer plated type, ink jet deposited type, or the like) and the filling of created voids with additional materials.

Various other embodiments of various aspects of the invention, may depart from the selective deposition of materials entirely, and use blanket electrodeposition operations to deposit materials and selective etching operations (e.g. via conformable contact masks, non-conformable contact masks, or via adhered masks) to pattern those materials by creating voids that can be filled in using blanket deposition operations.

Various other embodiments may cause deposition of material to deviate from a strict layer-by-layer build up process (e.g. where an nth layer is completely formed prior to beginning deposition operations for forming a portion of an (n+1)th layer) and instead prior to completing the formation of an nth layer, a deposition operation for depositing material to form part of a subsequent layer (e.g. (n+1)th layer) is initiated.

In some of these embodiments, etching operations may be used to define at least some outward facing portions of structures (i.e. portions of the structure or component that are not bounded by other structural material or at least other structural material of a particular type) while in other embodiments etching operations may only be used to define internal portions of structural material (i.e. portions which are not out-facing).

In some embodiments selective etching operations of a deposited material are performed (e.g. by use of a temporary mask which has openings which dictate explicitly where etching will be perform and where etching will not be performed). In some embodiments, an approach may be taken where temporarily applied or positioned masks may shield some regions from attack of a selective etchant but the exact masking pattern does not solely or explicitly determine the exact etching pattern(s), as they are determined, at least in part, by a second material that is not attacked by the etchant which is located adjacent to the material that is to be etched.

Figure 5:
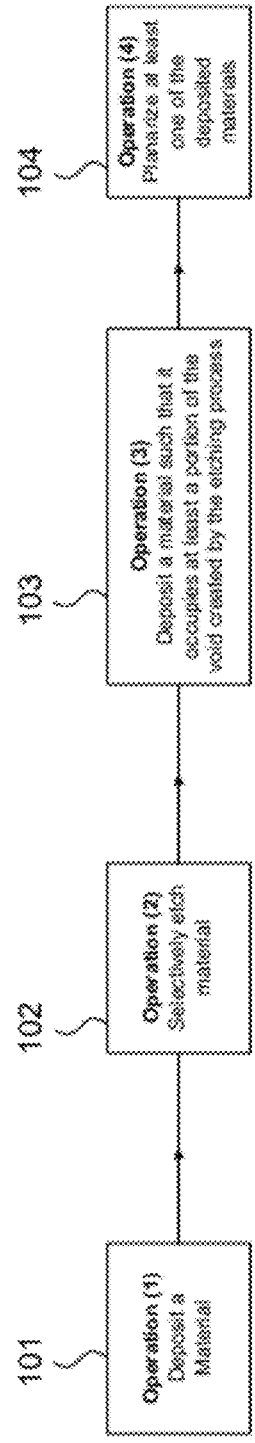
FIG. 5 depicts a block diagram of four basic elements of a simplified embodiment of some aspects of the invention.

FIG. 5 depicts a block diagram of four basic operations of a simplified embodiment of some aspects of the invention. Block 101 (Operation 1) calls for the deposition of a material. Block 102 (Operation 2) calls for the selective etching of material, e.g. via a conformable contact (CC) mask, a non-conformable contact mask, or an adhered mask). Block 103 (Operation 3) calls for deposition of a material such that it occupies at least a portion of the void created by the etching process of Operation 2. Block 104 (Operation 4) calls for the planarization of at least one of the deposited materials.

Figure 6:
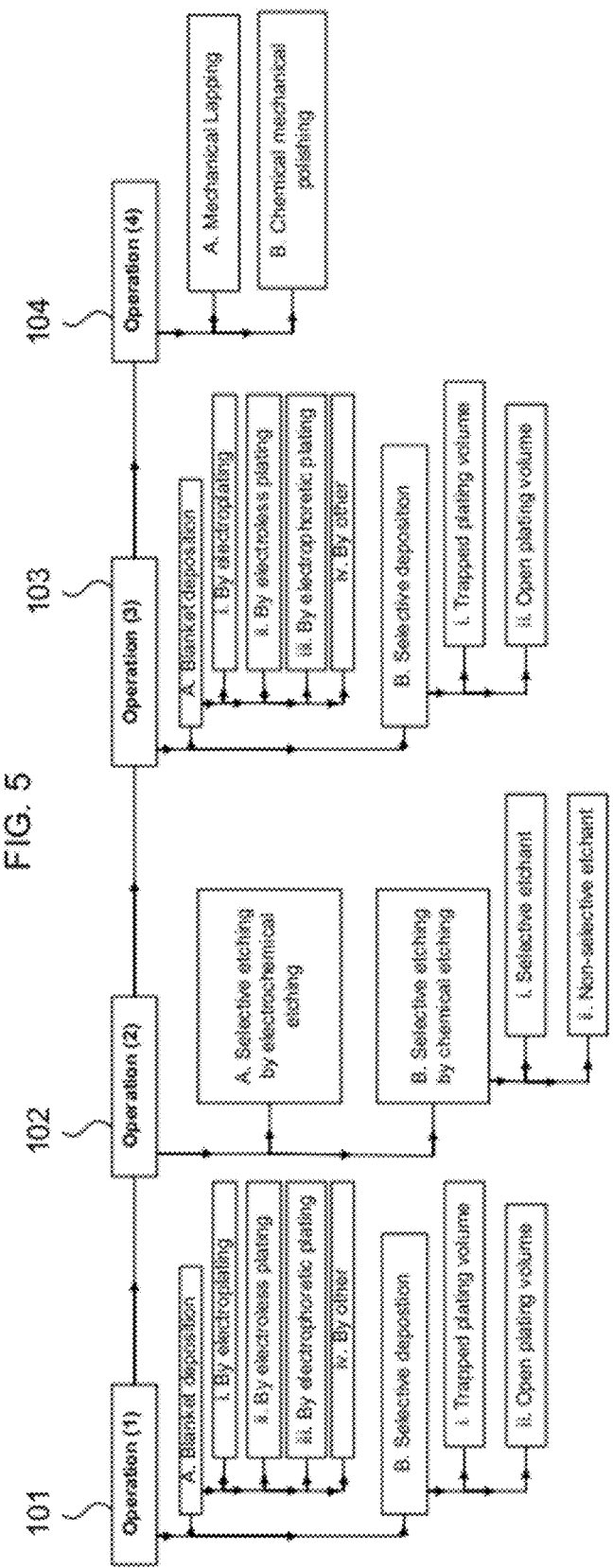
FIG. 6 depicts a block diagram detailing some of the possible implementations of the operations set forth in FIG. 5.

FIG. 6 provides more detail on some of the possible implementations of Operations 1-4. Two examples of how Operation 1 may be implemented are given: (1) blanket deposition, "A." and (2) selective deposition, e.g. via a contact C mask or an adhered mask), "B.". Three specific examples of how the blanket deposition, "A.", may be implemented are indicated: (1) by electroplating, "i", (2) by electroless plating "ii", or (3) by electrophoretic plating, "iii". Other examples include the use of a spray metal deposition technique such as one of the variety of thermal spray metal deposition techniques examples of which have been set forth in U.S. Provisional Patent Application No. 60/435,324. Further examples may include various physical or chemical deposition processes or the like. For example, a powder or metal paste may be applied to the surface. A powder may be spread and then sintered; a paste may be spread and then cured (e.g. a conductive epoxy). A binder material may remain or be removed either prior to or after consolidation.

Two examples are given on how the selective deposition, "B.", may be implemented: (1) via a mask (e.g. CC mask) using a trapped volume of plating solution, "i.", and (2) via a mask using an open volume of plating solution, "ii". The trapped volume of plaiting solution may be formed by use of a contact mask that includes a solid support that will function as an anode and which in combination with the substrate will define a closed volume of plating solution. The open volume of plating solution may be formed using a contact mask with the patterned material adhered to a porous or at least perforated support from which is spaced an anode such that the volume of plating solution within the opening(s) of the contact mask will not be a closed volume but can communicate with plating solution outside the limited space defined by the patterned mask, the mask support, and the substrate. Alternatively, the creation of an open volume may be implemented by formation of a patterned mask that is adhered to and supported by the substrate itself wherein the volume of plating solution within the voids or openings in the patterned mask material extend directly into a larger volume of plating solution. Such as adhered mask may be, for example, a patterned photoresist, a patterned ablatable material, an electrostatically deposited patterned material, an ink jet deposited patterned material, a pattern transferred from a patterned material, or a pre-patterned material which is temporally supported by a non-pattern support structure and is transferred to the substrate. The "B.i." and "B.ii." plating preferably occurs via electroplating, electroless plating, or electrophoretic type plating. Specific implementation details and other alternative implementations for Operation 1 will be apparent to those skilled in the art upon review of the teachings herein.

Two examples are given on how Operation 2 may be implemented: (1) selective etching by electrochemical etching, "A.", and (2) selective etching by use of a chemical etchant, "B.". The selectivity of either of these two alternatives may be obtained using a patterned mask that limits the region on which etching operates. Such masks may be of the trapped volume or open volume type mentioned in conjunction with Operation (1). The electrochemical etching may be performed by electroplating from the substrate (i.e. the substrate functions as the anode) to a cathode. The cathode may be the support for a patterned contact mask or it may be a separate structure, for example, when the patterned mask material is adhered to the substrate or when it is supported by a porous, perforated, or other apertured structure. Two examples for implementing the chemical etching process are indicated: (1) via use of a selective etchant, "i", and (2) via use of a non-selective etchant. Care may need to be taken when implementing the etching processes. If more than one material is simultaneously exposed to the etchant or etching action, any differential in etching rate must be taken into consideration. If a difference in etching rate can not be tolerated, selective etching operations may need to be broken down into multiple steps such that during any given step only one material is being etched. Specific implementation details and other alternative implementations for Operation 2 will be apparent to those skilled in the art upon review of the teachings herein.

Two examples of how Operation 3 may be implemented are indicated. The examples given are identical to those given for Operation 1. Various examples for each of the two implementations are also given. These various other examples are also identical to those for Operation 1. As noted above with regard to Operation 1, specific implementation details and other alternative implementations for Operation 3 will be apparent to those skilled in the art upon review of the teachings herein.

Two examples of implementing Operation 4 are given: (1) mechanical lapping, "A.", and (2) chemical mechanical polishing, "B.". Specific implementation details and other alternative implementations for Operation 4 will be apparent to those skilled in the art upon review of the teachings herein.

FIG. 7 depicts a process flowchart for a preferred two material embodiment of some aspects of the invention. Various elements of FIG. 7 are provided with codes that refer back to the operations and alternatives set forth in FIG. 6. In this embodiment, the process starts with a blanket electroplating operation 202 of a first material onto a substrate. This blanket deposition applies a coating of desired thickness (e.g. somewhat more than one layer thickness), then moves onto a planarization operation 204 of the first material via mechanical lapping to achieve a net deposition that is both uniform and of a known thickness or height (e.g. at or slightly more than one layer thickness).

The process then proceeds to a selective etching operation 206 of the first material by electrochemical etching (e.g. reversed electroplating using a contact mask or adhered masks). The electrochemical etching is controlled to give a desired depth of etching. The depth of etching may be targeted to be equal to the known net height of the first deposition or may be set to slightly more than that height so as to ensure that the etching depth reaches material associated with any material deposited in association with formation of a previously formed layer. Upon completion of this etching operation, the contact mask or adhered mask is removed. The process next moves on to a blanket deposition operation 208 that deposits a second material (by electroplating) onto the substrate including into the void formed by the etching operation 206 and onto the previously deposited material. In some alternative embodiments, the mask (e.g. contact mask or adhered mask of the open volume type) used to perform the etching operation 206 may remain in place during the deposition operation such that a more selective deposition occurs.

After depositing material to a desired depth (e.g. at or somewhat more than a depth of one layer thickness) the process proceeds to a planarization operation 210 that brings the two material layer to a desired height (e.g. the height of one layer thickness). By the operations 202 to 210, the formation of a layer of the structure is completed.

Next the process proceeds to inquiry 212 where the question is posed as to whether there is another layer to form. If the answer is "no" the process proceeds to block 218 where the sacrificial material is removed (e.g. via chemical etching) and the desired three-dimensional structure is revealed. Of course in alternative embodiments other processing steps may be performed in addition to the removal operation. After the removal operation 218, the process ends at block 220. Of course in still other embodiments, the removal of the sacrificial material may not be required.

If the answer to the inquiry 212 is "yes" the process proceeds to inquiry 214 where the question is posed as to whether the process will follow the same basic operations 202-210. To conclude that that the same basic operations will be followed, no changes more radical than changing of process parameters or the changing of the selective etching pattern (e.g. using mask with a different pattern) may be tolerated. If the answer to the inquiry is "yes" the process loops back to operation 202. If the answer is "no", the process proceeds to operation 216 where an undefined set of operations occurs that results in the formation of the next layer. The undefined processes in operation 216 may include operations similar to those in 202-210 as well as various other operations and orders of operation (e.g. those found in other embodiments specifically set forth herein, those found in various EFAB embodiments set forth in one or more of the patents or publications incorporated herein by reference, or combinations of operations which are readily understood by those of skill in the art in view of the teaching set forth herein). After completion of the operation 216 the process loops back to inquiry 212. Of course the process of FIG. 7 may include various other operations, such as cleaning and surface preparation operations (e.g. activations) prior to or after each of the operations 202-210.

In some embodiments, various additional or supplemental operations will be added to the process, such as intermediate cleaning operations, activation operations, inspection or measurement operations, and the like.

FIG. 8 provides a simplified process for forming three-dimensional structures as compared to that provided for by the process of FIG. 7. In this simplified process all layers are formed using the same set of operations with only the selective patterning of each layer changing as appropriate from layer to layer. Furthermore, the first planarization operation 204 that was called for in FIG. 7 is dropped as unnecessary. Like elements of FIGS. 7 and 8 are marked with like reference numerals.

FIGS. 9A-9J illustrate the application of the process of FIG. 7 to the formation of a particular structure. FIG. 9A indicates that a substrate 222 is supplied on to which layers of material will be deposited.

FIG. 9B illustrates occurrence of a blanket deposition of a first material 226 onto the substrate according to operation 202. The deposition height is somewhat greater than the layer thickness and preferably somewhat greater than a desired interim planarized thickness for the layer.

FIG. 9C shows the deposition of FIG. 9B after it has been planed down (Operation 204) to a desired interim thickness equal to the layer thickness plus some desired incremental amount (LT+δ). The use of a layer that is somewhat thicker than the layer thickness (LT) helps ensure appropriate contact between like material or desired materials on successive layers.

FIG. 9D shows that a contact mask 228 (e.g. a CC mask) has been placed against the previously deposited layer (i.e. a modified substrate which is the original substrate plus the deposited material) and that etching operation 206 has been initiated to selective remove material and create voids 234' in the previously deposited material 226.

FIG. 9E depicts the result of the completed etching operation 206. The voids 234' have grown into voids 234 having a depth equal to (LT+δ). Of course, in other embodiments the depth of etching may be different from that used in this example. In other embodiments the depth of etching may be somewhat greater than the believed deposit thickness to help ensure appropriate contact between like or desired materials on successive layers.

FIG. 9F depicts the blanket deposition of a second material 238 on to the first material 226 and into the voids 234 according to operation 208. In this embodiment the depth of deposition is at least as great as the layer thickness (LT).

FIG. 9G depicts the resulting and finalized first layer 251 composed of regions of the first material 226 and regions of the second material 238 after a planarization operation 210 that sets the height of the layer to LT.

FIG. 9H depicts a side view of the set of layers for a completed structure. Each layer is formed by repetition of the operations 202-210. Depending on which of the two materials is the structural material and which is the sacrificial material, after a material selective etching operation 218, the multi-layer three-dimensional structure is revealed as that shown in FIG. 9I where the structural material is the second material 238 and the sacrificial material was the first material 226 or as that shown in FIG. 9J where the structural material is the first material 226 and the sacrificial material was the second material 238.

In some alternative embodiments, if material 226 is the structural material, the formation of the last layer may have ended with the etching of material 226 since the deposition of material 238 on the final layer may not be necessary. In some alternative embodiments the order of deposition of the two materials may be selected (e.g. reversed between selected layers) so that selected geometric features of structural material may be obtained (e.g. if the etching operation produces a lateral expansion of the etched regions as vertical etching occurs, an outward taper of the structural material may be obtainable by etching into the sacrificial material or alternatively, an inward taper of the structural material may be obtainable by etching into the structural material).

Figure 10:
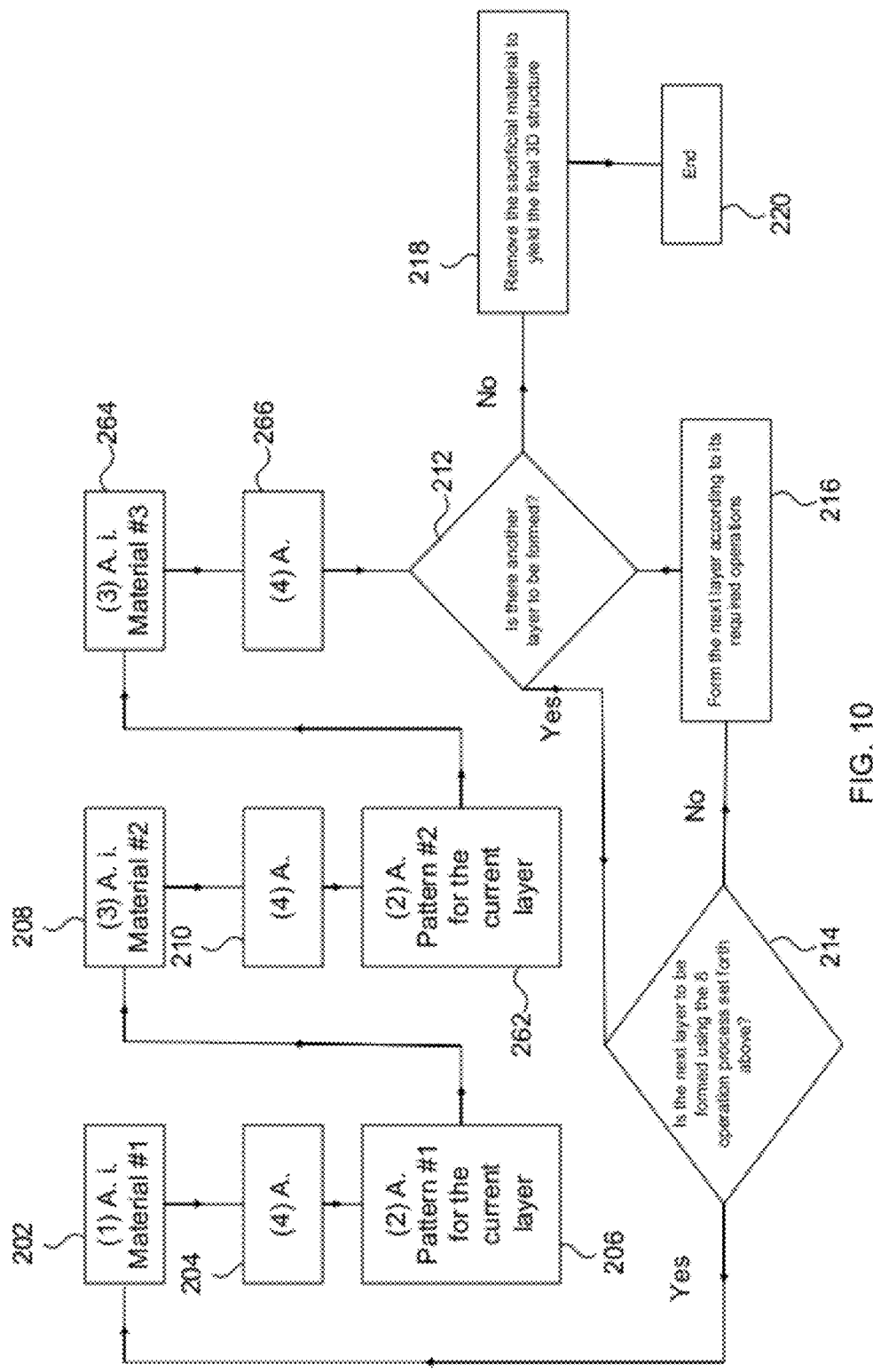
FIG. 10 depicts a process flowchart for a preferred three material embodiment where all selective patterning is performed using selective etching.

FIG. 10 depicts a process flowchart for a preferred three material embodiment. Many elements of FIG. 10 are similar to the elements of FIG. 7 and like operations are designated with like numerals. The process starts off similar to that of FIG. 7 with operations 202-210. The only difference potentially being in the two levels of planarization. Operation 204 may set the planarization level at LT+δ or at LT+2*δ or the like. Since there will be three planarization operations during the formation of the layer, it may be desirable to have each one trim down the layer slightly or it may be acceptable to have all planarization operations set the level at LT+δ with the exception of the last one which will set the level at LT. Operation 210 may set the planarization at a desired level (e.g. LT+δ, LT, or something equal to or less than the planarization level set by 204 and something greater than or equal to the planarization level that will be set by operation 266.

Operation 210 is followed by a selective etching 262 which is performed in preparation for a blanket deposition 264 of a third material that will fill the voids created by etching operation 262. In some alternative embodiments, the blanket deposition of operation 264 may be replaced by a selective deposition operation that potentially uses the same mask as that use for the etching operation 262.

Operation 264 blanket deposits a third material into the voids created by etching operation 262 as well as to other locations.

Operation 266 calls for the planarization of the deposited material and since it is the last planarization performed in completing the present multi-material layer, it sets that planarization level at LT.

Operation 266 completed the formation of a layer. Additional operations are used to determine when formation of the multi-layer structure has been completed and if appropriate to determine how additional layers should be added. These additional operations are analogous in those set forth in FIG. 7 and are labeled with like reference numerals 212-220. Operation 214 has been labeled Operation 214' as layer formation process of FIG. 10 involves eight operations instead of five as was the case with the embodiment of FIG. 7.

FIGS. 11A-11N illustrate the application of the process of FIG. 10 to the formation of a particular structure. FIG. 11A indicates that a substrate 222 is supplied on to which layers of material will be deposited.

FIG. 11B illustrates a blanket deposition of a first material 226 onto the substrate (which may contain previously formed layers that include one or more materials—not shown) according to operation 202. The deposition height is somewhat greater than the layer thickness (LT) and preferably somewhat greater than a desired interim planarized thickness for the layer.

FIG. 11C shows the deposition of FIG. 11B after it has been planed down (operation 204) to a desired interim thickness equal to the layer thickness plus some desired incremental amount (LT+δ).

FIG. 11D shows that a contact mask 228 has been placed against the previously deposited layer (i.e. a modified substrate which is the original substrate plus the deposited material) and that an etching operation 206 has been initiated to selectively remove material and create voids 234' in the previously deposited material 226. In some alternative embodiments an adhered mask may be used as opposed to the contact mask.

FIG. 11E depicts the result of the completed etching operation 206. The voids 234' have grown into voids 234 having a depth equal to (LT+δ). In other embodiments the depth of etching may be different from that used in this example (e.g. somewhat greater than LT+δ to help ensure contact with material deposited in association the previous layer).

Figure 11F:
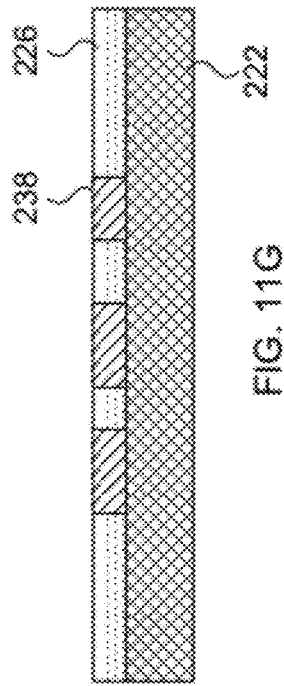
FIGS. 11A-11N schematically depict side views illustrating various stages of the process of the flowchart of FIG. 10 as applied to the formation of a particular structure.

FIG. 11F depicts the blanket deposition of a second material 238 on to the first material 226 and into the voids 234 according to operation 208. In this embodiment the depth of deposition is at least as great as LT but more preferably at least as great as LT+δ. In some alternative embodiments, the blanket deposition of operation 208 may be replaced by a selective deposition operation that may use the mask that patterned the selective etching operation particularly when that mask is of the open volume type.

Figure 11G:
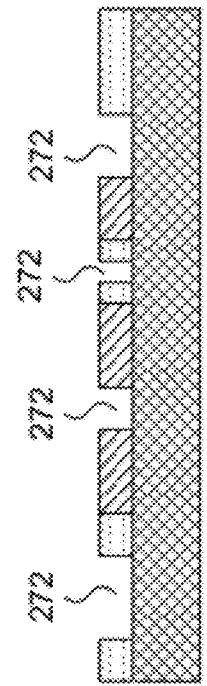

FIG. 11G depicts interim layer containing the first and second materials and having a thickness of LT+δ. This layer level and height is set by planarization operation 210.

Figure 11H:
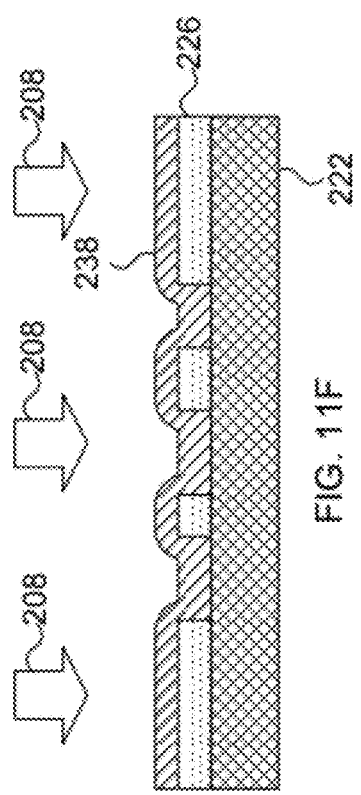
Figure 11I:
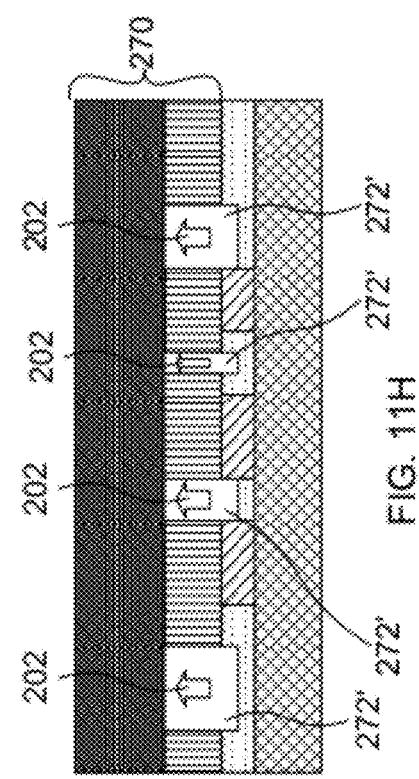

FIG. 11H shows that a contact mask 270 has been placed against the previously deposited layer (i.e. a modified substrate which is the original substrate plus the deposited material) and that an etching operation 262 has been initiated to selectively remove material and create voids 272' in the previously deposited material 226. FIG. 11I depicts the result of the completed etching operation 262. The voids 272' have grown into voids 272 having a depth equal to (LT+δ). In other embodiments the depth of etching may be different from that used in this example (e.g. somewhat greater than LT+δ to help ensure contact with material deposited in association the previous layer). In other alternative embodiments, the pattern of deposition of material 238 may have been modified so that the etching of operation 262 may have cut into material 238 instead of 226. In still other embodiments, the patterning of deposition of material 238 may have been modified so that the etching of operation 262 may have cut into a combination of materials 238 and 226. FIG. 11J depicts the blanket deposition 264 of a third material 274 on to the first material 226 and the second material 238 and into the voids 272. In this embodiment the depth of deposition is at least as great as the layer thickness. In some alternative embodiments the blanket deposition may be replaced by a selective deposition or a partially selective deposition which could result in less wasted deposition of the third material. Such selective or partially selective deposition may be implemented in a variety of different ways including for example by using a mask.

FIG. 11K depicts the resulting and finalized first layer 282 (i.e. a three material layer) composed of regions of the first material 226 and regions of the second material 238 and regions of a third material 274 after a planarization operation 266 that sets the final layer level and the height of the layer to LT.

FIG. 11L depicts a side view of the set of layers for a completed structure. Each layer is formed by repetition of the operations 202-210 and 262-266. Depending on which of material or materials are the structural material or materials (i.e. 226, 238, 274, 226 and 274 or 226 and 238, or 238 and 274) and which material or materials are the sacrificial material or materials (238 and 274, 226 and 274, 226 and 238, or 238, 274, or 226), after an etching operation 218 or operations (not shown), the multi-layer three-dimensional structure is revealed. An example of such a three-dimensional structure is shown in is shown in FIG. 11M where the structural materials are the second material 238 and the third material 274 and the sacrificial material was the first material 226. Another example is shown in FIG. 11N where the structural materials are the first material 226 and the third material 228 and the sacrificial material was the second material 238. In other some embodiments three-dimensional structures may be formed from single materials or other combinations of materials. In some other embodiments, operation 218 may be eliminated in its entirety if the structure is appropriately defined by the entirety of materials deposited during layer formation operations.

Figure 12:
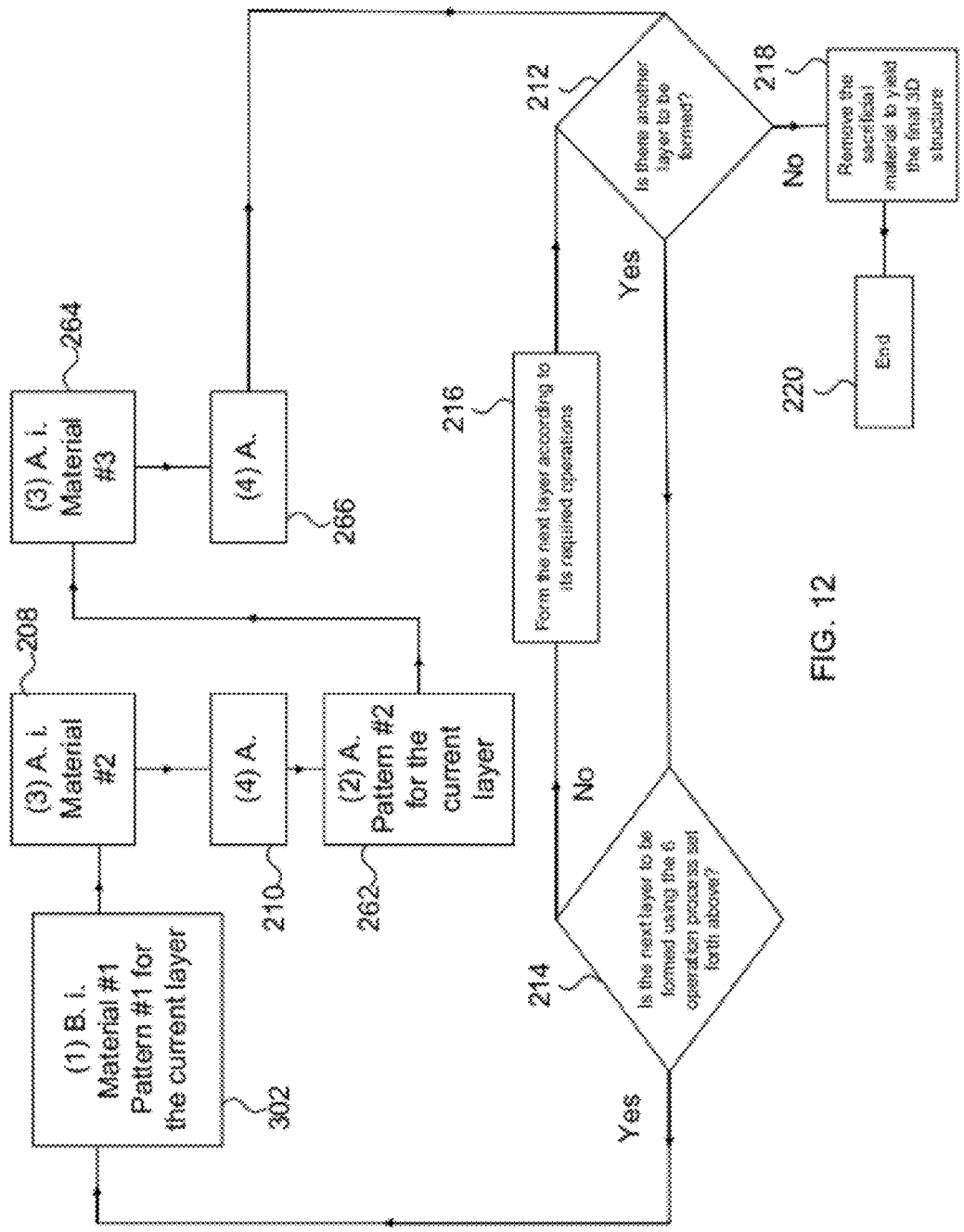
FIG. 12 depicts a flowchart for a preferred three material embodiment where a portion of the selective patterning is performed using selective etching and a portion is performed using selective deposition.

FIG. 12 depicts a process flowchart for a preferred three material embodiment where a portion of the selective patterning is performed using selective etching and a portion is performed using selective deposition. In this embodiment, operations 202-206 are replaced with a single selective deposition operation 302, after which the process proceeds onward from operation 208 through operation 220 as described in association with FIG. 10.

Figure 13A:
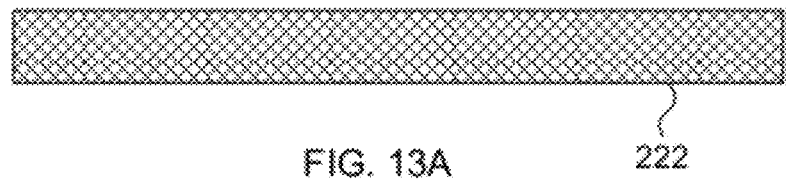
FIGS. 13A-13C schematically depict side views of various stages of a selective deposition process of the flowchart of FIG. 12 as applied to a particular structure.
Figure 13B:
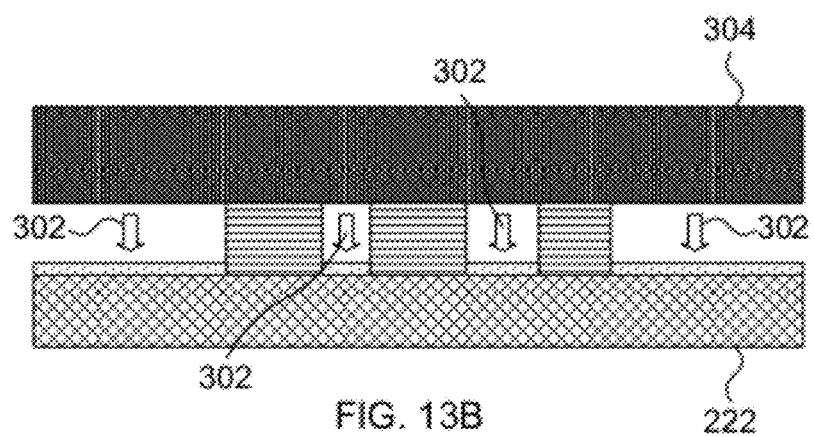
Figure 13C:
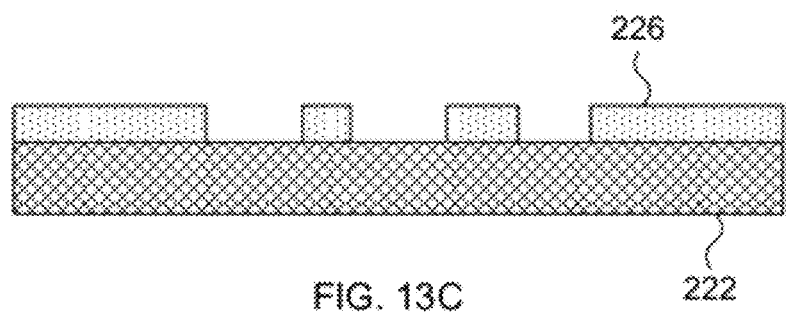

FIGS. 13A-13C depict a side views progressing through various stages of the selective deposition operation 302 of FIG. 12. FIG. 13A shows the substrate 222 onto which deposition will occur. FIG. 13B depicts a contact mask 304 in contact with the substrate with selective deposition 302 in progress. FIG. 13C depicts the resulting pattern of material after the selective deposition 302 has been completed. In some alternative embodiments, instead of using a contact mask, an adhered mask may be used, or selective deposition may occur in some other manner (e.g. by deposition from an ink-jet or array of inkjets or the like).

Figure 14:
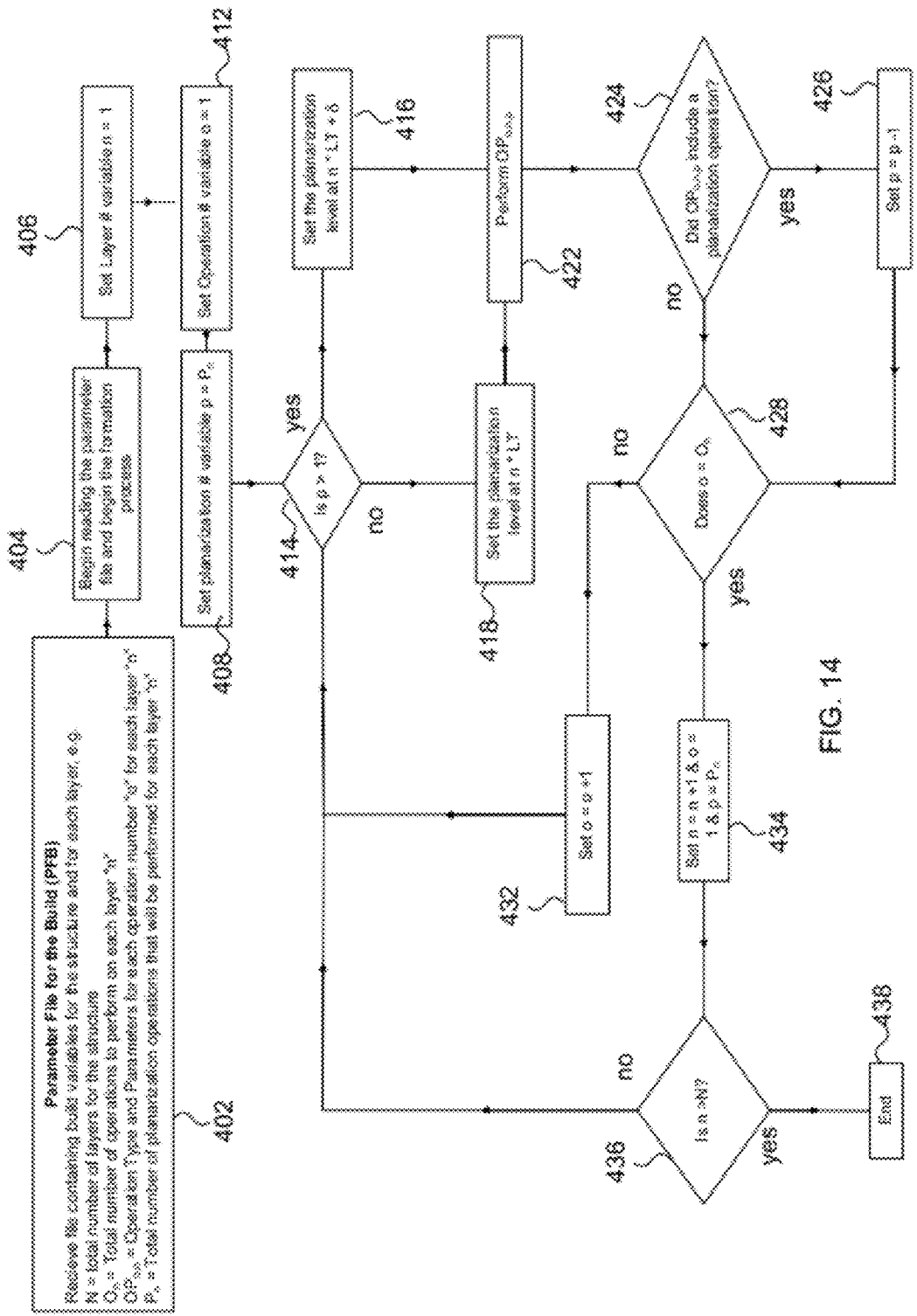
FIG. 14 depicts a generalized flowchart for a non-interlacing embodiment of some aspects of the invention.

FIG. 14 depicts a generalized flowchart for an embodiment of some aspects of the invention. In this embodiment the building operations to be performed are provided in the form of a Parameter File for the Build (PFB). The process starts with operation 404 which calls for the reading of the PFB 402 and then proceeds to set process variables to preliminary values (operations 406, 408, and 412).

Inquiry 414 is made and if the planarization variable, p, indicates that the planarization that is to be next performed is the last planarization for the layer the planarization level is set at n*LT (element 418), where n is the layer number and LT is the thickness of each layer (assuming the layers have a uniform thickness-which may not be the case in some alternative embodiments). If the next planarization is not the last planarization for the layer the level is set at n*LT+δ. In this embodiment the setting of the planarization level is measured relative to the beginning of structure formation and thus takes into account the layer number "n" that is being processed and the thickness of each layer (LT). In some alternative embodiments other definitional schemes may be used. The process then moves on to element 422 which calls for the performance of the next operation as dictated by the layer number "n" and the operation number "o" for the layer.

Inquiry 424 is then made to determine whether a planarization operation has occurred and thus whether or not the planarization variable "p" should be decremented. If the answer to the inquiry is "yes" the process proceeds to element 426 and thereafter proceeds to element 428. If the answer is "no" the process proceeds directly to element 428.

Inquiry 428 determines whether or not the operation just performed was the last operation for the layer. If "no", the process proceeds to element 432 where "o" is incremented and the process loops back to element 414. If the answer is "yes", then "o" is reset to a value of "1", the layer variable "n" is incremented, and the planarization variable "p" is set to a value Pn which is the total number of planarization operations that will be performed on the new layer "n" (element 434).

Inquiry 436 determines whether or not "n" has exceeded the total number of layers for the structure, if not, the process loops back to element 414. If "n" has exceeded the total number of layers for the structure, the process proceeds to element 438 and it ends.

Many alternatives to the embodiments presented herein are possible and will be apparent to those skilled in the art upon reviewing the teachings herein. For example, alternatives to continuous selective removal exist: (1) electrochemically etch without stopping, (2) electrochemically etch and periodically separate the mask from the substrate to let new electrolytic solution enter, or (3) reverse etching polarity periodically, or the like. Structures may be formed from more than two or three materials. Multiple structural materials may used and multiple sacrificial materials may be used. Deposition of materials may be to depth less than a nominal layer thickness and one or more different materials may be deposited onto such thin coatings such that a total thickness reaches or exceeds the layer thickness. Etching depths may vary as may interim planarization levels.

Though the embodiments discussed above treated layers as entities that should be fully and uniformly formed prior to proceeding to subsequent layers, some embodiments of some aspects of the invention may deviate from a strict layer-by-layer build up process and may interlace the formation of successive layers. In some embodiments the order of deposition of materials may vary (e.g. reverse) during formation of successive layer levels. Such layer interlacing operations may offer various advantages including reducing the number of operations that may be needed for each incremental increase in growth of structural height, improving adhesion between layers, improving layer-to-layer conductivity, or the like.

Figure 15A:
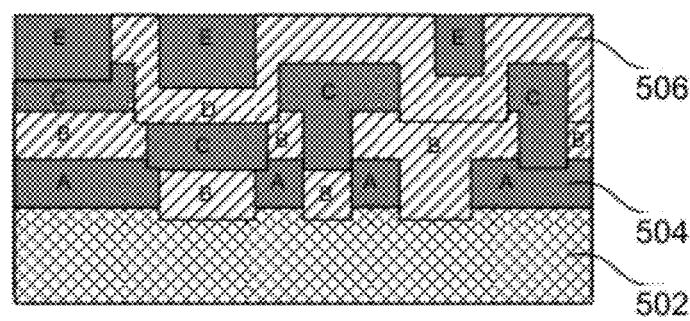
FIGS. 15A-15C schematically depict side views of a structure formed by an interlaced embodiment where various delineations between materials deposited in association with each layer level are depicted.
Figure 15B:
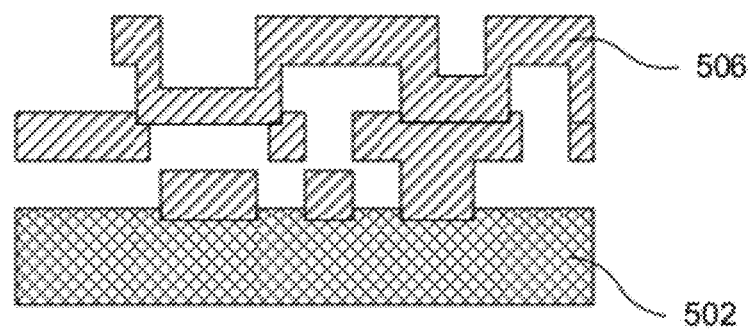
Figure 15C:
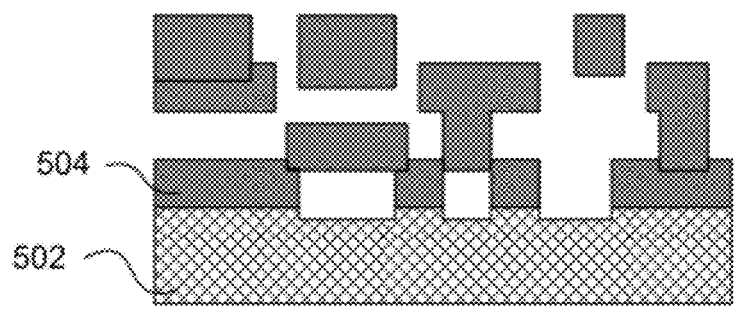

FIGS. 15A-15C present side views of a structure formed by an interlaced embodiment where delineations between material deposited in association with each layer level are depicted. FIG. 15A depicts a structure formed on a substrate 502 where the structure is formed from a first material 504 and a second material 506. The deposited materials are shown with boundary elements which may be used in determining with which layer each individual region was associated with when it was formed. Regions formed in association with the first layer are labeled with an A while regions formed in association with the second through fifth layers are designated with the letters B-E, respectively.

FIG. 15B depicts a side view of a section of the structure of FIG. 15A where material 506 is a structural material and material 504 is a sacrificial material which has been removed.

FIG. 15C depicts a side view of a section of the structure of FIG. 15A where material 504 is a structural material and material 506 is a sacrificial material which has been removed.

As an example, the following process may be followed in forming structures using two materials while using only three operations per increment in layer level.

(1) in association with a first layer level deposit (e.g. electrodeposit) a first material onto a substrate or previously formed layer;

(2) planarize the surface of the deposited first material to a desired first layer level (e.g. n*LT, where "n"=layer level);

(3) selectively etch the first material to a desired depth to create voids of the desired depth (e.g. LT or LT+δ);

(4) deposit (e.g. electrodeposit) a second material to reach a position (height) at least as great as a second layer level (e.g. n*LT or n*LT+δ);

(5) planarize the surface of the deposited second material to a desired second layer level (e.g. n*LT);

(6) selectively etch the second material to a desired depth to create voids of the desired depth (e.g. LT or LT+δ); and (7) repeat operations (1)-(6) while incrementing previous references to the layer levels by a value of 2 ("n" goes to "n+2") until the deposition and patterning of the last layer of structure is reached. If the last layer of structural material corresponds to a level in which voids have been etched into the sacrificial material, the process ends with the deposition of the structural material and the planarization of the material down to the same level used in depositing the previous layer of sacrificial material. If the last layer of structural material corresponds to a level in which structural material is deposited, the process ends with the etching of the structural material from that level down to a desired depth (e.g. LT or LT+δ).

Figure 16A:
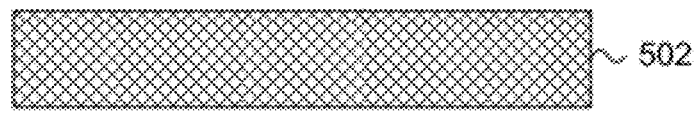
FIGS. 16A-16O schematically depict side views of various states of the process during the formation of a structure similar to that shown in FIG. 15B.
Figure 16B:
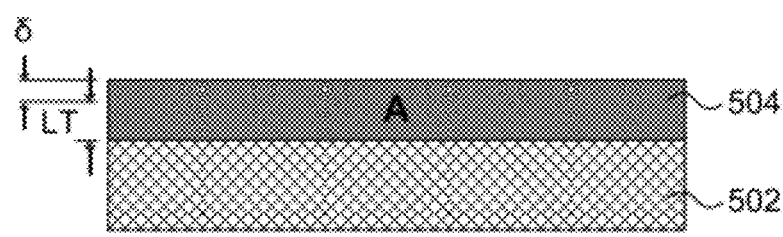
Figure 16D:
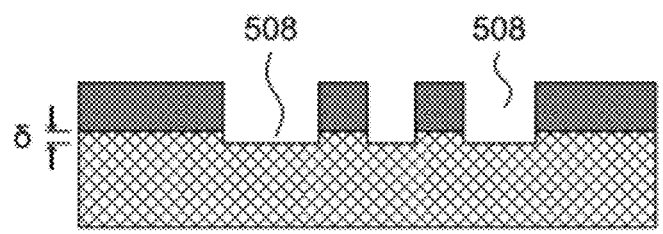
Figure 16C:
Figure 16E:
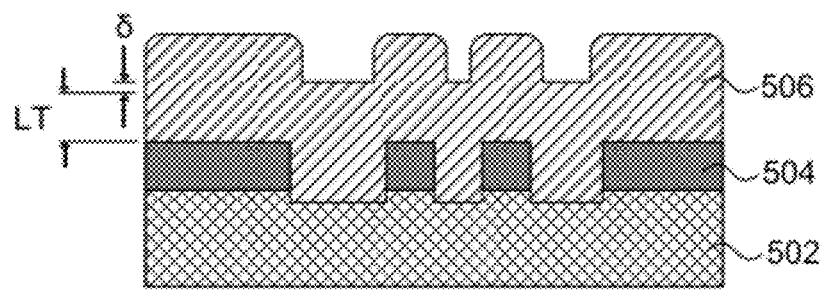
Figure 16F:
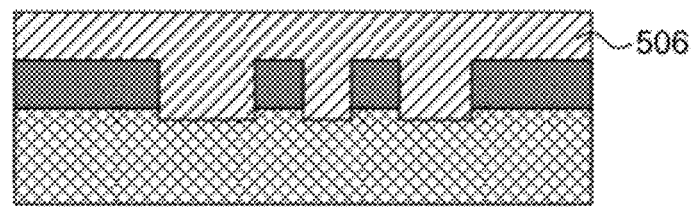
Figure 16G:
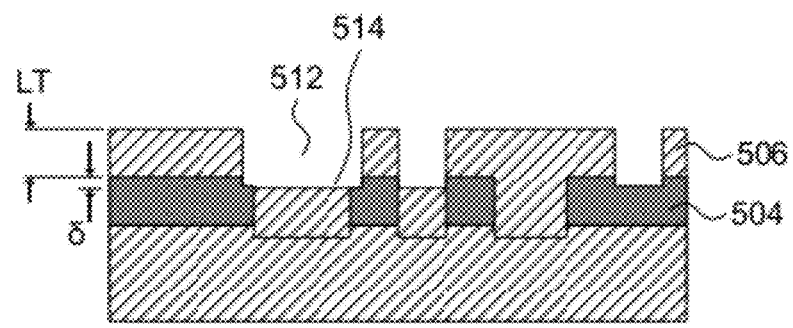
Figure 16H:
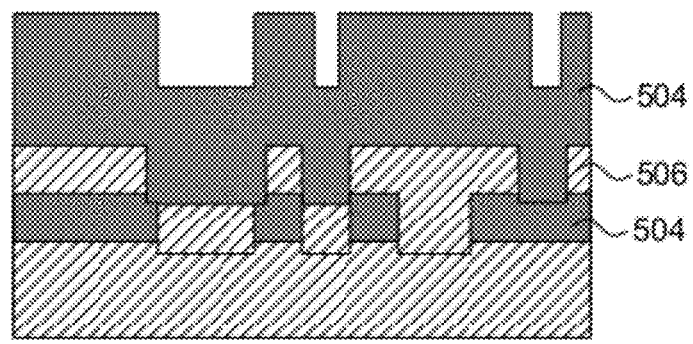
Figure 16I:
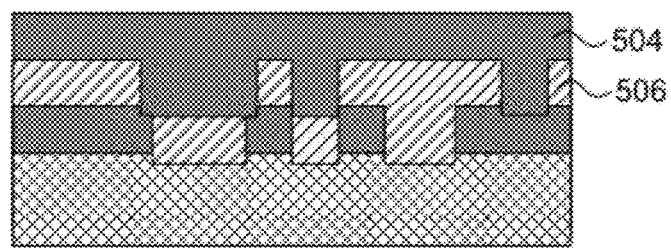
Figure 16J:
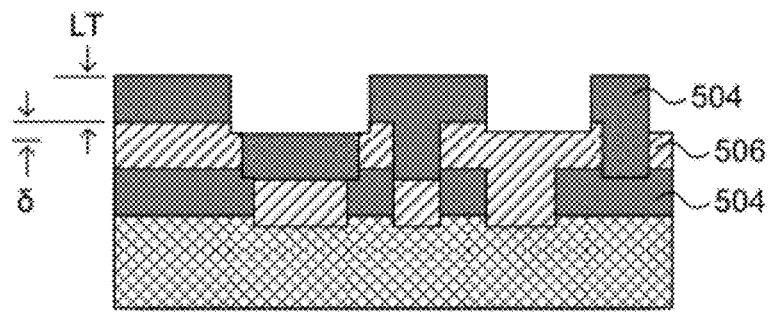
Figure 16K:
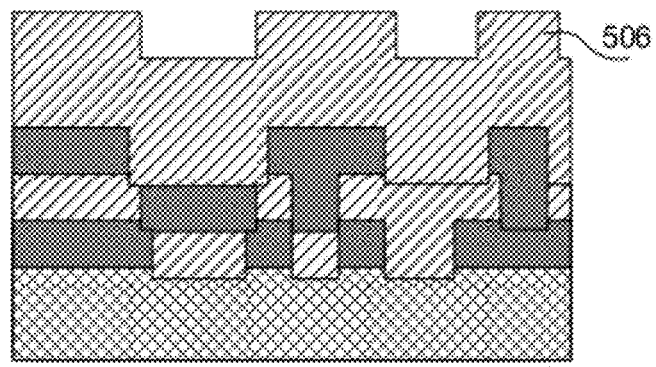
Figure 16L:
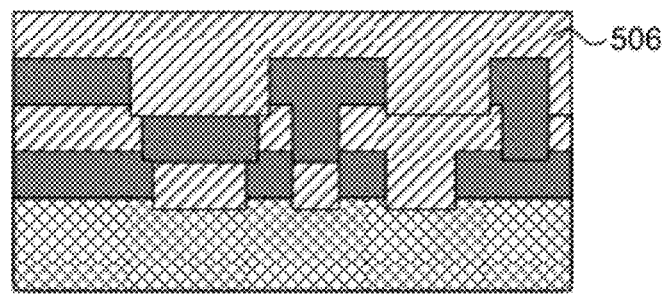
Figure 16M:
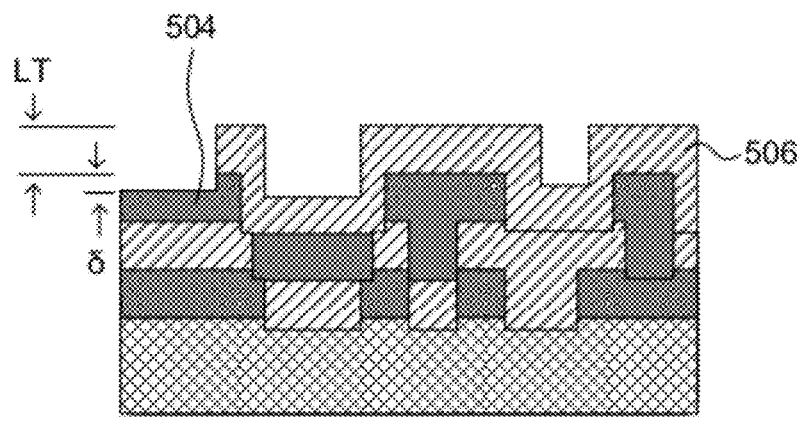
Figure 16N:
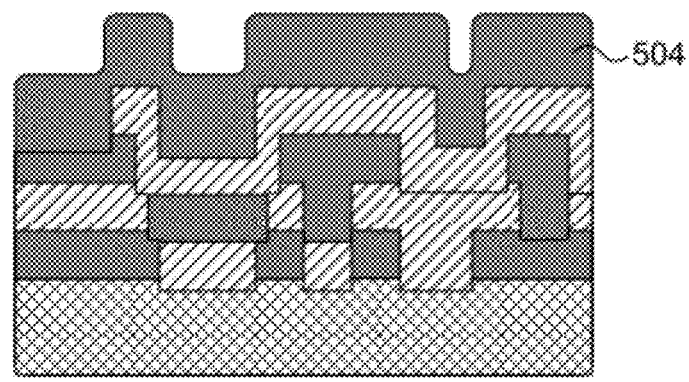
Figure 16O:
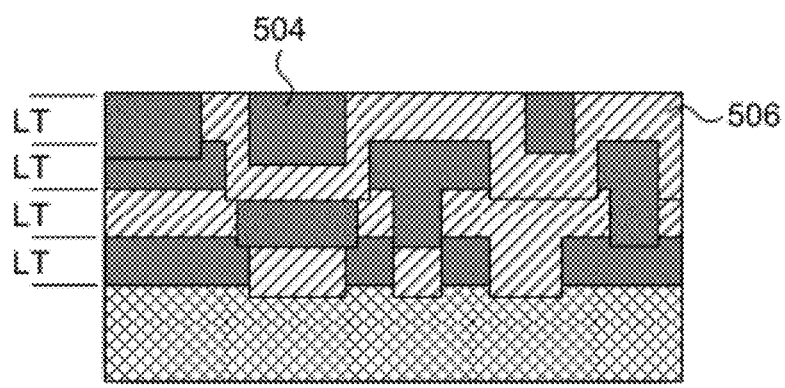

The application of the above noted process to the formation of a structure similar to that of FIG. 15B is illustrated in FIGS. 16A-16O.

FIG. 16A depicts a side view of a section of substrate 502 onto which layers of structure will be added.

FIG. 16B depicts the result of Operation 1 as applied to the deposition of material 504 in association with a first layer. In this example, it is assumed that the deposition of material 504 results in a thickness which is greater than a layer thickness (LT) by an incremental amount δ. In this example, it is also assumed that the deposition of material 504 occurs by a blanket or bulk deposition process as opposed to a selective process.

FIG. 16C illustrates the state of formation after material 504 deposited in association with the first layer is planarized (Operation 2) to have a thickness equal to the layer thickness (LT). Though the region of the first layer is completely occupied by deposited material, the first layer is not yet completed.

FIG. 16D illustrates the state of the process after an etching operation (Operation 3) selectively removes material deposited in association with the first layer such that voids 508 are etched into material 504. The selective etching to form the voids may occur in a variety of manners as discussed herein previously. As indicated in FIG. 16B voids not only penetrate through material 504 but may also extend to create voids 508 in the substrate. The depth of voids 508 is assumed to be a small incremental amount δ which is used to ensure complete removal of material 504 from the etched regions. In some alternative embodiments etching into the substrate may be minimized by appropriate use of process control parameters or by the result of an incompatibility between the etching process and the removal of material associated with the substrate.

FIG. 16E depicts the state of formation after a blanket deposition operation (Operation 4) which deposits material 506 into the voids in material 504 and to the height which slightly exceeds a thickness (LT) of a present layer (i.e. a second layer) that is being, at least in part, simultaneously formed. As in this example it is assumed that the deposition of material 506 occurs in a blanket process that covers both the material 504 and the void regions in material 504 the height of deposited material is shown as being non-uniform.

FIG. 16F depicts the state of formation after a planarization operation (Operation 5) trims material 506 to a level which bounds the second layer (i.e. a height equal to LT×2 assuming a uniform layer thickness is being used for the first two layers, or a height of LT1 plus LT2 which are the respective heights for the first and second layers).

FIG. 16G depicts the state of formation after a selective etching operation (Operation 6) selectively removes a portion of material 506. As indicated in the figure, the selective etching of material 506 forms voids 512 which extend through the thickness of the second layer and continue as voids 514 which extend slightly into the first layer by an amount δ. Also as depicted in the figure the etching operation may not only remove material 506 but may also remove some of material 504 which is encountered on the first layer. In some alternative embodiments the etching of material 504 found on the previous layer may not occur or be held at a minimal level as a result of an incompatibility between the etching operation and the removal of material 504 or by control of process parameters associated with the etching operation.

FIGS. 16H-16M depict the state of formation after repeating the operations of FIGS. 16B-16G to complete formation of the second layer (the second layer receives material 504-deposited in association with the third layer-into the voids) and the third layer (voids are made in material 504 of the third layer and the third layer receives material 506—deposited in association with the fourth layer—into those voids, and to partially form the fourth layer (material 506 is deposited in association with the fourth layer to fill voids in the third layer and form a first deposit of material that forms part of the fourth layer and then voids are made in material 506 to give a desired pattern of material 506 on the fourth layer).

FIG. 16N depicts the state of formation after repetition of a deposition operation (Operation 1) which results in the completed deposition for the fourth layer and if the deposition is allowed to proceed for sufficient time, partial formation of a fifth layer would also occur. However, in the present example the part is assumed to contain only 4 layers. The deposition associated with this repetition of operation 1 is cut short after sufficient material has been deposited to fill the voids in the 4th layer.

FIG. 16O depicts the state of formation after a planarization operation (i.e. a modified Operation 2) planarizes the surface at a level that bounds the fourth layer 4. This is considered a modification to Operation 2 in that if Operation 1 was allowed to have been completed the planarization of operation 2 would have occurred to bound a 5th layer as opposed to the 4th layer.

If material 506 is a structural material, and if the structure to be formed is considered to have only 4 layers, the layer formation process may have terminated with the state of formation associated with FIG. 16M. The process of forming the desired structure may then have been completed by removing the sacrificial material. The state of formation after such a removal process is shown in FIG. 15B where distinctions in deposition layers can still be seen while FIG. 17 depicts the final structure with the distinctions between deposited layers removed.

Figure 18:
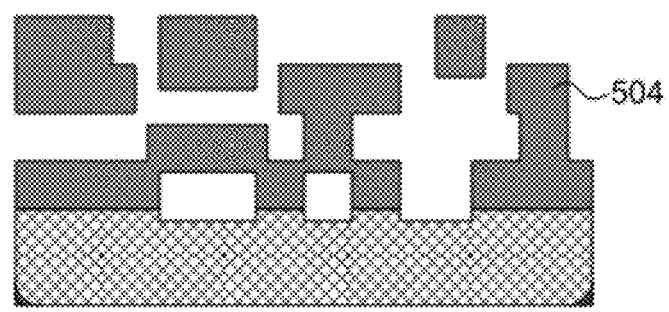
FIG. 18 schematically depicts a side view of the structure of FIG. 15C with the distinctions between deposited layers removed.

If material 504 is considered to be a structural material and, material 506 a sacrificial material and if it is assumed the structure contains only 4 layers, the layer formation process may have been considered to be completed with the state of formation depicted in FIG. 16O. The completed formation of the desired structure could then be achieved by etching away the sacrificial material leaving behind the desired structure as indicated in FIG. 15C where the distinctions in depositions layers can still be seen. FIG. 18 depicts the desired structure of FIG. 15C with the distinctions between depositions associated with different layers removed.

Figure 17:
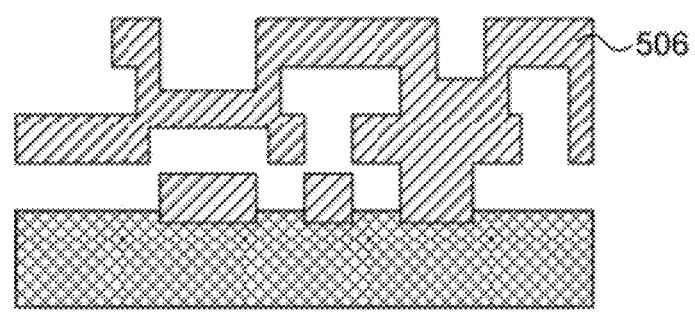
FIG. 17 schematically depicts a side view of the structure of FIG. 15B with the distinctions between deposited layers removed.

The distinctions between the structural representations of FIG. 15B and FIG. 17 and FIG. 15C and FIG. 18 may not be of a structural nature if there is little in the way of distinctions between the bulk properties of the deposited materials as compared to the properties of the materials in the regions where layers join. However, in some embodiments there may truly be structural distinctions between these representations which structural distinctions may be achieved by applying an annealing or other process to the structures of FIGS. 15B and 15C to obtain more desirable structures as depicted in FIGS. 17 and 18, respectively.

In some alternative embodiments even if the material 506 is a structural material and material 504 is a sacrificial material it may be preferable for the layer formation process to terminate with the state of formation depicted in FIG. 16O as opposed to that depicted in FIG. 16M as it may be desirable to have a completed layer prior to beginning an etching operation that removes the sacrificial material. Such a desire may result from a need to perform additional processing operations prior to performance of the etching operation that removes the sacrificial material.

In some other alternative embodiments as it is recognized that the fourth layer is the last layer to be formed, it may be preferable to set the planarization level that resulted in the state of formation depicted in FIG. 16L to a level that is slightly offset from the desired layer level to ensure that any tolerance variations associated with a planarization operation that resulted in the state of formation of FIG. 16O does not inadvertently leave thin sections of material 504 located above material 506. In other words such a shifting of planarization level may help ensure that thin undesired sections of structural material do not remain in the completed structure. In still other alternative embodiments, if any undesired structural material remains and such undesired material is thin compared to the layer thickness and to desired resolution in the planes of the layers it may be possible to remove such undesired material using a controlled etching operation that attacks the structural material on a limited basis.

In the most preferred embodiments it is desirable to ensure that the etching operations that are preformed in preparation for depositing structural material are performed in such a way so as to ensure that material that is located one layer below the starting etching level is reached. Such processing ensures that structural material deposited on one layer contacts and adheres to any structural material that was deposited in association with the layer that is two layer thicknesses below the ultimate bounding position of the present layer. It is believed that such processing may be achieved by adding an amount $\delta$ which is greater than or equal to the sum of tolerances used in planarizing the level from which etching begins and the level located one layer thickness below that (assuming that building orientation is upward). However, in some alternative embodiments it may be possible to simply etch to the layer thickness or maybe even slightly less than then layer thickness due to the fact that if any sacrificial material is sandwiched between consecutive depositions of structural material and that the sandwiched sacrificial material is thin enough, etching to remove the sacrificial material after layer formation is complete may be achievable without significantly undercutting or removing the thin portions of the sandwiched sacrificial material.

As also discussed above, when etching into structural material in preparation for depositing sacrificial material it is preferred that etching be performed such that a depth slightly more then one layer thickness is achieved such that structural material does not remain in regions where it is intended that sacrificial material deposited on one layer contact sacrificial material deposited in association with the second layer below. It is desired that such thin elements of structural material be avoided in that once the sacrificial material is removed (i.e. after layer formation is complete), inappropriate regions of structural material may remain or these regions of structural material may even inhibit the removal of the sacrificial material. However, in some embodiments it may be possible to etch the structural material to a depth of one layer thickness or slightly less or to at least not worry about whether tolerance errors may result in undesired regions of structural material remaining as it may be possible to remove this unwanted structural material. Such removal, for example, may occur by performing a controlled etch of the structural material after removal of the sacrificial material such that a slight amount of structural material is removed where the slight amounts are sufficient to remove the undesired remnants while simultaneously not significantly impacting the accuracy of the desired structure. Alternatively in some embodiments (e.g. those where the structures include only a small number of layers) it may be possible to alternatingly etch the sacrificial layers) and small amounts of the structural material to ensure that undesired structural material is removed and that all sacrificial material that is to be removed is accessible to the etching process.

In some embodiments where etching of structural material will occur after layer formation is complete it may be possible to resize the structure or elements of the structure in anticipation of the reduction in size that will occur as a result of any post layer formation etching operations that are performed. Such resizing may be of a uniform nature or of an anisotropic nature based on anticipated amounts that will be removed from different locations or based on the critical dimensioning of certain features. Such post layer formation etching may also be used to reduce the slight excess thickness of layers that may result from an excess thickness of the voids that are associated with slight excess etching that is used to ensure adhesion.

Figure 19:
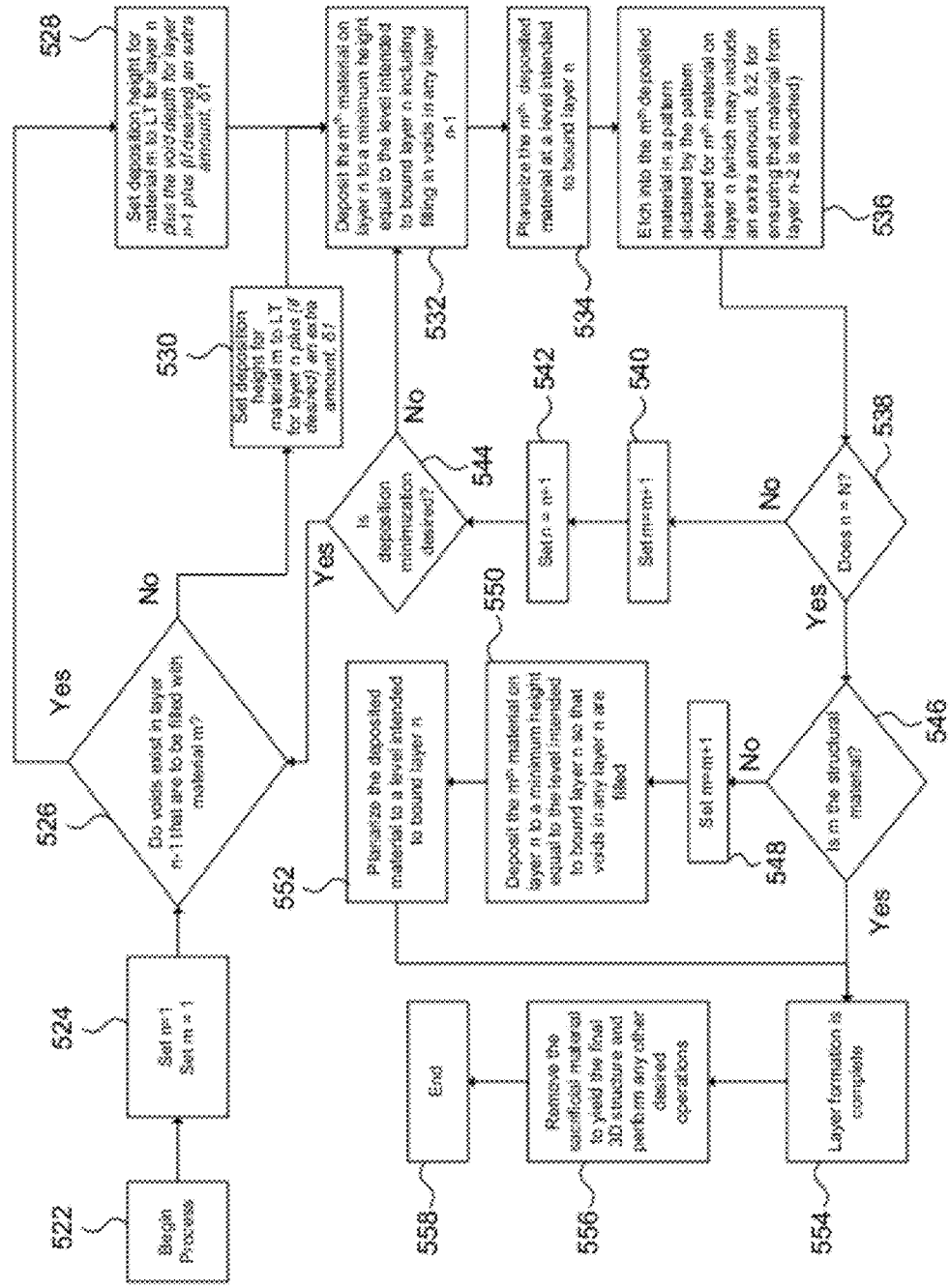
FIG. 19 presents a flowchart for an alternative process for forming three-dimensional structures from a plurality of adhered and interlaced layers.

An alternative process for forming three-dimensional structures from a plurality of adhered layers is presented in the flowchart of FIG. 19. In this process, layer formation occurs on an interlaced basis and only one of the structural or sacrificial materials is deposited in association with any given layer level just as in the embodiment of FIGS. 15-18.

The process of FIG. 19 begins with element 522 and proceeds to element 524 where a variable "n" is set equal to 1 and a variable "m" is also set equal to 1. The variable n sets the current layer number and the variable m sets the current material number. In the present embodiment it is assumed that the structure contains layers 1-N. In the present embodiment, if the variable m is odd a first material is represented, and if the variable m is even a second material is represented.

Next, the process moves to element 526 which makes an inquiry as to whether voids exist in layer n–1 that are to be filled with material m. If such voids exist the process moves to element 528, and if they do not exist the process moves forward to element 530. Element 528 calls for setting a deposition height for material m to be the sum of the layer thickness for layer n plus the void depth for layer n–1, plus any desired extra amount $\delta 1$ where the incremental amount may be used to ensure that a proper deposition height is reached in view of planarization tolerances and deposition rate tolerances. In element 530 a deposition height is set to the layer thickness for layer n plus any desired extra amount $\delta 1$.

From either element 528 or 530 the process moves forward to element 532 which calls for the deposition of the mth material on layer n. If voids exist in layer n–1 those voids would be filled in during the deposition process. Regardless of the deposition height the minimum level of deposition is that necessary to bound layer n.

From element 532 the process moves forward to element 534 which calls for planarization of the mth deposited material at a level that is intended to bound layer n. In an alternative embodiment, if layer n is the last layer, this planarization may set a level that leaves additional material on the nth layer. This additional material may be taken into consideration when performing etching operations and maybe removed in a subsequent planarization process.

Next, the process moves forward to element 536 which calls for etching into the mth material associated with layer n where the etching is performed on a selective basis and yields a pattern of the mth material that is intended to be associated with the nth layer. The etching may be to a depth equal to the layer thickness plus an incremental amount δ2 which may be added to ensure that the voids formed by etching extend completely to the material deposited in association with layer n−2.

Next, the process moves forward to element 538 which inquires as to whether the variable n is equal to the total number of layers in the structure, "N". If the answer is "yes", the process moves forward to element 546 and if the answer is "no", the process moves forward to element 540. Element 540 calls for setting the value of variable m to m+1. The process then moves forward to element 542 which calls for setting the value of the variable n to n+1. Next, the process moves forward to element 544 which makes an inquiry as to whether or not deposition minimization is desired. If the answer to this inquiry is "no", the process loops back to element 532 and it is assumed that the deposition height should be set to an amount that is sufficient to ensure a coating of desired properties is achieved which coating may be of greater thickness than actually required (e.g. the deposition height should be set to LT+VD+δ1, where LT is the layer thickness, VD is the void depth, and δ1 is an incremental amount possibly added to ensure that tolerance variations do not cause problems). If the answer is "yes", the process loops back to element 526, which has already been discussed.

If the answer to the inquiry of 538 is "yes", the process moves forward to element 546 which makes the inquiry as to whether the material m is the structural material. If the answer is "yes", the process moves forward to element 554 which signifies that the layer formation process is completed. If the answer is "no", the process moves forward to element 548 where the variable m is incremented to a value of m+1.

After which the process moves forward to element 550 which calls for deposition of the mth material (which is based on the revised value of m). The deposition will occur to yield a sufficient depth which sets the minimum height to a level that is intended to at least bound layer n so that the voids in layer n are filled.

After the deposition associated with element 550, the process moves forward to element 552 which calls for planarization of the deposited material to a level that is intended to bound layer n. After performance of the function of element 552, the process moves forward to element 554, which was mentioned above and which signifies that the layer formation process is complete.

Next, the process moves forward to element 556 which calls for the removal of sacrificial material to yield a final three dimensional structure and to perform any other desired operations. And finally, the process ends with element 558.

Many alternatives to the process illustrated in FIG. 19 are possible. Some such alternatives may include modifications that would allow one or more additional materials to be included in the build process. Some alternative embodiments may involve a mixture of the interlaced layer approach presented in FIG. 19 with an approach that calls for complete planarization of both a structural material and sacrificial material on some layers. Such alternative approaches may be utilized for specific layers where dimensional accuracy or enhanced smoothness are required while still allowing a reduced number of operations per layer increment when forming those portions of the structure, were less dimensional accuracy or surface smoothness can be tolerated.

Various other alternative processes using interlaced layer formation techniques are possible. In some embodiments individual structural material zones may be divided into regions that can be deposited on a staggered basis thereby helping to ensure intimate interlaced contact between structural materials deposited in association with different layers which might improve interlayer adhesion significantly or enhance properties of the structure in other ways. Alternative embodiments may use more than two materials, and further embodiments may build with higher repetition order than the two layer repetition pattern of the above outlined process. Supplemental processes may be added when up-facing and down-facing features are encountered that do not correspond nicely to the potential etching and deposition levels for a given material.

Figure 20A:
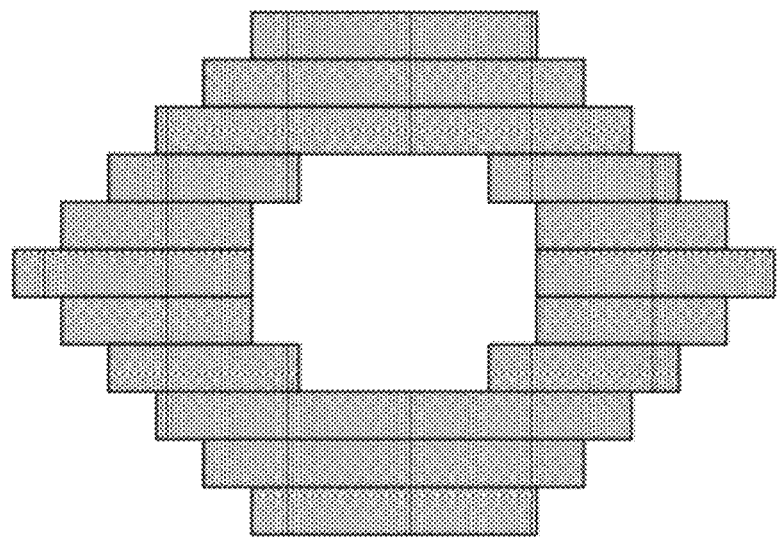
FIG. 20A schematically depicts a side view of a sample structure produced by an embodiment of some aspects of the invention where each layer is completed prior to beginning formation of a subsequent layer.

FIGS. 20A-20E depict side views of sections of a sample structure that may be formed according to different embodiments of some aspects of the invention. FIG. 20A depicts a side view of an embodiment where each layer is completed prior to beginning formation of a subsequent layer.

Figure 20B:
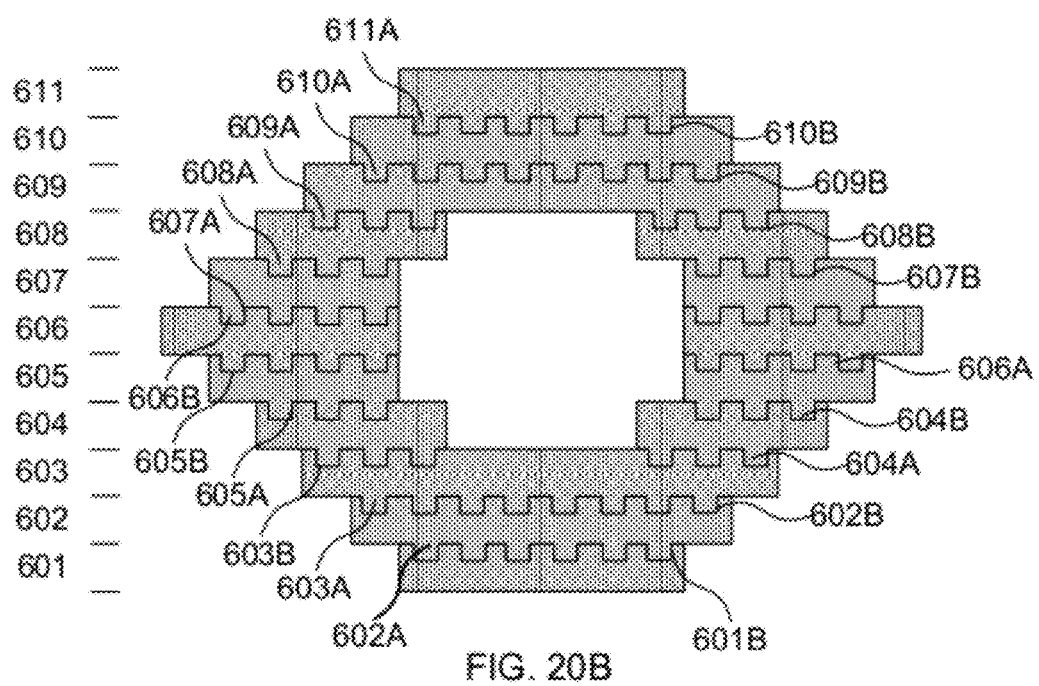
FIGS. 20B-20E schematically depict side views of the sample structure as it may be formed according to different embodiments of some aspects of the invention where varying degrees of interlacing between the layers are used.

FIG. 20B depicts a side view of the same structure as that of FIG. 20A where voids are formed in layers in locations where they are bounded by structural material to be deposited on subsequent layers such that the deposition of material on subsequent layers causes deposition of material into part of a previously formed layer. Such a process may lead to more surface contact and interlocking of material deposited in association with successive layers. Operations that lead to such enhanced interlocking or such interlocking itself may result in enhanced adhesion and/or electrical conductivity and/or thermal conductivity between layers. In FIG. 20B it is assumed that the structure is formed from the lowest layer to the highest layer, though of course in alternative embodiments other formation orientations are also possible.

To the left of FIG. 20B individual layers 601 through 611 are identified. Openings or voids formed in each layer in anticipation of their being filled during deposition associated with a subsequent layer are designated with the layer number plus the letter B, 601B-610B. Protrusions from layers that are intended to extend into openings in previous layers are indicated with the layer number and the letter A, 602A-611A.

In some embodiments, as exemplified by FIG. 20B, only regions of structural material are provided with voids and protrusions (e.g. that help interlock the layers) while in other embodiments sacrificial material may also include voids and protrusions that may help interlock layers of sacrificial material together. It is generally preferred that voids in structural material only occur on those portions of previous layers that are bounded by structural material on subsequent layers. Similarly, protrusions in subsequent layers, preferably only exist in those portions of the subsequent layers that are bounded by structural material existing on previously formed layers. The converse of these preferences hold for the sacrificial material when voids and protrusions are to exist therein.

Figure 20C:
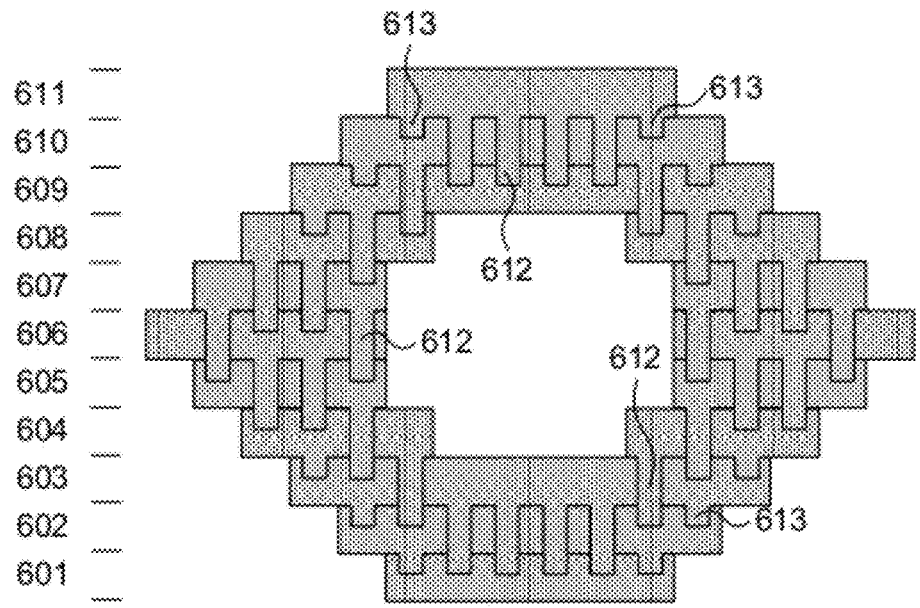
Figure 20D:
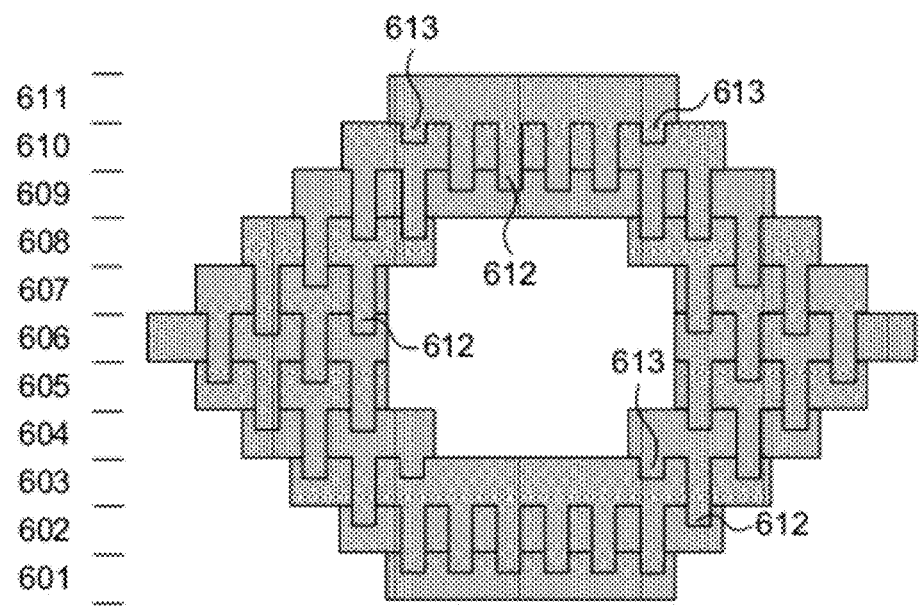

FIG. 20C and FIG. 20D depict side views of the same structure as that of FIG. 20A and FIG. 20B formed by two alternative embodiments where interlacing elements preferentially connect three layers instead of two layers as shown in FIG. 20B and where interlacing of some elements are limited to two layers when necessary. Interlacing elements 612 are shown as connecting three layers while interlacing elements 613 are shown as connecting only two layers. The interlacing preferably is formed in such a way that when a deposition is made in association with a given layer, a void exists completely through the previous layer and partway through the second layer down (assuming layers are stacked above previously formed layers). On a given layer it is preferred that interlacing be staggered such that some interlacing zones begin on the layer and extend to the second layer below, others begin on the layer above and extend into the layer below and some begin two layers above and extend down into the given layer. In alternative embodiments other interlacing patterns may be made. In some embodiments, interlacing patterns may be tailored to give preferential patterning to those layers that have a reduced number of potential interlacing locations. Where it is not possible to have interlacing elements directly connect three layers, the interlacing may be reduced to that shown in these examples. In some embodiments etching that forms the voids may occur on a layer by layer basis with a sacrificial material filling the voids until it is time to remove the sacrificial material in preparation for depositing the structural material. In other embodiments the voids may be formed by an etching operation that etches the desired depth which may be either a fraction of layer or one or more layers or fractions thereof. In embodiments where etching occurs on a layer-by-layer basis, any excess etching of material at the upper most portion of a layer may form a natural undercut when overlaid by a subsequent layer that is completely etched through, such undercuts when filled may act as rivet-like locks that allow material deposited in association with a given layer to grasp one or more previously formed layers. If interlacing elements are staggered from layer to layer, as shown in FIG. 20C and FIG. 20D, and grasping is allowed to occur as a result of undercutting, the added mechanical bonding may significantly enhance integrity of the overall structure.

Figure 20E:
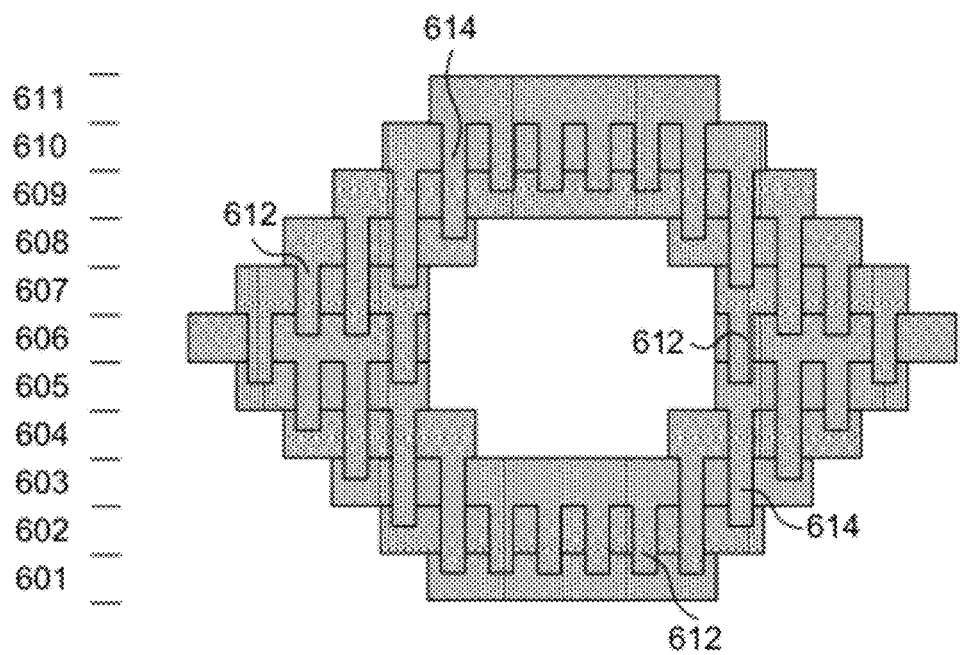

FIG. 20E depicts an alternative embodiment where preference is given to interlacing four layers (e.g. elements 614) if a situation arises where a three layer interlacing can not be formed without interfering with other interlacing structures.

Figure 21A:
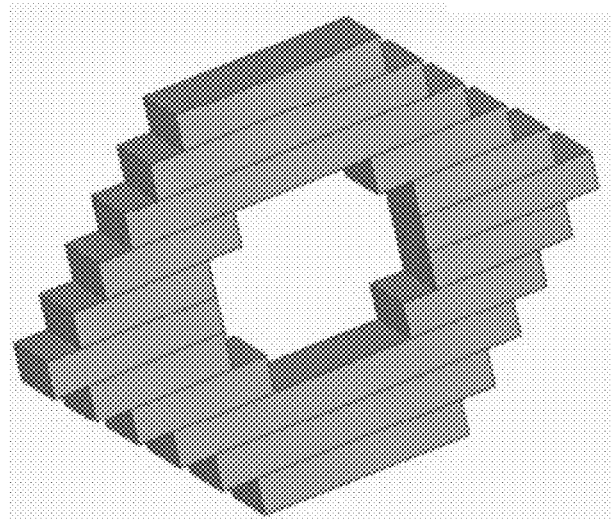
Figure 21B:
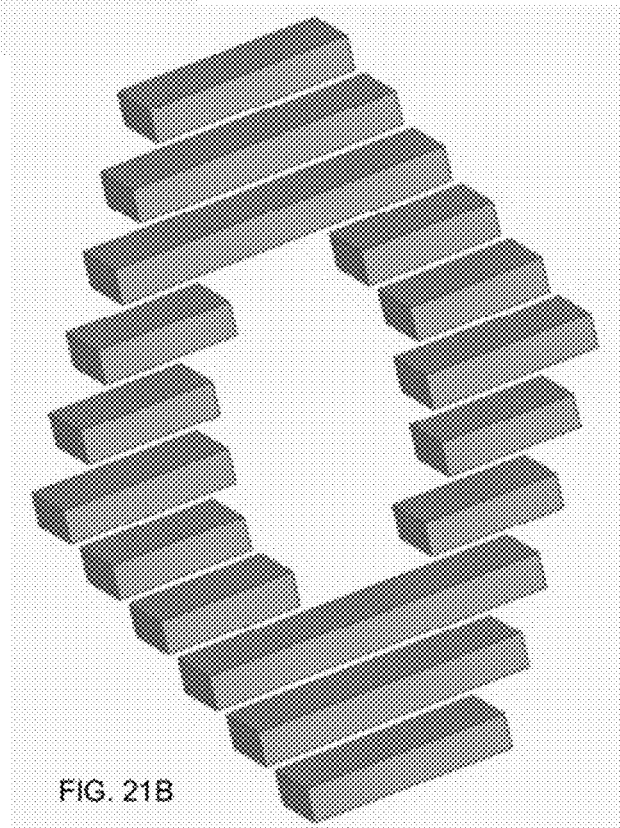
FIG. 21B depicts an exploded view of the individual layers forming the structure.

FIG. 21A depicts a perspective view of the structure of FIG. 20A while FIG. 21B depicts an exploded view of the individual layers forming the structure. Similarly, FIG. 21C and FIG. 21D depict different perspectives of exploded views of the structure of FIG. 20B where the protrusions and openings are readily seen.

Figure 21C:
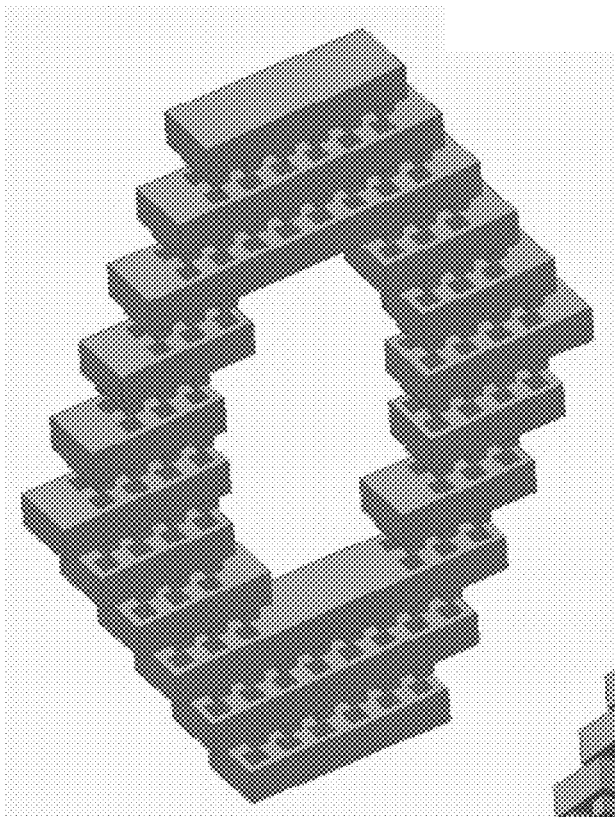
FIG. 21C and FIG. 21D depict different perspectives of exploded views of the structure of FIG. 20B where the layer-to-layer interlacing is used in forming the structure and where interlacing protrusions and openings can be readily seen.
Figure 21D:
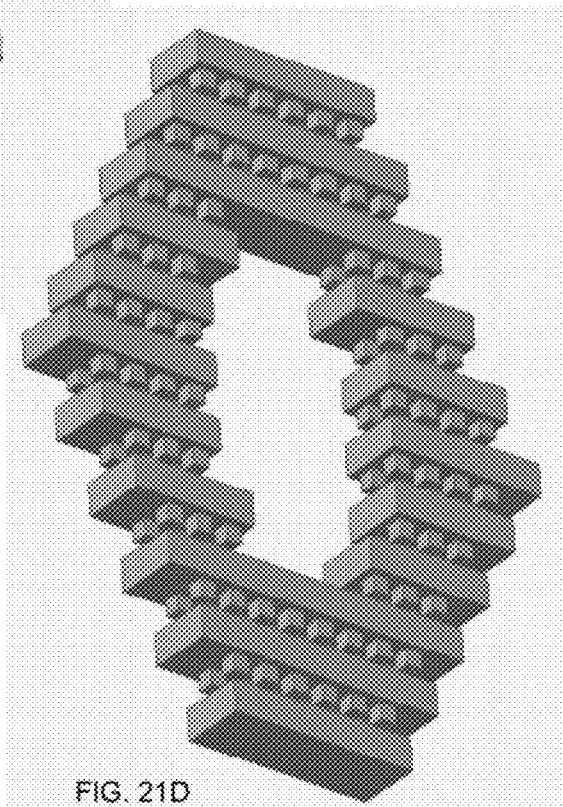
Figure 22:
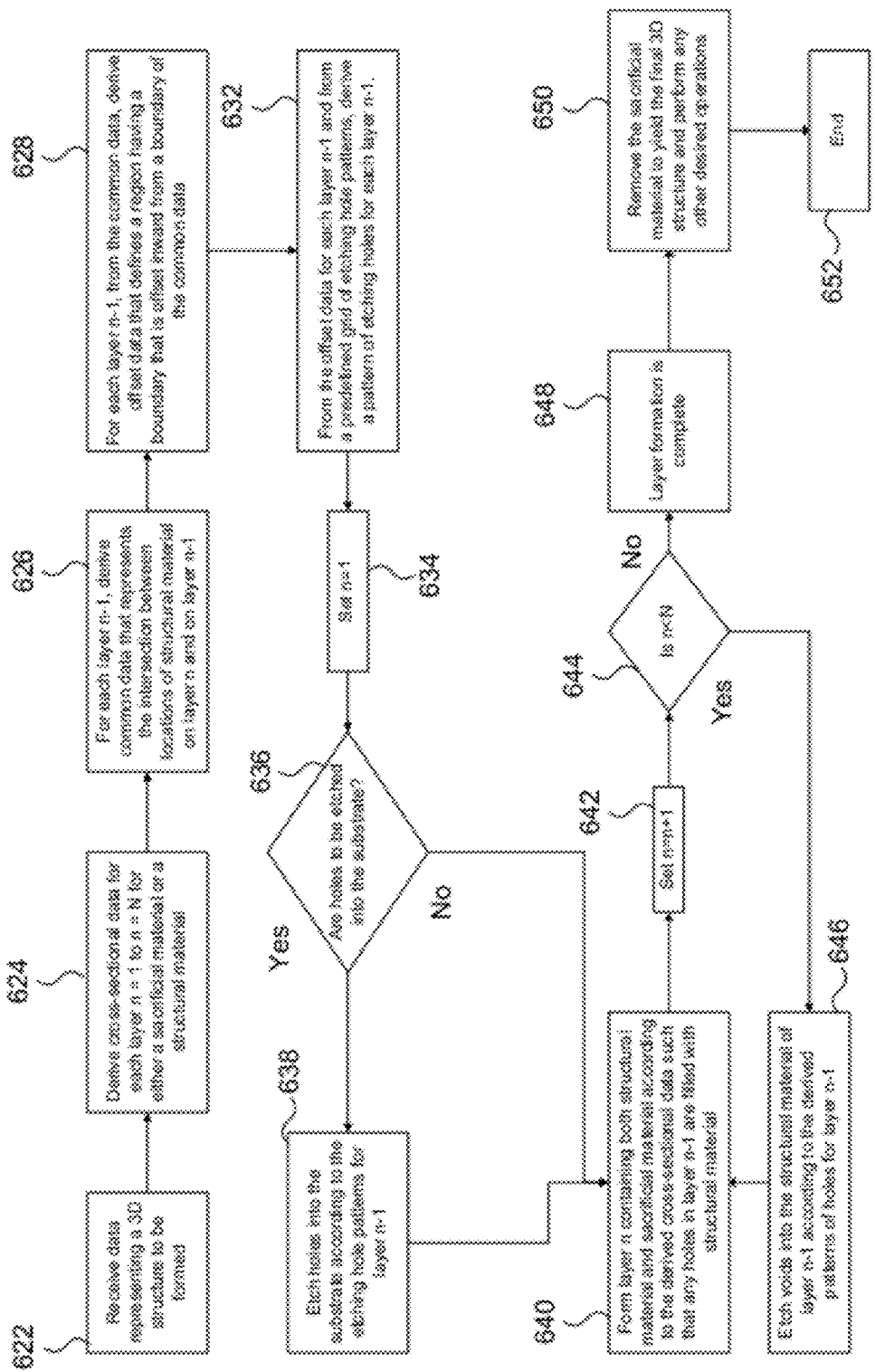
FIG. 22 provides a flowchart of a process that may be used to form a structure with interlaced layers such as that shown in FIG. 20B, 21C, and 21D.

FIG. 22 provides a flowchart of a process that may be used to form the structure of FIGS. 21B, 21C, and 21D. In other words, the process of FIG. 22 may be used to form a structure having interlaced layers of structural material.

The process of FIG. 22 begins with element 622 which calls for the receiving of data that represents a three-dimensional structure to be formed.

The process then moves to element 624 which calls for the derivation of cross-sectional data for each of the first layer to the Nth layer where the cross-sectional data may be representative of the sacrificial material that will exist on each layer or of the structural material that may exist on each layer.

Next the process moves forward to element 626 which calls for the derivation of "common data" that represents the intersection between locations of structural material on layer "n" and layer "n−1". The derived common data is associated with a layer "n−1".

Next, the process proceeds to element 628 which calls for derivation of offset data that defines a region having a boundary that is offset inward from a boundary of the common data. This process is performed for each layer "n−1".

The process then moves forward to element 632 which calls for derivation of a pattern of etching holes that will be associated with each layer n−1. A derived pattern is based on the offset data and on a predefined grid of etching hole patterns. In some embodiments, the pattern of etching holes may be considered to be derived from the intersection of the predefined grid of etching hole patterns with the offset data. In other embodiments, a derived pattern of etching holes may be based on only those members of the predefined grid of etching hole patterns that completely fall with in the region defined by the offset data. In still other embodiments, the pattern of etching holes may be derived in a different manner and may or may not be based on a fixed pattern.

Next the process moves forward to element 634 which sets a layer number variable "n" to a value of 1. The process then moves forward to element 636 which makes the inquiry as to whether holes are to be etched into the substrate. If the answer is "yes" the process moves forward to element 638 and if the answer is "no" the process moves forward to element 640. Element 638 calls for the etching of holes into the substrate according to the etching hole patterns previously derived for layer "n−1" or in other words for zeroth layer. The etching of the holes according to element 638 may occur in a variety of ways. For example the etching may occur via a contact mask, an adhered mask, via computer controlled laser ablation from a scanned laser beam, or the like.

From element 638 the process moves forward to element 640 which calls for the formation of layer "n" which is to contain both a structural material and a sacrificial material. The formation of layer "n" is done in accordance with the derived cross-sectional data from element 624 the formation of layer "n" also involves filling in any holes in layer "n−1" with the structural material. The formation of layer "n" according to step 640 may occur in a variety of ways. For example, the formation of layer "n" may occur by selective deposition of a first material followed by a blanket deposition of the second material and then by the planarization of the two deposited materials. As another example, the formation of layer "n" may occur via a blanket deposition of a first material followed by a planarization operation, followed by a selective etching operation, followed by a blanket deposition operation of a second material and then finally by a planarization operation. It will of course be understood by those of skill in the art, that the layer may also be formed in other ways.

Next the process moves forward to element 642 which calls for incrementing the layer variable "n" by 1. Next, the process moves forward to element 644 which makes the inquiry as to whether or not the layer variable "n" is less than the number associated with the last layer of the structure N. If the answer is "no" the process proceeds to element 648 if the answer is "yes", the process proceeds to element 646. Element 646 calls for the etching of voids into the structural material of layer "n−1" according to the derived pattern of etching holes for layer "n−1" which was obtained from the operation of element 632. From element 646 the process loops back to element 640. The loop of 644 through 646, 640 and 642 continues until the last layer of structure is formed and a "no" response to the inquiry of 644 is obtained. At which point the process moves forward to element 648 which indicates that the layer formation process has been completed. The process then moves forward to element 650 which calls for the removal of the sacrificial material so as to yield the final three-dimensional structure. Element 650 also calls for the performance of any other desired operations. In some embodiments any additional operations may be formed completely, or in part, prior to the release of the three-dimensional structure while in other embodiments any such operations may be performed subsequent to the release. The process then ends at element 652.

Various alternatives to the process depicted in FIG. 22 are possible. For example, some alternatives may start with the cross-sectional data of element 624 as opposed to starting with the three-dimensional data of element 622. In some embodiments, the derivation of cross sectional data, common data, offset data and the derived pattern of etching holes may occur prior to beginning layer formation while in others, they may occur during the process of layer formation. The cross-sectional data of element 624 may in some embodiments be used to generate contact masks prior to the beginning of layer formation while in other embodiments, the data may be used to form tooling (e.g. photomasks) that may be used to derive adhered masks during the process of layer formation. In still other embodiments the data from element 624 may be used to form mask elements from computer controlled processes such as ink jet deposition or laser ablation as the result of relative motion between a laser beam and the surface to be ablated.

In some embodiments the offset data of element 628 may not be necessary and the derived pattern of etching holes of element 632 may be more directly based on the common data of element 626. In some embodiments the etching of voids of element 646 and the formation of layer "n" of element 640 may be intermixed. In such embodiments, for example, it may be possible to deposit a sacrificial material either in bulk or selectively to form part of layer "n" and thereafter etching may be performed to form the holes or a precursor of the holes that will be formed in layer "n−1" and then a subsequent etching operation (if needed) may be used to form the pattern of structural material desired for layer "n". Thereafter, the structural material may be deposited to fill in both the openings in layer n−1 and those in layer n. In still other embodiments, layer "n" may be formed entirely or in part prior to the etching of voids that extend into layer "n−1" after which the created voids may be filled with structural material.

In still further alternative embodiments, more than two materials may be used in the process. In such embodiments one or more of the materials may be made to interlace with the previous layer by etching holes into appropriate locations of previous layers and then filling those holes with appropriate materials. In still other embodiments, the build process may be limited to two materials and both materials may be deposited in such a manner that they interlace with material deposited in association with a previous layer.

In still further embodiments the etching holes may be made to extend to a depth that is greater than a portion of the previous layer thickness such that the interlocking occurs between more than just 2 layers. Such interlacing elements may be termed multi-layer interlacing elements in that they extend from a given layer into at least two additional layers. For example, the etching holes may extend into the "n-2" layer or "n-3" layer, as indicated in FIGS. 21B-21D or even beyond that. In some cases, appropriate data manipulation operations may be performed to ensure that etching holes do not penetrate through outward facing surfaces of a group of structural materials or of a single structural material. In still other embodiments the material that is made to cause interlacing between layers, need not be identical to the surrounding material that is interlaced. In some embodiments, the interlacing of more than two layers may occur in a staggered manner. This staggered interlacing results in interlacing elements existing on a given layer meeting at least two out of three conditions: (1) at least one multi-layer interlacing elements extend from a subsequent layer, through at least one intermediate layer into the given layer, (2) at least one multi-layer element extending from a subsequent layer through the given layer into a previous layer, and/or (3) at least one multi-layer interlacing element extending from the given layer through an intermediate layer to a previous layer.

Multi-layer staggered interlacing regions may be determined in a variety of manners and various priorities established when down-facing or up-facing regions are encountered or alternatively when interlacing elements locations interfere with other interfacing element locations between up-facing and down-facing regions.

For example, in some embodiments, potential interlacing elements may be defined to exist according to a fixed three-dimensional grid of such elements. The location of such elements within a given material of a given build volume is dictated by the intersection of a selected build material or group of build materials relative to the interlacing element positions. Interlacing elements may be defined to exist in those locations where the interlacing elements are located completely within the given material or group of materials. If an interlacing element extends above an up-facing feature, below a down-facing feature, or outside of a horizontal dimension of the material or group of materials, the interlacing element is not formed and associated operations to form it are not implemented.

In some alternative embodiments, interlacing elements that would extend below a down-facing feature may be truncated at the appropriate location within the layer containing the down-facing feature. An interlacing element that the grid would have start above an up-facing feature and extend into the layer below the one containing the up-facing feature, may be shortened so that they start at the bottom of the layer containing the up-facing feature.

In other alternative embodiments, truncated or shortened interlacing elements may be extending their lower portions into one or more layers below an up-facing surface or pushing their starting points up to one or more layers above the layer containing the down-facing surface. In still other embodiments, shortened or truncated interlacing elements may be extend sufficiently so that they merge with any interlacing element below them (in the case of shortening resulting from the presence of an up-facing surface) or above them (in the case of truncation resulting from the presence of a down-facing surface).

In other alternative embodiments, interlacing elements may be defined as existing on a fixed two dimensional gird where down-facing features dictate the layers in which the elements end, and the elements are considered to extend upward through the structure from these down-facing features according to predefined heights and spacings until such a time that an up-facing surface is encountered at which point shorting of the final interlacing element occurs. In other embodiments, instead of starting with down-facing features, up-facing features may act as the starting points while down-facing features dictate the end points. In still other embodiments, interlacing elements may start at both up-facing surfaces and down-facing surfaces, and end points may be determined as a result of interlacing element regions conflicting between the up-facing and down-facing features.

In still other embodiments, horizontal positioning of interlacing elements may be dictated by the geometry of the structure or particular layers of the structure. In some embodiments, a user may define horizontal and/or vertical locations for interlacing elements or starting points for grid locations of interlacing elements. Other alternative interlacing element location defining algorithms will be apparent to those of skill in the art in view of the teaching provided herein.

Figure 23A:
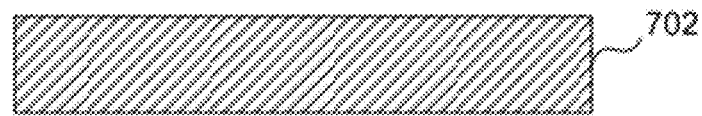
FIGS. 23A-23FF schematically depict side views of a sample structure at various stages of processing according to the flowchart of FIG. 22.
Figure 23B:
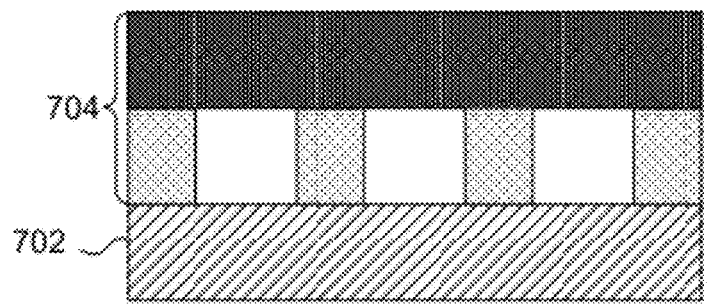
Figure 23C:
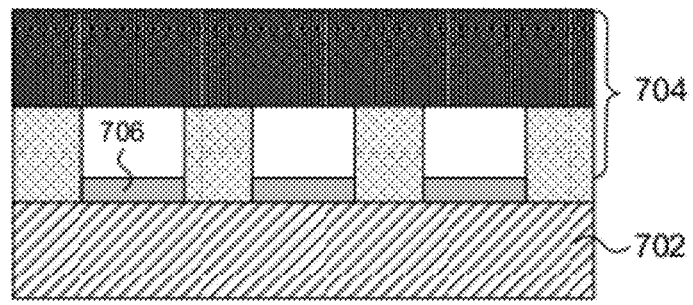
Figure 23D:
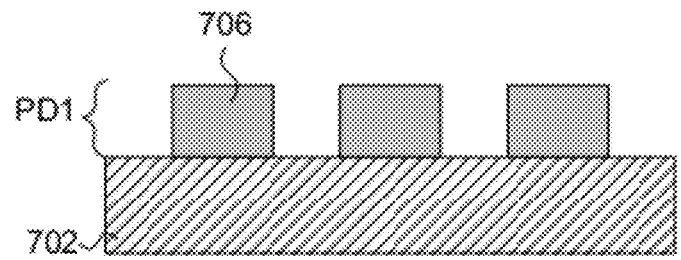
Figure 23E:
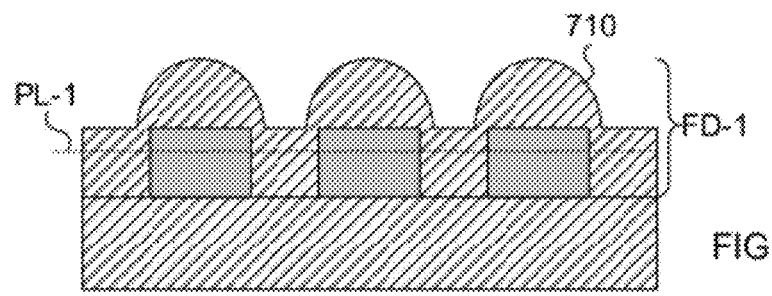
Figure 23F:
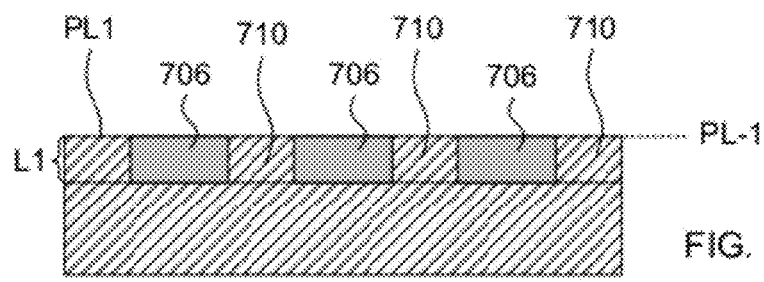

FIGS. 213A-23FF illustrate a structure that may be formed according to one implementation of the process of FIG. 22. FIG. 23A indicates that the process begins with a substrate 702 while FIG. 23B shows that a contact mask 704 is pressed against the substrate 702.

FIG. 23C indicates that a first material 706 is deposited on to the substrate in a selective manner via contact mask 704 while FIG. 23D shows the completed deposition of material 706 after removal of the contact mask 704. The deposited material 706 forms a partially deposited layer PD1.

FIG. 23E depicts the state of the process after a blanket deposition of a second material 710. As indicated, a deposition of both materials 706 and 710 produces thicknesses which equal or exceed the planarization level PL1 for the first layer. As also indicated in FIG. 23E, the deposition of the second material 710 results in a fully deposited first layer FD1.

FIG. 23F shows the state of the process after planarization of the fully deposited first layer FD1 to a desired planarization level PL1 such that the first layer L1 is temporarily completed.

Figure 23G:
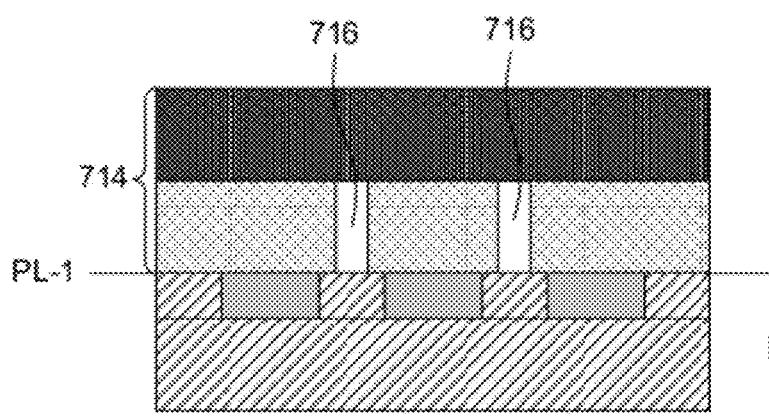

FIG. 23G shows the state of the process after a contact mask 714 has been placed in contact with the surface PL1 of the first layer L1 where the contact mask is patterned to have etching zones 716 located and sized to create voids in the first layer that may be deposited into during formation of the second layer.

Figure 23H:
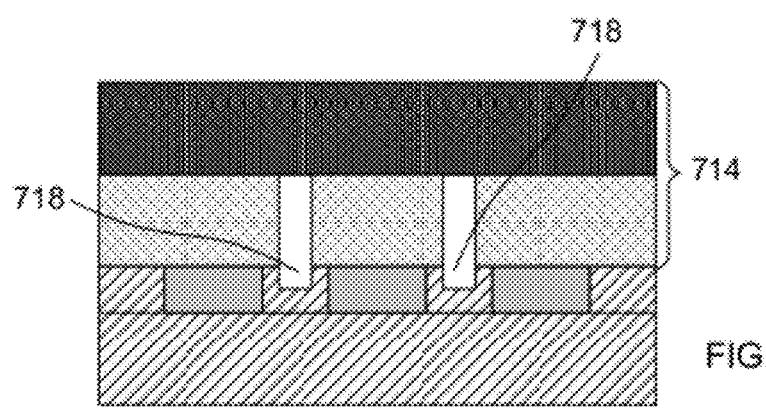

FIG. 23H shows the state of the process after voids 718 have been etched into the surface of the first layer.

Figure 23I:
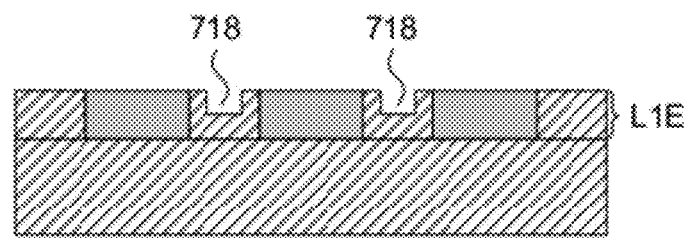

FIG. 23I shows the state of the process after the contact mask FD1 has been removed, such that, an etched first layer L1E is obtained.

Figure 23J:
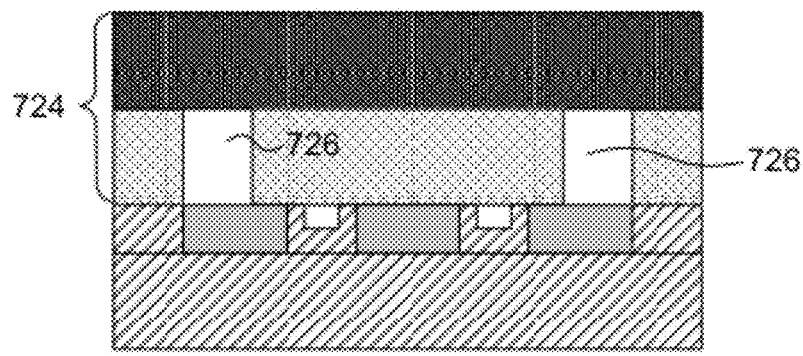

FIG. 23J depicts the state of the process after a contact mask 724 is pressed against the surface of the etched first layer with a pattern of openings 726 that dictate where the first material 706 is to be deposited on the second layer.

Figure 23K:
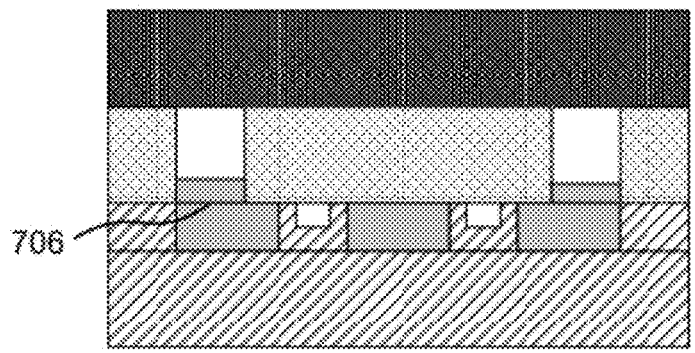

FIG. 23K depicts the state of the process after material 706 has been partially deposited on the second layer.

Figure 23L:
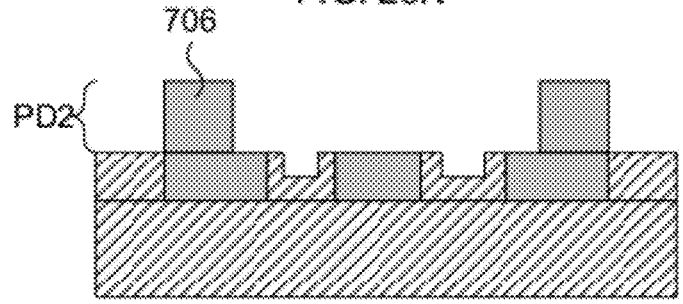

FIG. 23L depicts the state of the process after material 706 has been fully deposited to yield a partially deposited second layer PD2.

Figure 23M:
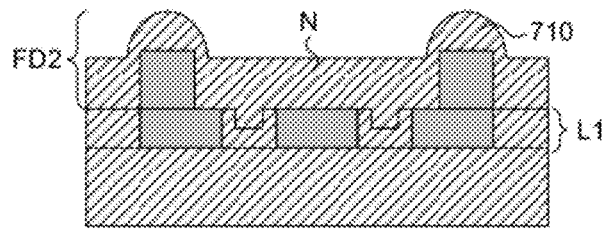

FIG. 23M depicts the state of the process after a blanket deposition of the second material 710 which results in a fully deposited second layer FD2 as well as a permanent completion of the first layer L1 by filling in the voids created in the etching process.

Figure 23N:
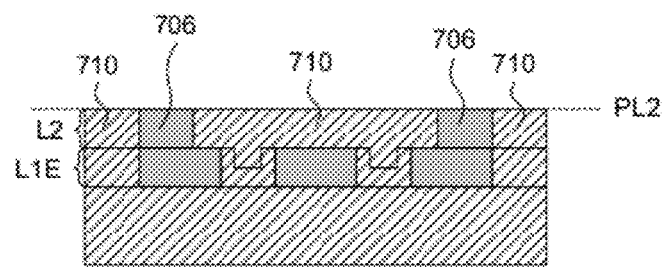

FIG. 23N depicts the state of the process after the second layer L2 is planarized at level PL2.

FIGS. 23O-23V repeat the states of the process for formation of a third layer L3 that are analogous to the states of the process shown in FIGS. 23G-23N, respectively.

Figure 23O:
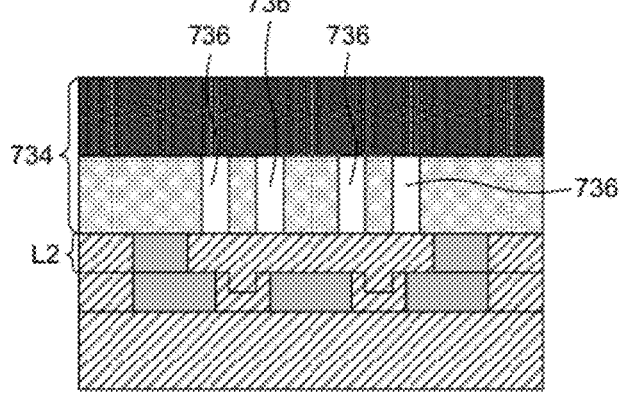
Figure 23P:
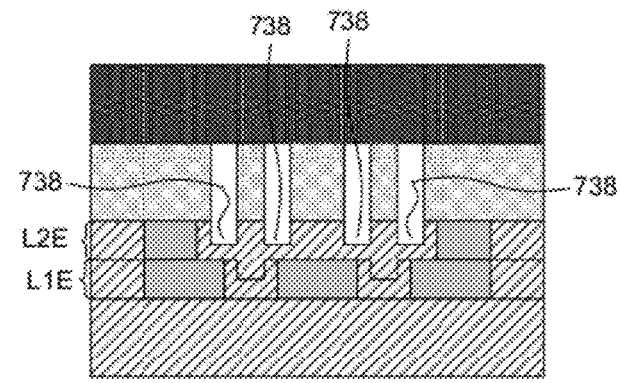
Figure 23Q:
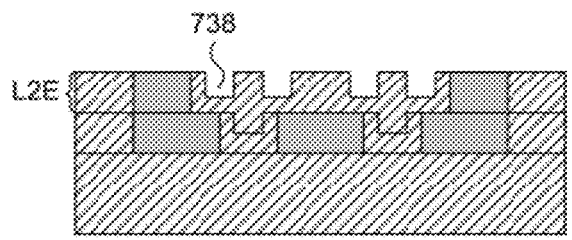
Figure 23R:
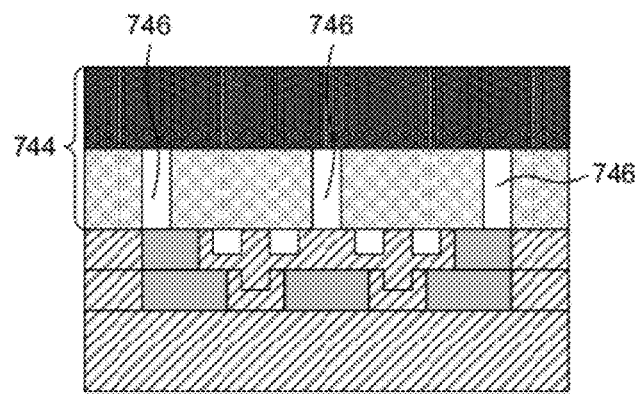
Figure 23S:
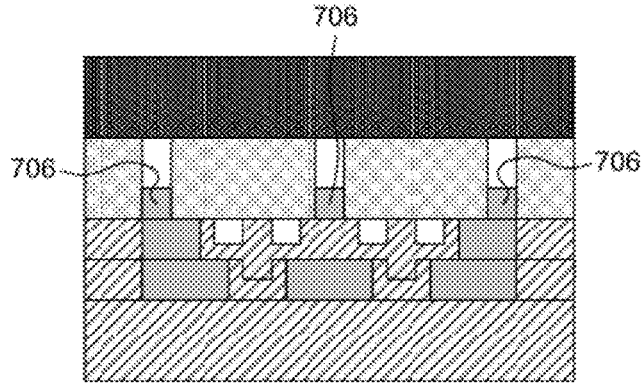
Figure 23T:
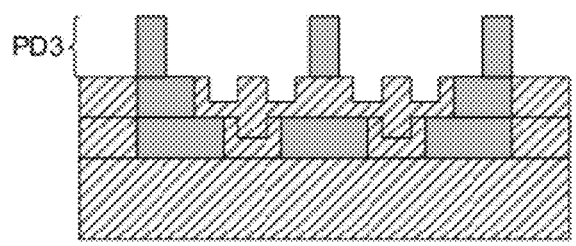

FIG. 23O shows an etching mask 734 pressed against the surface of the second layer L2 where the mask is patterned to have etching regions 736 that may be used to form voids 738 in layer L2 to produce etched layer L2E as shown in FIG. 23P and FIG. 23Q. FIG. 23R shows a mask 744 patterned to have regions 746 which are capable of depositing material 706 onto the surface of the second layer to form a partially deposited third layer PD3.

Figure 23U:
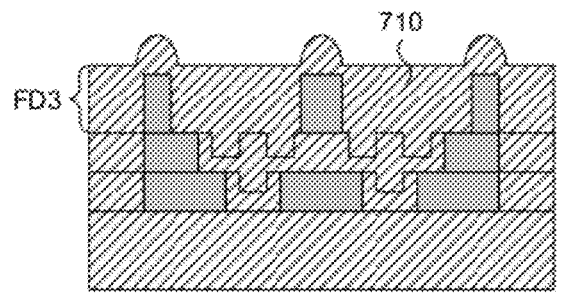
Figure 23V:
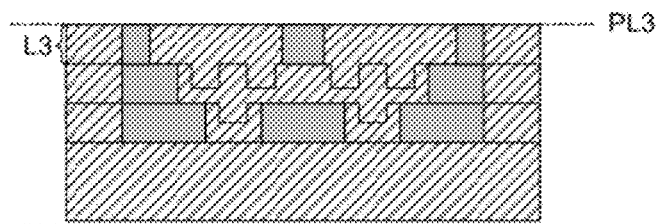

FIG. 23U depicts the state of processing after the blanket deposition of material 710 which forms the fully deposited layer FD3 and FIG. 23V shows a temporarily completed third layer L3 after a planarization operation that trims the surface of the third layer to a level PL3.

Figure 23W:
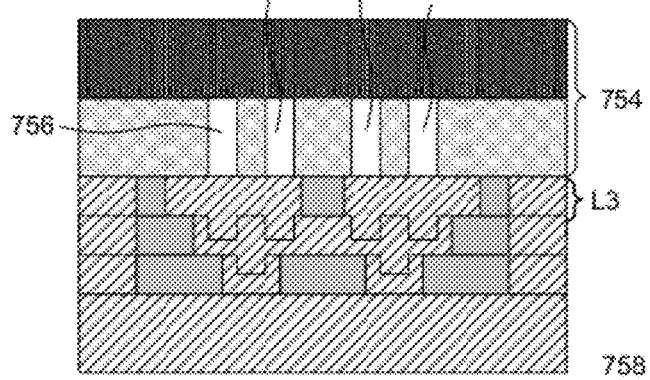
Figure 23X:
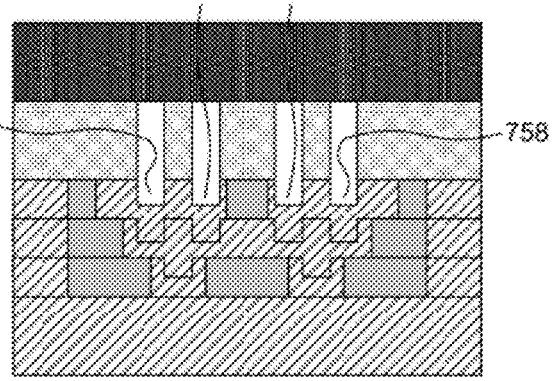
Figure 23Y:
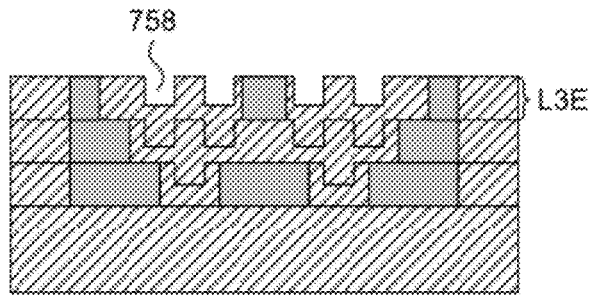

FIGS. 23W-23DD depict analogous states of processing for forming a fourth layer as those shown in FIGS. 23(*o*) through 23(*v*) for the third layer.

In particular, FIG. 23W shows a mask 754 pressed against the surface of the third layer where the mask is patterned to have etching regions 756 which may be used to form voids 758 that penetrate partially into the third layer in locations that would be overlaid by structural material on the fourth layer.

Figure 23Z:
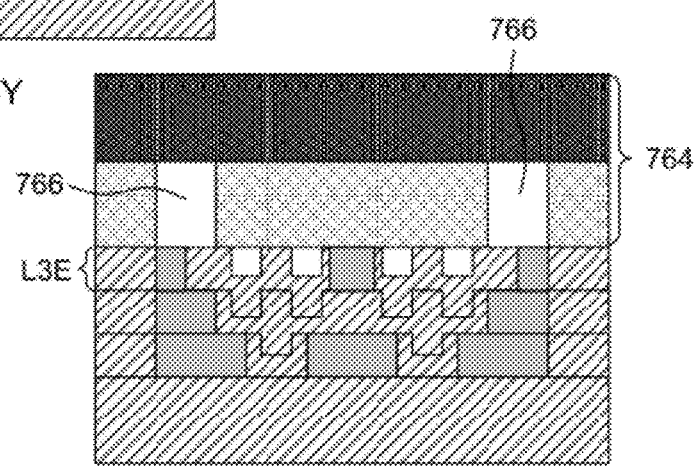
Figure 23A:
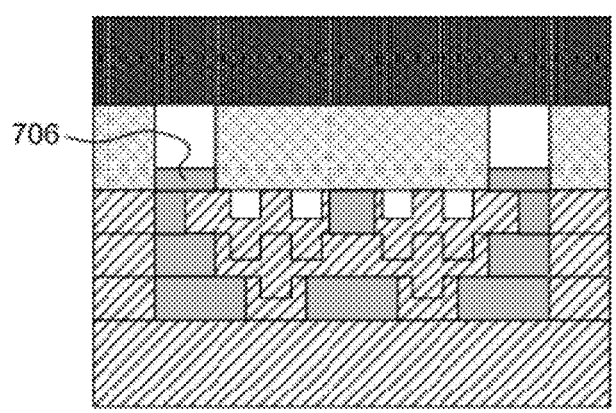
Figure 23B:
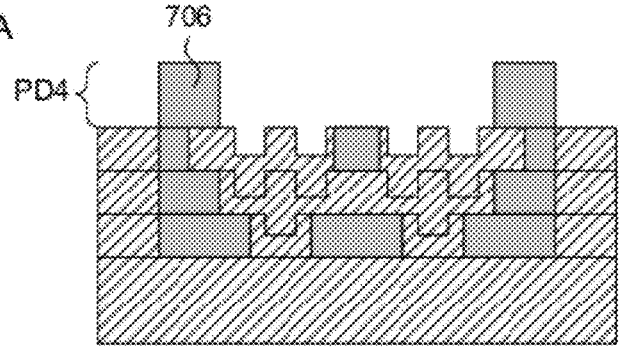
Figure 23C:
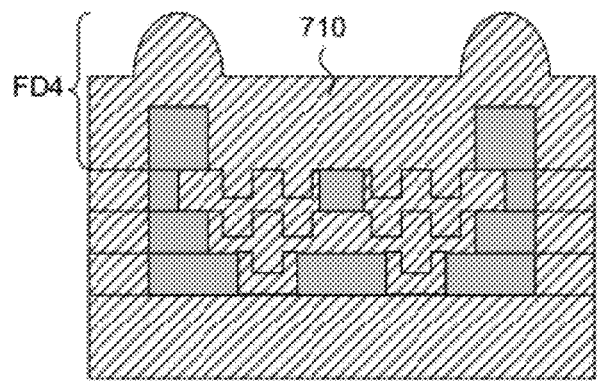
Figure 23D:
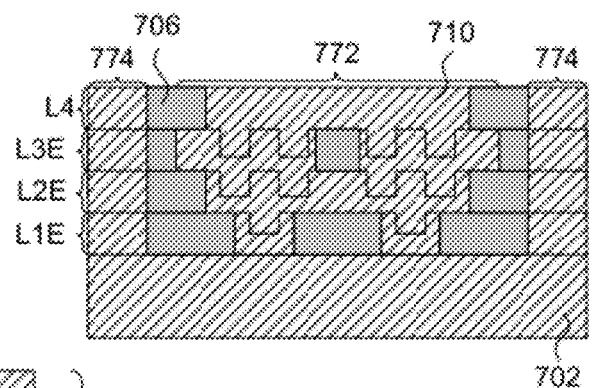
Figure 23E:
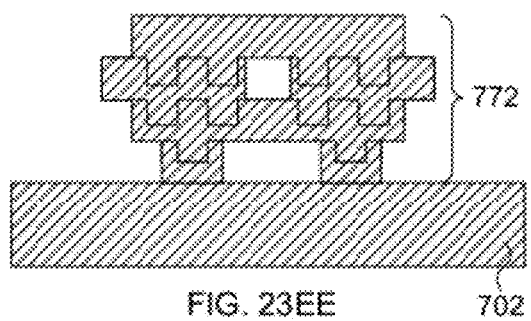
Figure 23F:
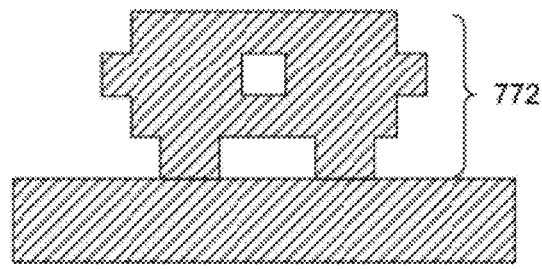

FIG. 23Z depicts a mask 764 pressed against the surface of the etched third layer L3E where the mask is patterned to have locations 766 which may be used to deposit material 706 to desired locations on the surface of the third layer.

FIG. 23BB depicts a state of the process after deposition of material 706 for the fourth layer is completed such that a partially deposited fourth layer is formed.

FIG. 23CC depicts a fully deposited fourth layer FD4 which results from a blanket deposition of material 710.

FIG. 23DD depicts layers 1-4 deposited onto substrate 702 where the 1st-3rd layers are actually layers that had holes etched into them after they were deposited to allow interlocking and where the 4th layer required no such etched holes as the 4th layer was the last layer to be formed. Also indicated in FIG. 23DD the desired structure (e.g. desired object or devise or component) 772 is formed from material 710 and is surrounded by sacrificial material 706 which in turn is surrounded by an outer ring 774 made from material 710. In this embodiment, the outer ring 774 is not part of the desired structure, it is merely an artifact the way masking and depositions were performed. This outer ring of structural material 774 may be removed, for example, by mechanical means or by etching means (which may involve masking or formation of sacrificial material over the structure 772—not shown) after which the sacrificial material 706 may be removed leaving behind the desired structure 772 adhered to the substrate 702 as indicated in FIG. 23EE and FIG. 23FF. FIG. 23EE shows the interlaced deposition patterns of each layer while FIG. 23FF shows the structure with such distinctions removed.

The process and structures of FIGS. 20-23 may be considered to include or involve the formation of multiple layers of material deposited one upon another wherein at least some layers are not formed as completely planar structures wherein at least some layers are etched into at desired locations and wherein material deposited in association with a successive layer fills the etched voids in the previous layer while in the same process receiving material for itself. The structures formed by this process may be considered to be interlaced. In some preferred implementations the material that is etched into is identical to the material that is made to fill the voids while in other implementations the materials may be different. As noted previously in some embodiments the interlacing of layers may be associated with a sacrificial material as well as a structural material or in still other embodiments the interlacing may be limited to sacrificial materials.

In some implementations etching may occur in such a way that side walls (i.e. outward facing portions) of the structural material are formed as a result of filling the created voids but in more preferred implementations the etching is performed so that only internal portions (i.e. portions that do not form exterior surfaces) of structural material are etched on each layer. In some embodiments etching to form interlaces may be performed on the substrate. Such interlacing may provide improved adhesion, electrical conductivity, or thermal conductivity with the substrate.

Numerous alternatives exist as to how layer interconnects (i.e. interlocking voids and protrusions) may be defined and implemented. One such alternative was presented in the flow-chart of FIG. 22 where the data manipulation operations called for interlocked locations to be based on a fixed grid which was matched to an offset common area between successive layers. Other possibilities include, for example: (1) horizontally displacing the interlacing elements between successive layers (i.e. shifting them in the x,y dimensions from layer-to-layer assuming stacking of layers occurs along a z axis), (2) positioning the interlacing elements in aligned locations on successive layers, (3) randomly placing the interlace locations, (4) placing interlacing elements on every layer, (5) placing interlacing elements only on selected layers, (6) having voids penetrate only into a selected structural material, (7)

having voids penetrate into all structural materials or into selected materials, (8) having voids penetrate only internal portions of structural materials as opposed to boundary regions, (9) having voids located at boundary regions or selected boundary regions, or (10) having interlacing element locations based on other types of Boolean comparisons and/or erosion, routines that may take into consideration individual structural materials or combinations of structural materials.

The sizes of interlacing protrusions and associated voids may be implemented in a variety of forms, for example: (1) protrusions may penetrate only part way into a previous layer, (2) protrusions may penetrate completely into a previous layer, (3) protrusions may penetrate into multiple layers (i.e. two or more layers with penetration into all but the last layer being complete and the penetration into the last layer being either complete or partial), (4) the depth of penetration may be limited based on the occurrence of an outward facing feature on a subsequent layer (e.g. a downward facing feature assuming layers are formed one on top of another or an upward facing feature assuming layers are formed below previously formed layers, etc.), (5) the horizontal dimensions of protrusions may be of a fixed size (assuming layer stacking occurs in a vertical direction) which may be relatively small such that multiple protrusions may exist between 2 layers and be spaced horizontally from one another, (6) protrusions may have variable depth or fixed depth, (7) protrusions may be staggered such that for any given layer multi-layer penetration may end on the layer, start on the layer, or extend through the layer from one or more higher layers to one or more lower layers, or (8) The widths and lengths of the protrusions may be variable. In still other embodiments other variations may exist. For example, interlacing protrusions may be formed from one material and may only penetrate into that same material, they may be formed of different materials depending on what they are penetrating into or they may be formed of a single material that penetrates into a different material or materials. In some alternative embodiments, it may be desirable to cause a single etching operation to carve a void into a previous layer that matches the size of the common area or offset area between the previous layer and the current layer.

In some embodiments it is believed that etching into previously deposited materials may occur in such a way that undercutting of the previously deposited material is possible. In cases where such undercutting occurs enhanced interlocking of layers may be achieved. Such an example was described above where depth of voids extends through part of at least two layers and etching of the layers is formed independently such that an undercut may be formed between the bottom of one layer and the top of the previous layer. Another example of such an undercutting etching process is illustrated in FIGS. 24A-24G.

Figure 24A:
FIGS. 24A-24G schematically depict side views of various stages of a process for forming undercuts.

FIG. 24A depicts a side view of a substrate 802 (e.g. a previously deposited layer of structural material) which will be etched into in such a manner that an undercut is formed.

Figure 24B:
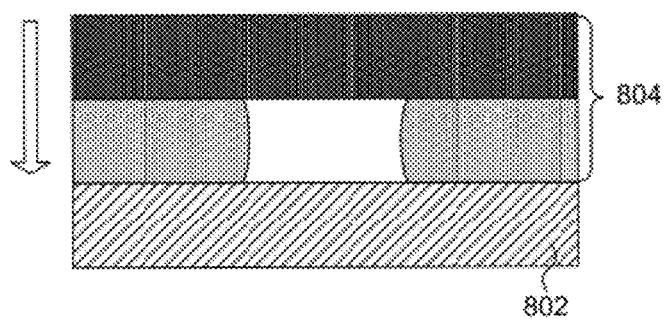

FIG. 24B depicts a conformable contact mask 804 which is pressed against substrate 802.

Figure 24C:
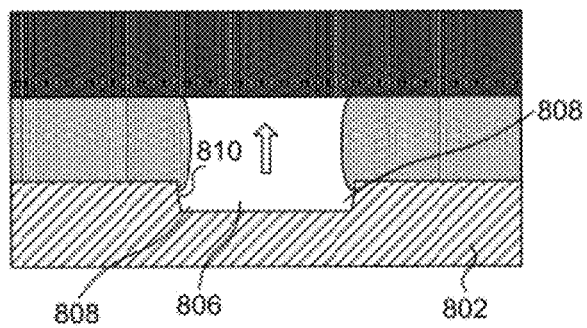

FIG. 24C depicts the etching of the substrate 802 in a selective manner using the mask 804 where the void 806 being formed begins to undercut the mask in regions 808 and portions of the mask 810 begin to collapse into the void 806.

Figure 24D:
Figure 24:
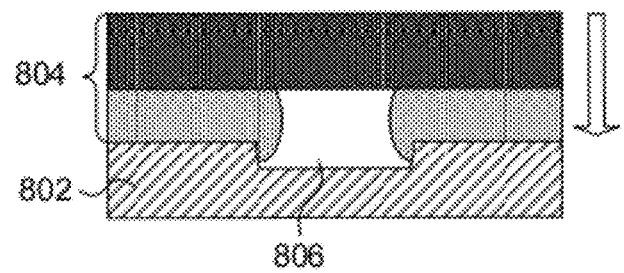
Figure 24:
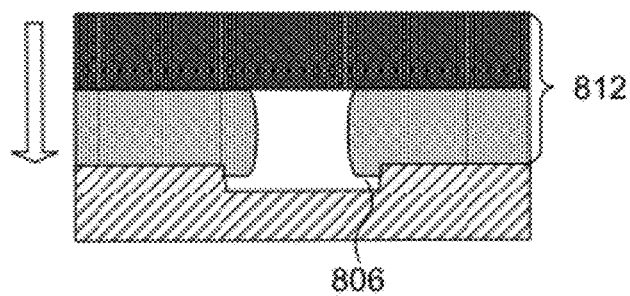

FIG. 24D shows the partially etched substrate with the mask 804 removed.

Figure 24F:
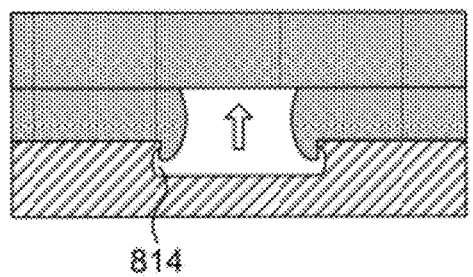

FIG. 24E1 and FIG. 24E2 depict two alternative paths for obtaining an undercut of the material being etched into. In FIG. 24E1 the original conformable contact mask conforms into the void further as deeper etching occurs as the conformable mask wraps around the side walls of the etched region 806 thereby causing reduced etching at the surrounded side walls. This reduced etching can result in an undercut effect as shown in FIG. 24F. In FIG. 24E2, a mask 812 with a reduced opening is pressed against the partially etched surface of FIG. 24D such that the mask partially collapses or conforms to the void 806 that is being formed. Whereby the presence of the mask material slows the etching rate of the side walls near the upper surface of the side walls such that the undercutting depicted in FIG. 24F occurs.

Figure 24G:

FIG. 24G shows the undercut 814 of substrate 802 that resulted from the use of a conformable contact mask with sufficient conformability or sufficient applied mating pressure, or by using first and second masks where the second mask is sized to cause more significant overlap of the mask material with the side walls of the substrate.

It is believed that for shallow etching depths (e.g. 1-10 microns) relative to the width of etching (e.g. 10-100+microns) the vertical etching rate will be greater than the horizontal etching rate where it is assumed that the vertical direction is perpendicular to the plane of the mask and the substrate and that the horizontal dimensions are parallel to the plane of the mask and the substrate.

It is believed that this apparent rate difference will decrease as the depth of etching increases. It is also believed that the apparent rate difference may result from one or more of: (1) relatively narrow horizontal etching paths as compared to the width of the vertical etching path, (2) as horizontal etching occurs from the surface of the substrate, initial etching removal of material will cause a conformable contact material (e.g. an elastomeric material) to collapse into the void, thus sealing or at least narrowing the flow path, and/or (3) surface charge density may be less on the side than on the bottom of the etching region. It is believed that even if a non conformable mask or adhered mask is used, effects from sources (1) and (3) may still lead to reduced horizontal etching rates. It is further believed that such relatively reduced horizontal etching rates can lead to the desired undercut effect illustrated in FIG. 24F and FIG. 24G.

FIGS. 25A-25D depict an alternative method for obtaining undercuts. Such undercuts may be useful in forming structures with enhanced layer to layer adhesion. In this alternative approach a barrier of a non etchable material is located around, at least a portion of a perimeter of a region that is to be etched and undercut. Due to the presence of the barrier, etching can only occur downward until the lower portion of the barrier is reached, at which point undercutting begins to occur. The extent of the etching is preferably less than that which would allow the undercut to completely remove the material from underneath the entire barrier.

Figure 25A:
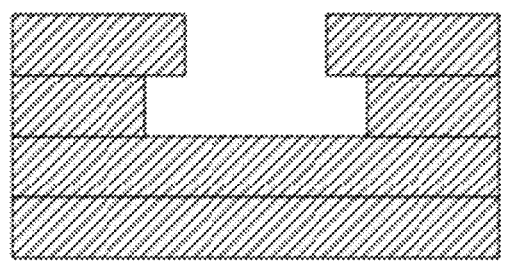
FIGS. 25A-25D schematically depict side views of an alternative process for obtaining undercuts.

FIG. 25A depicts a desired undercut structure.

Figure 25B:
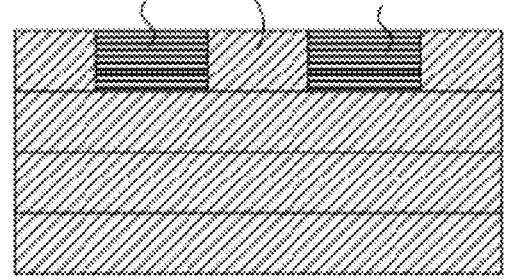

FIG. 25B depicts a structure where a barrier material is made to exist on the uppermost layer such that the barrier material 822 surrounds a region 824 that is to be etched.

Figure 25C:
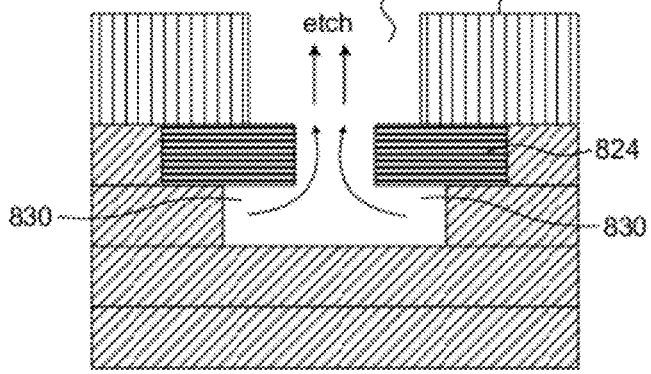

FIG. 25C depicts a mask 826 which contacts the barrier 824 and forms a pocket 828 through which etching of material can occur. As etching occurs, undercuts 830 appear.

Figure 25D:
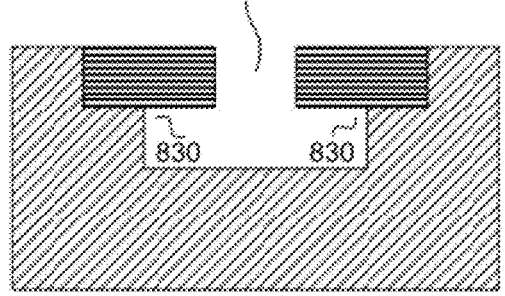

FIG. 25D depicts an etched opening 832 having undercuts 830 which may be useful in improving layer to layer adhesion when a subsequent layer is formed and material deposited into the void 832 and undercut region 830. In some embodiments the barrier material may not have a thickness equal to the layer thickness but instead may be thinner, for example, by etching a shallow opening into the last formed layer and then depositing the barrier material into the opening and then planarizing the surface into a desired level. In an alternative embodiment, if the barrier material is made to exist every-where on the surface of the last formed layer with the exception of those areas to be etched. A non selective etching operation may be performed (assuming the non selective etch does not attack the barrier material).

Figure 26:
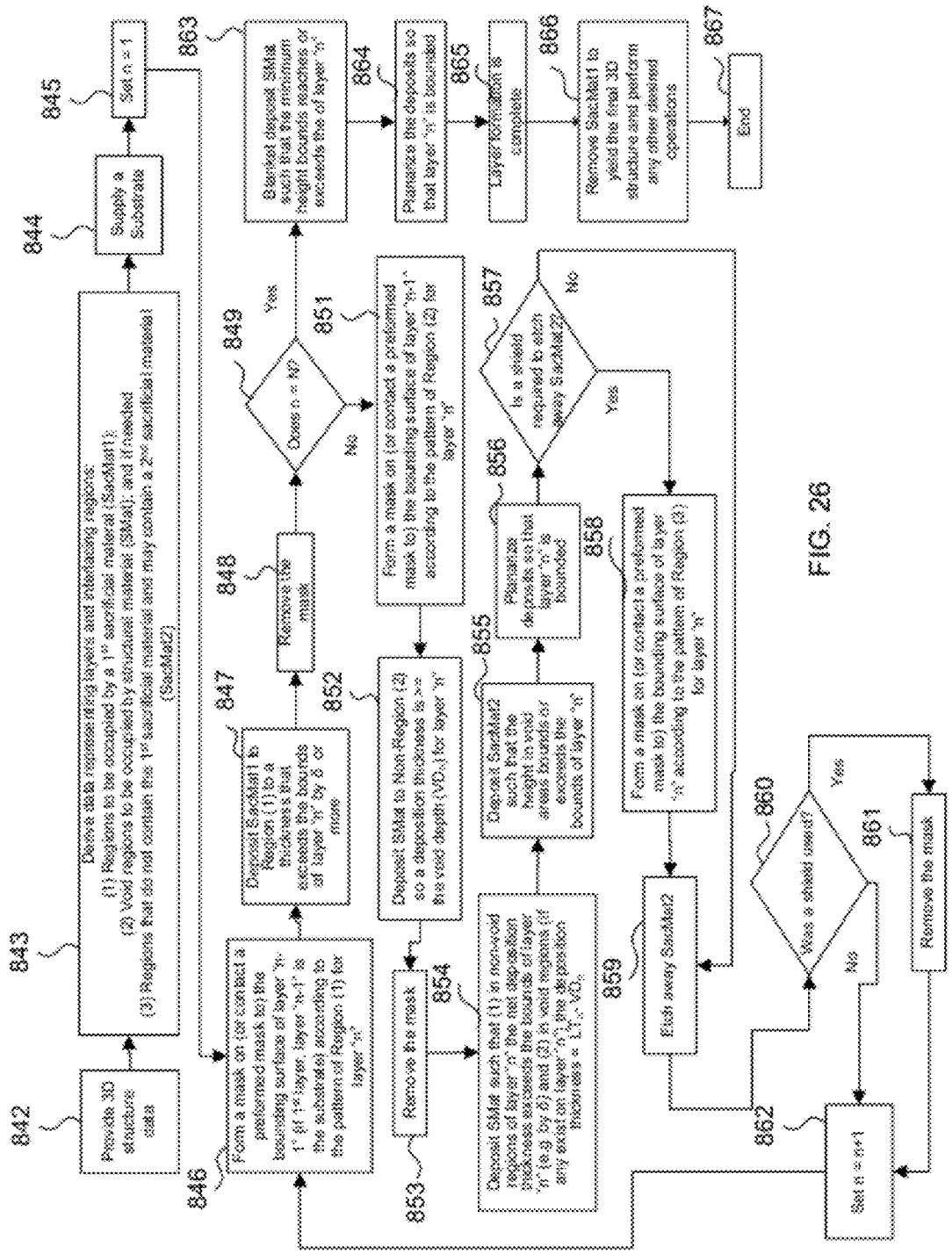
FIG. 26 provides a flowchart of an alternative embodiment of some aspects of the invention where partial layer interlacing of layers is achieved.

FIG. 26 provides a flowchart of an alternative embodiment of some aspects of the invention where partial layer interlacing is achieved. In partial layer interlacing, interlacing elements are formed in association with a given layer and they extend into a previous layer by an amount that only extends part way through the thickness of the previous layer. In this alternative embodiment a void formed in an immediately proceeding layer is initially filled with a sacrificial material which may or may not be the same as a sacrificial material used elsewhere during formation of the structure. The filling of voids with the sacrificial material aids in the planarization of layers after which the sacrificial material may be removed in preparation for deposition of structural material in association with an immediately succeeding layer. Whether the void-filling sacrificial material is the same or different from other sacrificial material used, when it comes time to etch the void-filling sacrificial material the etching process used may be of a selective nature, of a non-selective nature, or of something intermediate thereto. In this embodiment selective depositions of both a sacrificial material and a structural material occur, while the only etching operations used involve the etching of the void-filling sacrificial material from a region that is completely bounded by structural material. In some embodiments it may not be necessary to protect the non-void-filling sacrificial material even though it may be attacked by the etching process that clears the voids since the damage done to the non-void-filling sacrificial material may be of a minimal nature or since the order of processing or the geometry of the subsequent layer may be such that the damage to the non-void-filling sacrificial material may be repaired without impacting the structure being formed in a negative manner. In the present embodiment, the process also uses a two-stage deposition process of structural material where the first deposition of structural material occurs in a selective manner such that regions that will contain voids are shielded by a mask while the second deposition is performed in a blanket manner such that a height of deposition in the regions that will contain voids is controlled resulting in the depth of voids being appropriately controlled. In some alternative embodiments the blanket deposition may occur first and the selective deposition may occur second.

The process depicted in the flowchart of FIG. 26 begins with element 842 which calls for providing three-dimensional data representing the structure to be formed. The process then moves forward to element 843 which calls for the derivation of data representing layers and interlacing regions, in particular three data regions are to be derived.

Region 1 defines those regions that will be occupied by a first sacrificial material (SacMat1). Region 1 for a given layer may be defined from a Boolean subtraction operation where the regions of the structure are subtracted from a build area that is pre-defined.

A second region (Region 2) defines those regions in a given layer that are to be occupied by structural material (SMat) but which do not include interlacing elements that extend from a subsequent layer into the given layer. Region 2 may be looked at in a different way; it may be considered to be those regions of a given layer that are not occupied by the first sacrificial material or a second void-filling sacrificial material (SacMat2). Region 2 may also be looked at as the region that will contain voids that will be filled in conjunction with a deposition operation associated with the formation of a subsequent layer.

The third region (Region 3) may be defined in different ways depending on how the definition is chosen. Region 3 may encompass varying areas. The minimum extent Region 3 defines are the areas occupied by the second sacrificial material while the maximum extent Region 3 defines is the union of the region containing the second sacrificial material with the regions containing structural material (Region 2). Other definitions of Region 3 may define intermediate areas such as those that result from a combination of regions that contain second sacrificial material with regions of structural material that have been eroded down, such that their areas are smaller. In some alternative embodiments it may be acceptable to define the Region 3 areas such that they are located in regions of the second sacrificial material but are smaller than the extents of those regions. These various definitions of Region 3 are possible in that the primary use of the data associated with Region 3 will be to define shielding masks or the like that will be used to protect the first sacrificial material from attack during the etching of the second sacrificial material. In embodiments where the etchant or the etching process is not sufficiently selective it may be required that a more strict definition of Region 3 be used (i.e. where Region 3 is defined precisely as the region containing the second sacrificial material).

From element 843 the process moves forward to element 844 which calls for the supplying of a substrate. From there the process moves forward to element 845 which calls for the setting of a layer number variable "n" to a value of one.

Next the process moves to element 846 which calls for the formation of a mask on the bounding surface of the previous layer (layer "n−1") or the contacting of a preformed mask of desired patterning to that bounding surface. If "n" equals 1 then layer "n−1" is the substrate. The patterning of the mask of this element is such that region 1 areas for layer "n" are exposed while all other regions of layer "n" are shielded.

The process then proceeds to element 847 which calls for the deposition of the first sacrificial material to Region 1 areas where the thickness of deposition exceeds the bounds of layer "n" by preferably an amount δ or more. In some embodiments it may be possible to set the deposition thickness to exactly the bounds of layer "n". However, in most embodiments it is preferred that an additional incremental amount δ be used to accommodate for tolerancing errors and the like.

After the deposition of element 847 the process moves forward to element 848 which calls for the removal of the mask. The process then moves forward to element 849 which makes an inquiry as to whether "n" is equal to "N" where "N" represents the number of the last layer of the structure to be formed. If the answer to this inquiry is "yes", the process moves forward to element 863 which calls for the blanket deposition of the structural material such that a minimum height of deposition across the entire layer bounds or exceeds the bounds of layer "n". From element 863 the process moves forward to element 864 which calls for the planarization of the deposits on layer "n" to a level that bounds layer "n". The process then moves forward to element 865 which indicates the layer formation process is complete and then moves forward to element 866 which calls for removal of the first sacrificial material and the performance of any other desired operations. Finally the process ends at element 867.

Turning back to element 849 if the answer to the inquiry is "no", it means that the structure formation is not yet complete and that additional layers of structure must be added. In this case the process moves forward to element 851 which calls for the formation of a mask on the bounding surface of layer "n−1" according to the pattern of Region 2 for layer "n". Alternatively a preformed mask may be contacted to the surface of layer "n−1". The formed or applied mask shields Region 2 areas while leaving exposed all other regions of the layer. It may be noted that though element 847 called for the deposition of the first sacrificial material onto layer "n−1" element 851 calls for the formation or application of a mask to that same surface. This dual reference to that surface is possible in that the deposition of element 847 occurs at different locations than the area masked according to operation 851. After the mask formation of element 851 is completed the process moves forward to element 852 which calls for the deposition of structural material to non Region 2 areas such that the deposition thickness is greater than or equal to the void depth (vdn) for layer "n". After this deposition operation the process moves forward to element 853 which calls for the removal of the mask. The process then moves forward to element 854 which calls for the blanket deposition of structural material such that in non-void regions (i.e. Region 2) of layer "n" the net deposition thickness exceeds the bounds of layer "n" preferably by an incremental amount δ while in void regions (i.e. non Region 2 areas) the deposition thickness is set to be below the bounds of layer "n" by the void depth.

Next the process moves forward to element 855 which calls for deposition of a second sacrificial material such that the height in void areas bounds or exceeds the bounds of layer "n". It may be noted that the height in non void areas already exceeded the bounds of layer "n" and as such the location of the second sacrificial material within layer "n" only exists in what will be the void areas.

Next the process moves to element 856 which calls for the planarization of the deposits such that layer "n" is bounded.

In some alternative embodiments an additional inquiry could have been located between elements 849 and 851. This additional inquiry may have questioned whether or not the given layer included void regions. If it was concluded that void regions existed the process could proceed as already described with element 851. However, if the result of the inquiry was that no void regions existed the process could have jumped from element 849 to element 856 with only the insertion of a blanket deposition operation that would deposit structural material to a minimum height that bounds or exceeds the bounds of layer "n".

From element 856 the process moves forward to element 857 which inquires as to whether or not a shield is required when etching away the second sacrificial material. If the answer is "no", the process moves to element 859 whereas if the answer is "yes", the process moves forward to element 858 and then to element 859.

Element 858 calls for the formation of a mask on the bounding surface of layer "n" according to the pattern of Region 3 where at least regions of the first sacrificial material are shielded and regions of the second sacrificial material are exposed. Alternatively this element calls for the contacting of a preformed mask to the bounding surface. From element 858 the process moves forward to element 859 which calls for the etching away of the second sacrificial material.

Next the process moves forward to element 860. In this element an inquiry is made as to whether a shield was used in performance of the etching operation of element 859. If the answer is "no", the process moves forward to element 862 whereas if the answer was "yes", the process moves forward to element 861 which calls for the removal of a mask, and then the process moves forward to element 862.

Element 862 calls for the incrementing of the value of variable "n" to a value of "n+1". From element 862 the process loops back to element 846. The process continues looping through the various elements 846 through 862 until the final layer of structure is reached at which point element 849 redirects the process to element 863 as already discussed.

In addition to the alternative embodiments mentioned above in association with FIG. 26 numerous other alternative embodiments are possible and will be apparent to those of skill in the art upon reviewing the teachings herein for this embodiment as well as for the other embodiments presented herein.

Figure 27A:
FIGS. 27A-27CC schematically depict side views of various states of the process of the flowchart of FIG. 26 as applied to a sample three layer structure.
Figure 27B:
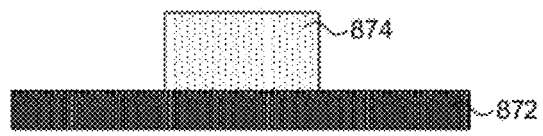
Figure 27C:
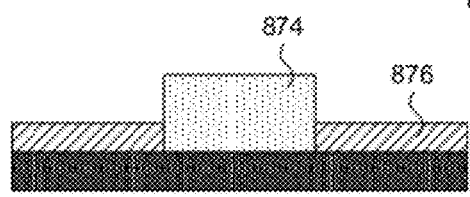

FIGS. 27A-27CC depict schematic representations of side views of various states of the process of FIG. 26 as applied to a 3 layer structure.

FIG. 27A depicts the state of the process after element 844 of FIG. 26 has supplied a substrate 872.

FIG. 27B depicts the state of the process after element 846 of FIG. 26 forms or contacts a mask 874 to the bounding surface of the substrate 872.

FIG. 27C depicts the state of the process after a first sacrificial material 876 is deposited according to element 847 of FIG. 26.

Figure 27D:

FIG. 27D depicts the state of the process after removal of the mask as called for in element 848 of FIG. 26.

Figure 27E:
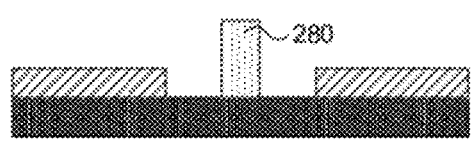

FIG. 27E depicts the state of the process after formation of a mask or the contacting of a mask 280 according to element 851 of FIG. 26.

Figure 27F:
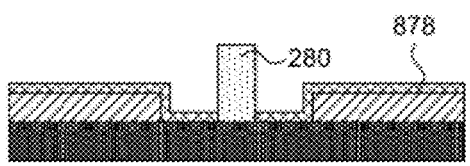

FIG. 27F depicts the state of the process after element 852 of FIG. 26 results in the deposition of structural material 878 to regions not shielded by the mask 280.

Figure 27G:
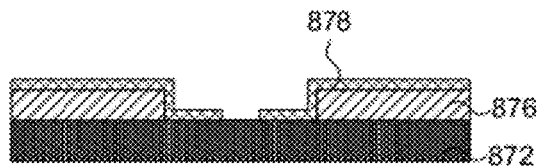

FIG. 27G depicts the state of the process after element 853 of FIG. 26 calls for the removal of the mask 280.

Figure 27H:
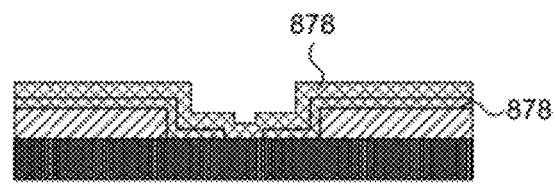
Figure 27I:
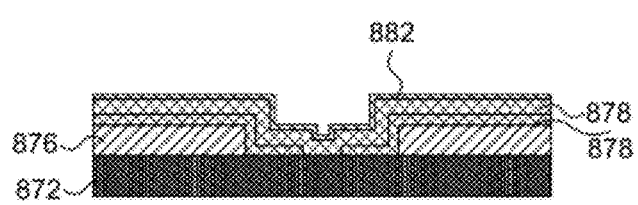

FIG. 27H depicts the state of the process after performance of element 854 results in a second deposition of structural material 878. While FIG. 27I shows the state of the process after performance of the operation of element 855 of FIG. 26 results in the definition of a second sacrificial material 882.

Figure 27J:

FIG. 27J depicts the state of the process after performance of the planarization operation of element 856 trims the deposits so that their surface bounds layer "n". In FIG. 27J as in FIG. 27H and FIG. 27I the two deposits of structural material are shown as separate entities.

Figure 27K:

FIG. 27K depicts the same state of the process as shown in FIG. 27J with the exception that the 2 deposits of structural material are shown as a single entity.

Figure 27L:

FIG. 27L depicts the state of the process after performance of an operation according to element 859 and possibly after performance of the operation of element 861 depending on whether or not a mask was used in performing the etching operation of element 859.

Figure 27M:
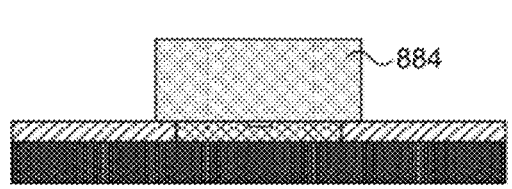

FIG. 27M depicts the state of the process after looping back and completing the masking operation of element 846 whereby a mask 884 shields the regions of a second layer that are not to receive a first sacrificial material.

Figure 27N:
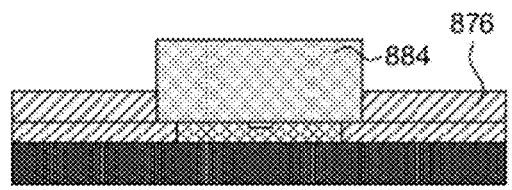

FIG. 27N depicts the state of the process after performance of the sacrificial material deposition operation of element 847.

Figure 27O:

FIG. 27O depicts the state of the process after performance of the mask removal operation of element 848 of FIG. 26.

Figure 27P:
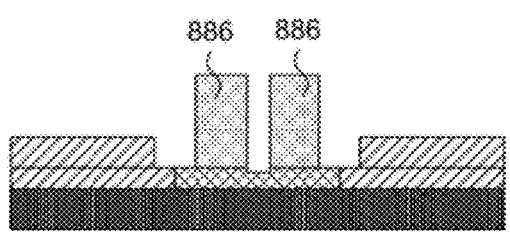

FIG. 27P depicts the state of the process after performance of the masking operation of element 851 results in a mask 886 shielding the void regions that are associated with the second layer.

Figure 27Q:
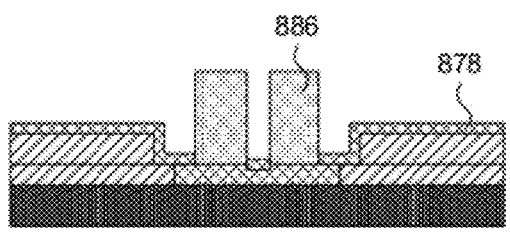

FIG. 27Q depicts that state of the process after operation of the structural material deposition of element 852 of FIG. 26.

Figure 27R:
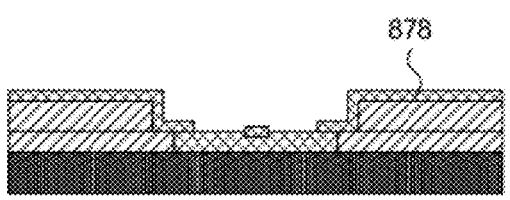

FIG. 27R depicts the state of the process after the removal operation of element 853 of FIG. 26 is completed.

Figure 27S:
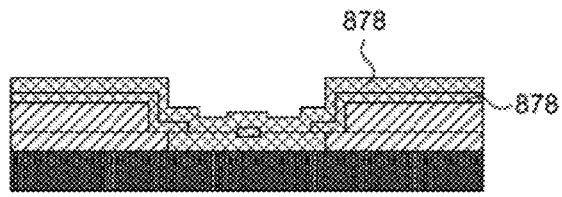

FIG. 27S depicts the state of the process after the second structural material deposition operation of element 854 of FIG. 26 is completed.

Figure 27T:
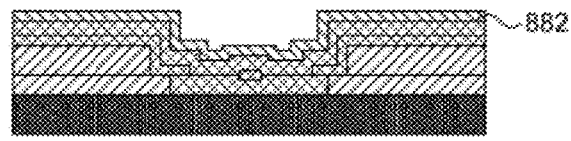

FIG. 27T depicts the state of the process after deposition of the second sacrificial material according to element 855 of FIG. 26 is completed.

Figure 27U:
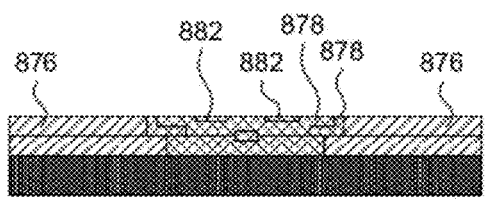

FIG. 27U depicts the state of the process after the planarization operation of element 856 of FIG. 26 trims the material level to the bounding level of the second layer.

In FIGS. 27Q-27U the first and second deposits of structural material associated with the second layer are shown as distinct entities.

Figure 27V:

FIG. 27V depicts the resulting depositions associated with the second layer as a single entity.

Figure 27W:

FIG. 27W depicts the state of the process after the etching operation of element 859 is complete and possibly after the removal of the mask of element 861 is complete, depending upon whether a mask was used in the performance of the operation or not. FIG. 27W depicts the partially formed second layer which is ready for receiving the third level of material and associated interlacing elements that will extend partway into the second layer.

Figure 27X:
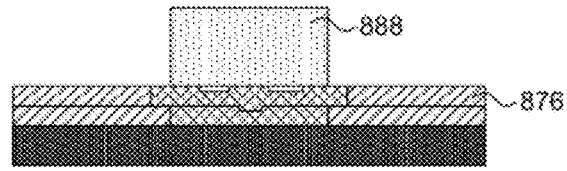

FIG. 27X depicts the state of the process after looping back and completing the operation of element 846 whereby a mask 888 is formed on the second layer that shields those portions of the third layer that are not to receive the first sacrificial material.

FIG. 27Y depicts the state of the process after the operation of element 847 deposits the first sacrificial material onto the third layer.

FIG. 27Z depicts the state of the process after removal of a mask as called for by operation 848. As the third layer is the last layer of the structure to be formed, the inquiry of element 849 of FIG. 26 directs the process away from element 851 and to element 863.

FIG. 27AA calls for the deposition of structural material such that a minimum height is achieved that bounds or exceeds the bounds of layer "n" as called for by element 863 of FIG. 26.

FIG. 27BB depicts a state of the process after the planarization of element 864 of FIG. 26 trims the deposits to a level that bounds the third layer.

Finally, FIG. 27CC shows the state of the process after removal of the first sacrificial material occurs such that the structure 890 is released.

In studying the above example of the process of FIG. 26 it may be seen that the actual interlacing elements formed are somewhat narrower than the areas defined by Region 2. This is a result of the first structural material deposition operation associated with each layer being the selective deposition and the second structural material deposition operation being the blanket deposition. If the order of these operations is reversed the width of the interlacing elements will more closely match the width of the areas defined by Region 2. As such, prior to defining the areas associated with Region 2, in some embodiments it may be beneficial to consider the build process beforehand so that appropriate adjustments to region size may be made.

Figure 28A:
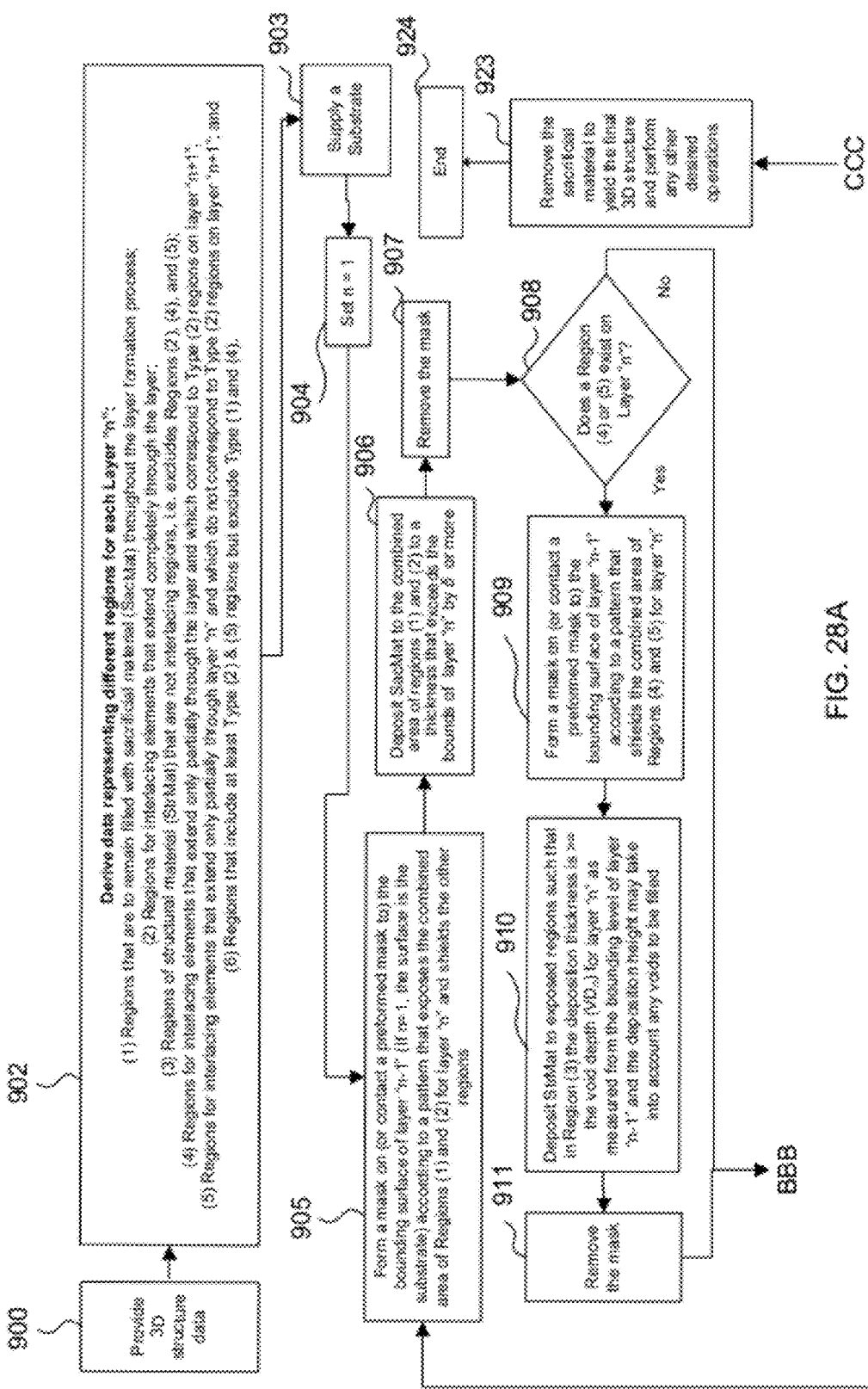
FIGS. 28A-28B provide a flowchart for forming three-dimensional structures from a plurality of adhered layers wherein interlacing elements extend into multiple layers.
Figure 28B:
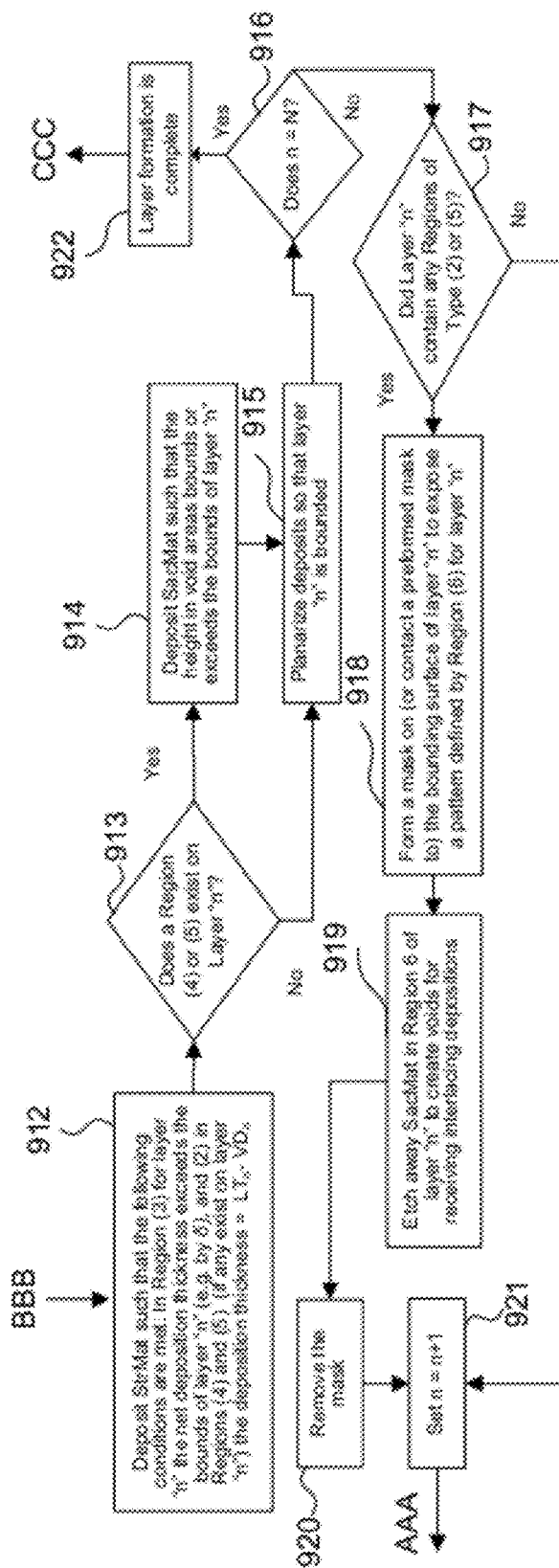

FIG. 28 provides a flowchart of another embodiment for forming a three-dimensional structure from a plurality of adhered layers wherein multi-layer interlacing is achieved. In multi-layer interlacing elements extend from a given layer to a previously formed layer with at least one intermediate layer located there between. More particularly in this embodiment the interlacing elements are formed in a staggered manner such that for a given layer some interlacing elements may extend from that layer into at least two previously formed layers while other interlacing elements may begin on a layer above the present layer and extend into a layer immediately proceeding the present layer while still other interlacing elements may extend from at least one subsequent layer which is separated from the present layer by at least one intermediate layer and where the interlacing element ends on the present layer. Furthermore, in this embodiment, locations for interlacing elements are initially filled with a sacrificial material that is the same as the sacrificial material used elsewhere during the layer formation process. Furthermore, when creating voids in preparation for forming interlacing elements a mask is used to shield regions of sacrificial material that are not to be etched into. The process of FIG. 28 begins with element 900 which calls for providing data representing a three-dimensional structure to be formed.

From element 900 the process moves forward to element 902 which calls for the derivation of data representing different regions for each layer "n" of the structure and its surrounding build volume. In particular in this embodiment 6 regions are defined. It should be understood that in other embodiments other region definitions may be used.

A first region (Region 1) defines areas of the layer that are to be occupied by sacrificial material (SacMat) throughout the layer formation process. In other words Region 1 defines regions that are normally considered to be non structural regions.

A second region (Region 2) defines areas of the layer that are to be occupied by interlacing elements that extend completely through the layer. As the present embodiment prefers to use interlacing elements that extend in length by more than one layer thickness but less than two layer thicknesses, this Region 2 defines those portions of interlacing elements that extend into a previous layer and that are formed in association with layer "n+1".

A third region (Region 3) defines areas on layer "n" that are to be occupied by a structural material (StrMat) exclusive of interlacing regions that will be occupied by structural material during some phase of the layer formation process. In other words, Region 3 excludes regions that form part of Region 2 and also Regions 4 and 5 to be discussed next.

A fourth region (Region 4) defines areas on layer "n" where interlacing elements will exist where these interlacing elements extend only partially through layer "n" and furthermore, where these area elements correspond to type 2 regions that exist on layer "n+1". In other words, Region 4 areas define those interlacing elements whose regions are in part defined on the present layer but whose regions will be further defined in association with layer "n+1".

A fifth region (Region 5) defines areas on layer "n" that will include interlacing elements which extend only partially through the layer "n" and which do not have a corresponding type 2 region on layer "n+1". In other words, Region 5 areas define interlacing elements that cannot be formed to their desired height but instead must be truncated as a result of their being unable to extend completely through layer "n+1". This truncation may result from the fact that the next subsequent layer to be formed, layer "n+1", defines an outward facing surface of the structure in the Region 5 areas.

A sixth and last region (Region 6) defines areas on layer "n" that include at least the type 2 and type 5 regions but exclude at least the type 1 and type 4 regions. In other words, the type 6 regions include at least the type 2 and 5 regions and may include part or all of the type 3 regions.

From element 902 the process moves forward to element 903 which calls for the supplying of a substrate onto which layers may be formed. From element 903 the process moves forward to element 904 which calls for setting a layer number variable "n" to a value of 1. From element 904 the process moves forward to element 905.

Element 905 calls for the formation of a mask on the bounding surface of layer "n−1", or the contacting of a preformed mask to that surface. As the present layer is the first layer, layer "n−1" is the substrate itself. The mask of element 905 is patterned such that the combined area of regions 1 and 2 are exposed and the other regions are shielded. From element 905 the process moves forward to element 906.

Element 906 calls for the deposition of sacrificial material to the areas exposed by the mask applied in element 905. The thickness of deposition is set so that the bounds of layer "n" are met and preferably exceeded by an incremental amount δ or more. Moving forward to element 907, the removal of the mask is called for.

Element 908 inquires as to whether or not a region 4 or region 5 area exists on layer "n". If the answer is "no", the process jumps forward to element 912. If the answer is "yes", however, the process moves forward to element 909.

Element 909 calls for the formation of a mask on the bounding surface of layer "n−1" according to a pattern that shields the combined areas of regions 4 and 5 that exist on layer "n". The other regions of the layer are exposed and can receive a deposition. After formation of the mask, the process moves forward to element 910 which calls for the deposition of a structural material to the exposed regions such that in Region 3 the deposition thickness will be greater than or equal to the void depth (vdn) for layer "n" as measured from the bounding level of layer "n−1". The actual deposition height may take into account any voids that must be filled. Next the process moves forward to element 911 which calls for removal of the mask.

From element 911 or from a "no" response to the inquiry of element 908 the process moves forward to element 912. Element 912 calls for a second deposition of structural material such that two conditions are met. In Region 3 for layer "n" the net deposition thickness will exceed the bounds of layer "n" preferably by an amount greater than or equal to 6. In Regions 4 and 5 (these were the regions that were masked at the time of the deposition of element 910) the deposition thickness will be set equal to the layer thickness of layer "n" less the void depth (vdn) for layer "n". In other words, in Regions 4 and 5 the net deposition level will be set at a position that is the void depth less than the bounding level of layer "n". From element 912 the process moves forward to element 913. Element 913 makes the same inquiry as did 908. That is element 913 inquires as to whether or not a Region 4 or 5 area exists on layer "n". If the answer to this question is "no", the process moves forward to element 915 and if the answer is "yes", the process moves forward to element 914. In element 914 a deposition of sacrificial material is made such that the height in the void areas (Regions 4 or 5) reaches the bounding level of layer "n" or exceeds that bounding level.

Element 915 calls for the planarization of the deposits at a level that bounds layer "n". From element 915 the process moves forward to element 916.

Element 916 inquires as to whether or not the layer number variable "n" is equal to "N". "N" is the number of the last layer of the structure that is to be formed. If the answer to this inquiry is "yes", the process moves forward to element 922 which will be discussed hereinafter. If the answer to this inquiry is "no", the process moves forward to element 917.

In element 917 an inquiry is made as to whether or not layer "n" contains type 2 or type 5 regions. If the answer to this inquiry is "no", the process moves forward to element 921. If the answer is "yes", the process moves forward to element 918.

Element 918 calls for the formation of a mask on the bounding surface of layer "n" or alternatively the contacting of a preformed mask to that surface. The mask defines a pattern that leaves Region 6 areas exposed while it shields the other areas of the layer. From element 918 the process moves forward to element 919.

Element 919 calls for the etching away of the sacrificial material that is located in Region 2 or 5 (i.e. the regions of sacrificial material left exposed with in Region 6). The etching of sacrificial material may occur in a number of different ways including, for example, electrochemical etching or chemical etching. The created voids have been produced in layer "n" (Region 5) and in regions "n" and "n−1" (Region 2) so that interlacing elements may be formed in these regions during the formation of layer "n+1". From element 919 the process moves forward to element 920 which calls for the removal of the mask. From element 920 the process moves forward to element 921. Element 921 calls for incrementing the layer number variable "n" to a value of "n+1" after which the process loops back to element 905. The process continues to loop through elements 905 through 921 to form additional layers of the structure. This looping continues until a "yes" response to the inquiry of element 916 is received at which point the process moves forward to element 922 which indicates that the layer formation process is complete. From element 922 the process moves forward to element 923 which calls for the performance of any desired additional operations as well as the removal of sacrificial material to release the final three-dimensional structure. After these operations are complete the process moves forward to element 924 which ends the process.

FIGS. 29A-29KK provide schematic illustrations of various states of the process of FIG. 28 as applied to the formation of a particular three-dimensional structure formed from four layers.

FIG. 29A depicts a state of the process after the substrate 930 is supplied according to element 903 of FIG. 28.

FIG. 29B depicts the state of the process after a mask is applied to the substrate according to element 905 of FIG. 28. In FIG. 29B the mask is referenced with numeral 931.

FIG. 29C depicts the state of the process after deposition of a sacrificial material 932 occurs according to element 906 of FIG. 28.

FIG. 29D depicts the state of the process after the removal of the mask called for in element 907 of FIG. 28.

Figure 29G:
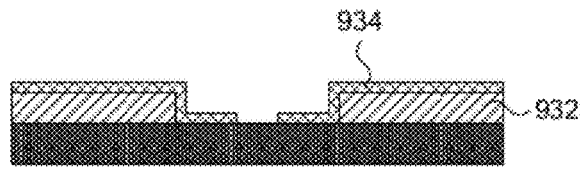
FIGS. 29A-29KK schematically depict side views of various states of the process of the flowchart of FIGS. 28A and 28B as applied to the formation of a particular three-dimensional structure formed from four layers.
Figure 29H:
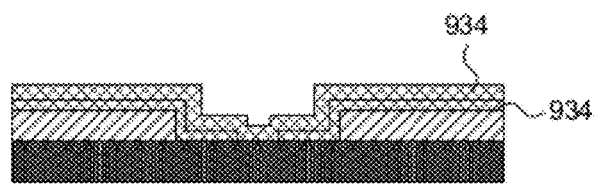
Figure 29I:
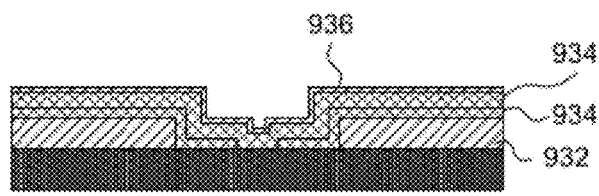
Figure 29J:
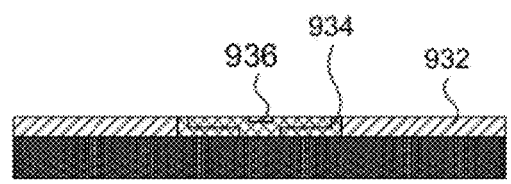
Figure 29K:
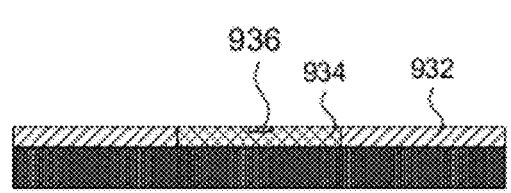
Figure 29L:
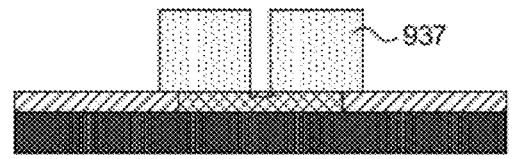
Figure 29M:
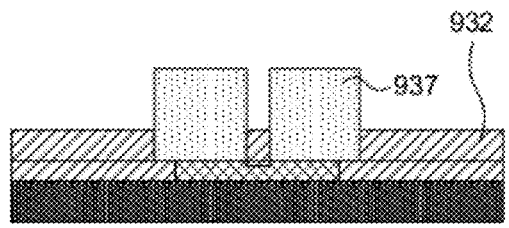
Figure 29N:
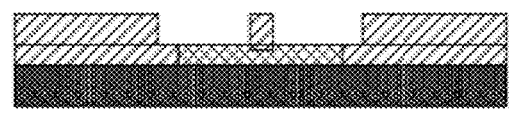
Figure 29O:
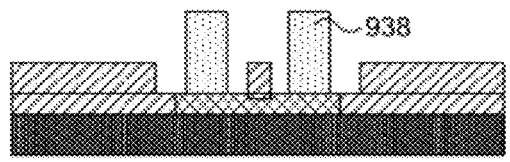
Figure 29P:
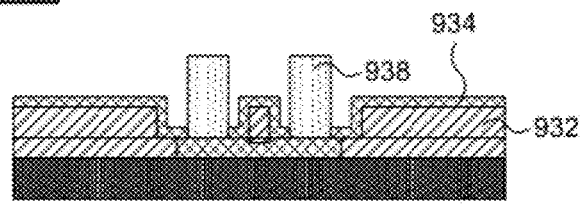
Figure 29Q:
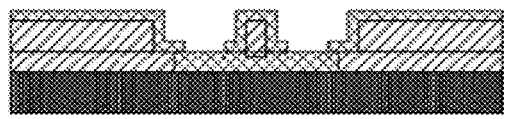
Figure 29R:
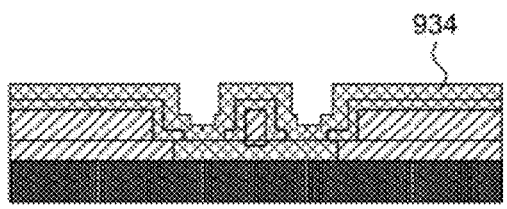
Figure 29S:
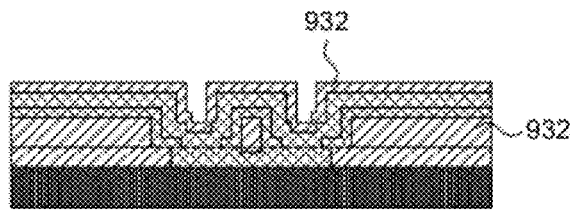
Figure 29T:
Figure 29U:
Figure 29V:
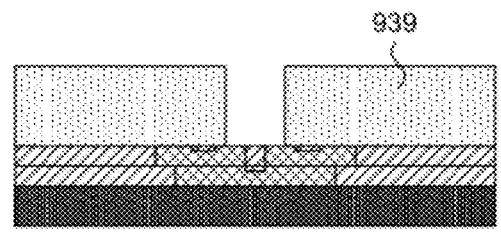
Figure 29W:
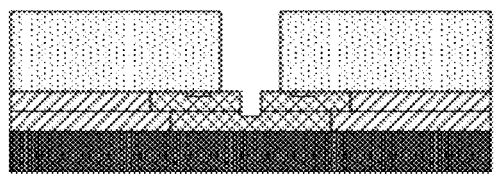
Figure 29X:
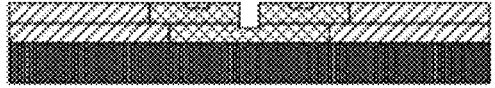
Figure 29E:
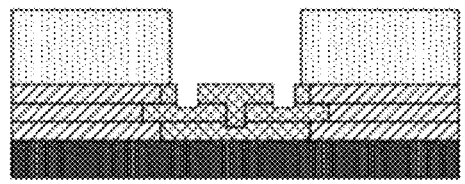

FIG. 29E depicts the state of the process after application of the mask 933 called for in element 909 of FIG. 28.

Figure 29F:
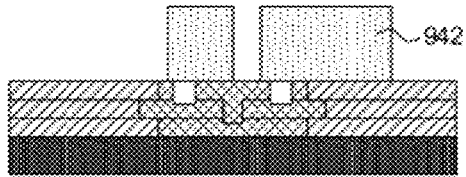
Figure 29G:
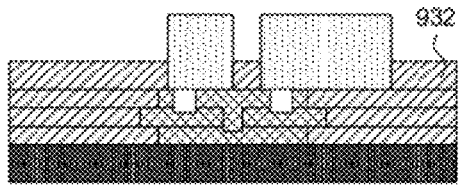
Figure 29H:
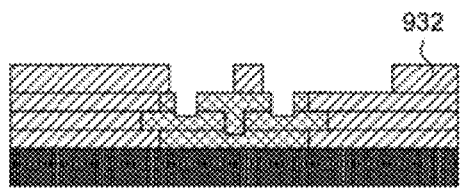
Figure 29I:
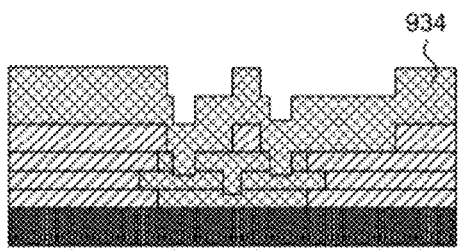
Figure 29J:
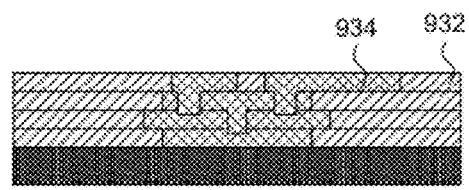
Figure 29K:
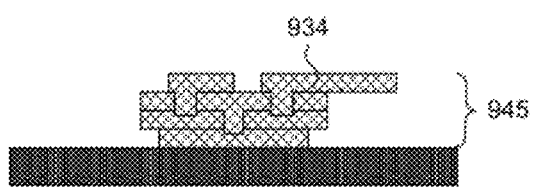

FIG. 29F depicts the state of the process after a first deposition of structural material 934 as called for by element 910 of FIG. 28.

FIG. 29G depicts the state of the process after removal of the mask called for by element 911 of FIG. 28.

FIG. 29H depicts the state of the process after a second deposition of structural material 934 according to element 912 of FIG. 28.

Similarly, FIG. 29I depicts the state of the process after deposition of a sacrificial material 936 according to the dictates of element 914 of FIG. 28.

FIG. 29J depicts the state of the process after the planarization operation of element 915 of FIG. 28 trims the heights of the various depositions to the bounding level for the first layer. Furthermore, FIG. 29J depicts the depositions of structural material associated with elements 910 and 912 as distinct entities while FIG. 29K depicts those depositions as a single entity.

FIG. 29L depicts the state of the process after locating a mask 937 on the bounding surface of layer "n−1" according to the dictates of element 905 of FIG. 28. As the first layer did not include any type 2 or type 5 regions the process leapt forward to element 921 of FIG. 28 which called for the incrementing of the layer number variable and from there looped back to element 905.

FIG. 29M depicts the state of the process after deposition of a sacrificial material 932 according to the dictates of element 906 of FIG. 28 while FIG. 29N depicts the state of the process after removal of the mask associated with element 907.

FIG. 29O depicts the state of the process after a mask 938 conforming to the dictates of element 909 has been applied.

FIG. 29P depicts the state of the process after a first deposition of material 904 in association with the second layer.

FIG. 29Q depicts the state of the process after removal of the mask 938.

FIG. 29R depicts the state of the process after a second deposition of structural material according to the dictates of element 912 of FIG. 28 while FIG. 29S depicts the state of the process after deposition of a sacrificial material according to the dictates of element 914.

FIG. 29T depicts the state of the process after the planarization operation of element 915 trims the depositions down to the bounding level of layer "n". FIG. 29T depicts the two structural material depositions of the second layer as being separate entities (as did FIG. 29R and FIG. 29S) while FIG. 29U depicts these two structural material depositions as a single entity.

FIG. 29V depicts the state of the process after application of a mask 939 according to the dictates of element 918.

FIG. 29W depicts the state of the process after the etching of element 919 removes the exposed sacrificial material while FIG. 29X depicts a similar state of the structure but after removal of the mask according to the dictates of element 920.

FIG. 29Y depicts the state of the process after application of a mask 940 according to the dictates of element 905. This mask is used for the patterning of sacrificial materials to type 1 and 2 regions that exist on the third layer.

FIG. 29Z depicts the state of the process after deposition of sacrificial material according to element 906 as applied to layer "n=3" while FIG. 29AA depicts the same state of the structure but after removal of the mask according to element 907.

FIG. 29BB depicts the state of the process after deposit of a structural material according to element 912. For the present layer the inquiry of 908 resulted in a "no" response as no type 4 or type 5 regions exist on the third layer, the process skipped elements 909 through 911 and proceeded immediately to element 912.

FIG. 29CC depicts the state of the process after the planarization of element 915 trims the depositions to a level that bounds the third layer. Due to the fact that the third layer contained no type 4 or type 5 regions the inquiry of element 913 diverted the processing away from element 914 and directed it to element 915.

FIG. 29DD depicts the state of the process after a mask 941 is applied according to element 918 in preparation for an etching operation that creates voids into which interlacing elements may be located.

FIG. 29EE depicts the state of the process after the etching operation of element 919 is completed.

FIG. 29FF depicts the state of the process after the process loops back to element 905 and the associated mask 942 is applied.

FIG. 29GG depicts the state of the process after sacrificial material is deposited according to element 906 while FIG. 29HH depicts a similar state of the structure but where the mask has been removed according to element 907.

FIG. 29II depicts the state of the process after completion of the deposition of structural material according to element 912. As with the third layer, the inquiry of element 908 caused the process to skip elements 909-911 and jump immediately to element 912.

FIG. 29JJ depicts the state of the process after the planarization operation of element 915 trims the depositions to a level that bounds the fourth layer. Next the process moves forward to element 916 of FIG. 28 which redirects the process through elements 922-924 as the layer variable number is equal to the number of the final layer of the structure.

FIG. 29KK depicts the state of the process after the removal operation of 923 removes the sacrificial material 932 leaving behind released structure 945.

Figure 30A:
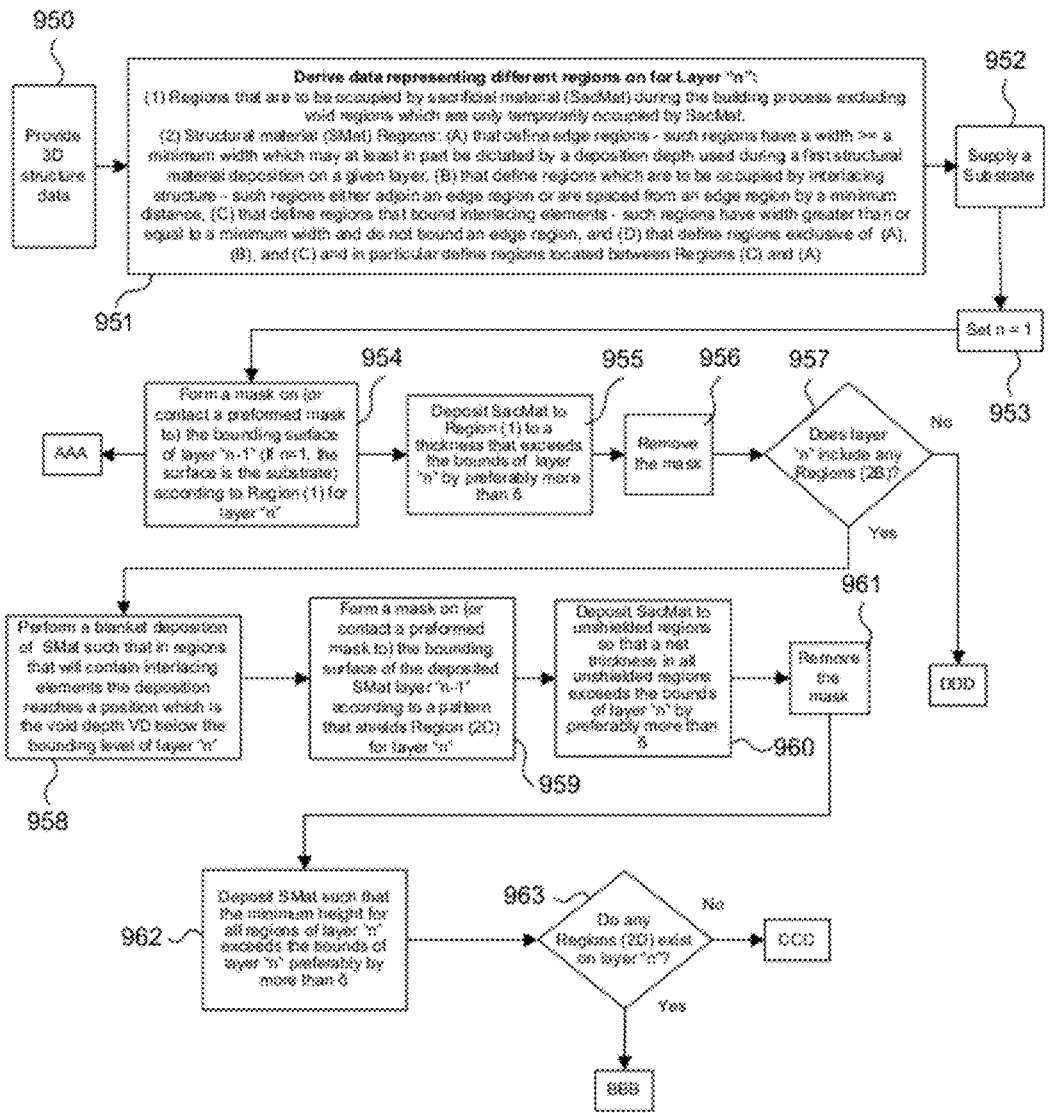
FIGS. 30A-30B depict a flowchart for forming a three-dimensional structure using interlaced layers wherein interlacing is of the partial layer type.
Figure 30B:
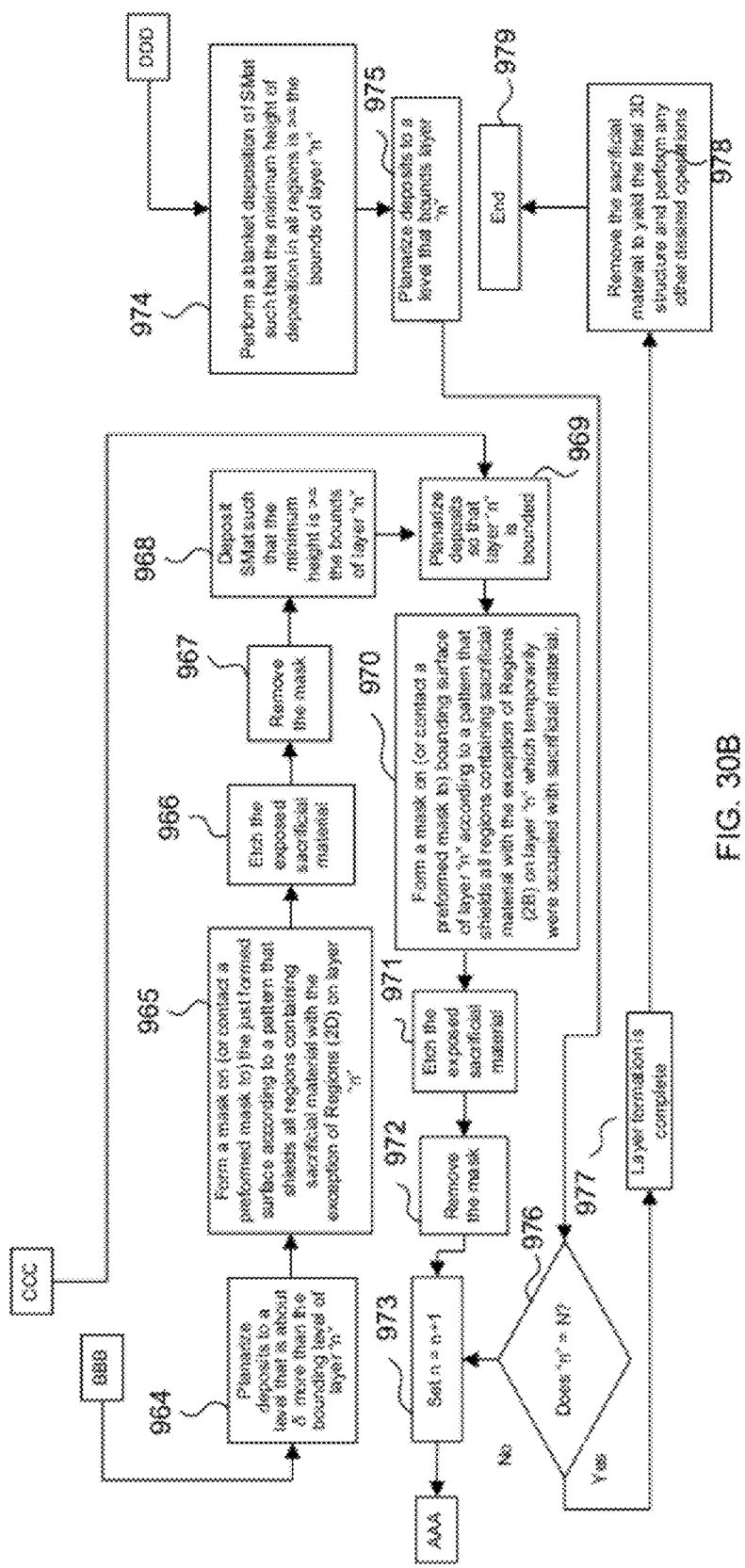

FIG. 30 depicts a flowchart for another embodiment for forming a three-dimensional structure using interlaced layers wherein interlacing is of the partial layer type. In this embodiment selective deposition operations and selective etching operations are limited to operating on the sacrificial material. The process of FIG. 30 begins with element 950 which calls for providing data descriptive of a three-dimensional structure to be formed.

The process then moves forward to element 951 which calls for deriving data representing different regions for each layer "n" and the associated build volume. A first region (Region 1) defines areas of the layer "n" that are to be occupied by sacrificial material (SacMat) during the building process but excluding void regions which are only temporarily occupied by sacrificial material. Another four regions define various sub regions associated with the placement of structural material on layer "n".

A Region 2(A) defines edge regions which are regions that have a width which is greater than or equal to a minimum width where the minimum width may at least in part be dictated by a deposition depth that is used during a first structural material deposition process on layer "n". The type 2(A) regions define a band of structural material around the perimeter of the structural material regions.

Another region, Region 2(B) defines regions which are to be occupied by interlacing elements. These interlacing element regions either adjoin an edge region or are spaced from an edge region by a minimum distance. In this embodiment the minimum distance requirement is set so that masks may be inserted or formed in the regions between the interlacing elements and the edge regions without the mask needing to contact the edge region. In some embodiments such a minimum distance may not be required.

Another structural material region, Region 2(C) defines areas that bound interlacing elements. These regions have a width which is greater than or equal to a minimum width and they do not bound an edge region.

A fourth structural material region, Region 2(D), defines all remaining structural material areas which do not form parts of regions 2(A), 2(B), or 2(C). In particular these regions may be used to define areas located between type 2(C) and type 2(A) regions. After the required data is derived the process moves forward to element 952 which calls for the supplying of a substrate and thereafter moves forward to element 953 which calls for the setting of a layer number variable "n" to a value of 1.

Next the process moves forward to element 954 which calls for the formation of a mask on the bounding surface of layer "n−1" or alternatively contacting a preformed mask to the surface. The mask is defined such that areas of Region 1 remain exposed while other portions of the layer are shielded. After the mask is formed the process moves forward to element 955 which calls for the deposition of a sacrificial material into Region 1. The thickness of deposition is selected such that the bounds of layer "n" are exceeded by an incremental amount in excess of δ.

After deposition is complete the mask is removed as indicated by element 956.

Next, as indicated by element 957 an inquiry is made as to whether layer "n" includes any type 2(B) regions. If the answer is "no", the process moves forward to element 974 whereas if the answer is "yes", the process moves forward to element 958. A negative response to the inquiry can potentially occur for any layer. However, it is most likely to occur when the current layer "n" is the last layer of structure "N", as such an explanation of element 974 and subsequent operations will be discussed after proceeding through the primary process flow.

Element 958 calls for the blanket deposition of a structural material (SMat) such that in regions that will contain interlacing elements the deposition reaches a position which is the void depth (vd) below the bounding level for layer "n". In other words, the deposition thickness in the type 2(B) regions will be set to a desired value by this operation.

Next the process moves forward to element 959 which calls for the formation of a mask on the bounding surface of the just deposited structural material according to a pattern which shields the type 2 regions for layer "n".

After formation of the mask the process proceeds to element 960 which calls for deposition of a sacrificial material to the unshielded regions, such that the net thickness in all of these regions exceeds the bounds of layer "n" preferably by an incremental amount that is greater than delta (e.g. to δ). After the deposition, the process proceeds to element 961 which calls for the removal of the mask after which a second deposit of structural material occurs, such that the minimum height of deposition for all regions of layer "n" exceeds the bounds of layer "n" preferably by an incremental amount which is greater than δ.

Next an inquiry is made as to whether layer "n" includes type 2(D) regions. If the answer is "no", the process jumps ahead to element 969 whereas if the answer is "yes", the process proceeds to the element 964. Element 964 calls for planarizing the deposits to trim the depositions down to a level that is an incremental amount δ beyond the bounding level of layer "n" (i.e. the planarization level results in material remaining located in the layer "n+1" region). After the planarization operation the process moves forward to element 965 which calls for formation of a mask on the planarized surface according to a pattern that shields all regions containing sacrificial material with the exception of the type 2(D) regions that exist on layer "n". As an alternative to forming a mask, a preformed mask may be contacted to the planarized surface.

Next element 966 calls for the etching of the exposed sacrificial material. That is to say the sacrificial material in Region 2(D) of layer "n" will be removed. After the etching operation is completed, the mask is removed as indicated by element 967. Element 968 calls for the blanket deposition of structural material such that the minimum height resulting from the deposition will be greater than or equal to the bounds of layer "n". As all regions other than the 2(D) regions have surface levels that exceed the bounds of layer "n", it is only the deposition into the 2(D) regions that are of concern in setting an appropriate amount of deposition for this element.

Next the resulting deposits are planarized so that their surface level is trimmed to lie along the bounding level of layer "n" as indicated by element 969.

The process next proceeds to element 970 which calls for the formation of a mask on the bounding surface or the contacting of a preformed mask to the bounding surface of layer "n" according to a pattern that shields all regions containing sacrificial material with the exception of Regions 2(B) on layer "n" which were temporarily provided with sacrificial material as a result of the deposition of element 960. Elements 971 and 972 call for the etching of the exposed sacrificial material and then the removal of the mask, respectively. At this point voids exist in the surface of layer "n" and layer "n" is prepared for the formation of a next layer which will form interlacing elements that connect it to layer "n".

The process moves forward to element 973 which calls for incrementing the layer number variable "n" to a value of "n+1". Next the process loops back to element 954 which begins operations associated with the formation of a subsequent layer.

As noted previously if a "no" response results from the inquiry of element 957, the process moves forward to element 974. A "no" response to this inquiry indicates that the current layer "n" does not contain any interlacing elements and as such the layer formation process may be simplified.

Element 974 calls for the blanket deposition of structural material such that the minimum height of deposition in all regions of layer "n" is greater than or equal to the bounding level for layer "n". After which the process moves forward to element 975 which calls for planarizing the resulting deposits to a level that corresponds to the bounding level of layer "n".

Next the process moves forward to the inquiry of element 976 which asks whether the layer variable "n" has a value which is equal to the number of the last layer of structure to be formed. If the answer is "no" the process loops back to element 973 which increments the layer variable number and then continues the process of forming at least one additional layer. If the answer to the inquiry is "yes", that is, the last layer of the structure has been formed, the process moves forward to element 977 which indicates that layer formation is completed.

Next the process moves forward to element 978 which calls for the removal of the sacrificial material so that the final three-dimensional structure is released and it also calls for the performance of any other desired operations. The process then moves forward and ends with element 979.

FIGS. 31A-31FF provide schematic illustrations of side views of various states of the process of FIG. 30 as applied to a specific example of the formation of a 3 layer structure.

Figure 31A:
FIGS. 31A-31FF schematically depict side views of various states of the process of the flowchart of FIGS. 30A-30B as applied to a specific example of the formation of a three layer structure.

FIG. 31A depicts the state of the process after a substrate 980 is supplied according to the dictates of element 952 of FIG. 30.

Figure 31B:
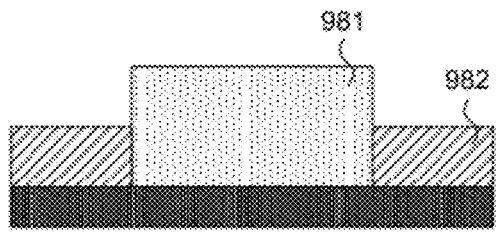

FIG. 31B depicts the state of the process after a mask 981 is applied and a sacrificial material 982 is deposited according to the dictates of elements 954 and 955 of FIG. 30, respectively.

Figure 31C:
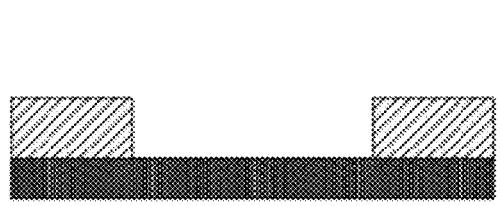

FIG. 31C depicts the state of the process after removal of the mask 981 according to element 956.

Figure 31D:
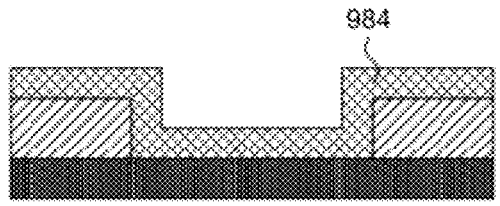

FIG. 31D depicts the state of the process after deposition of a structural material 984 according to element 958 of FIG. 30.

Figure 31E:
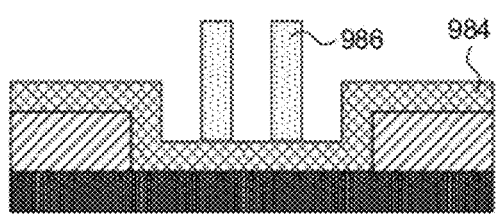

FIG. 31E depicts the state of the process after a mass 986 is applied to the deposited material 984 according to the dictates of element 959 of FIG. 30.

Figure 31F:
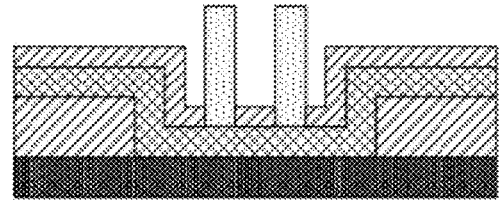
Figure 31G:
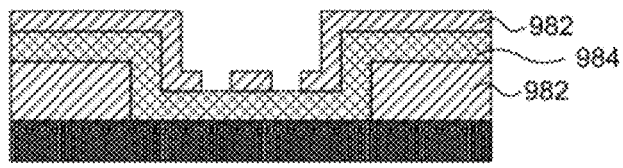
Figure 31H:
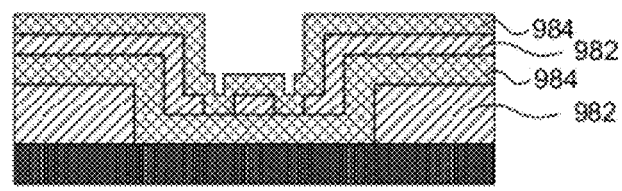

FIG. 31F depicts the state of the process after deposition of a sacrificial material according to the dictates of 960 while FIG. 31G depicts the same state of the structure after removal of the mask according to element 961, FIG. 31H depicts the state of the process after deposition of a structural material according to the dictates of element 962 of FIG. 30.

Figure 31I:

FIG. 31I depicts the state of the process after the deposits are planarized to a level that bounds layer "n", as indicated by element 969 of FIG. 30. It is noted that the process skipped from element 963 to element 969 for this first layer as the first layer did not contain any type 2(D) regions.

Figure 31J:

FIG. 31J depicts the state of the process after application of a mask to the planarized surface (element 970), etching of exposed sacrificial material (element 971), and removal of the mask (element 972).

Figure 31K:
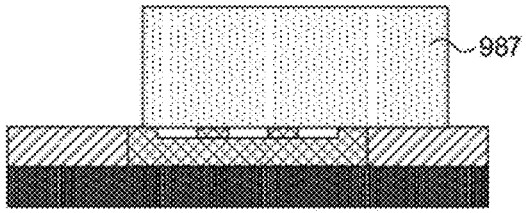

FIG. 31K depicts the state of the process after application of a mask 987 to the etched surface according to the dictates of element 954 as applied to the formation of a second layer.

Figure 31L:
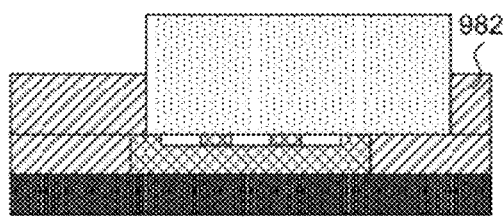

FIG. 31L depicts the state of the process after deposition of a sacrificial material according to the dictates of element 955, while FIG. 31M depicts the state of the process after removal of the mask as indicated by element 956.

FIG. 31N depicts the state of the process after a blanket deposition of structural material according to the dictates of element 958 where the height of deposition in regions that will contain interlacing elements is set to a depth (vd) below the bounding level for layer "n".

FIG. 31O depicts the state of the process after application of a mask 988 according the dictates of element 959.

FIG. 31P depicts the state of the process after a deposition of sacrificial material occurs according to the dictates of element 960 of FIG. 30, while FIG. 31Q depicts the same state of the structure after removal of the mask as indicated by element 961.

FIG. 31R depicts the state of the process associated with the formation of the second layer after deposition of structural material according to the requirements of element 962 of FIG. 30.

Figure 31S:
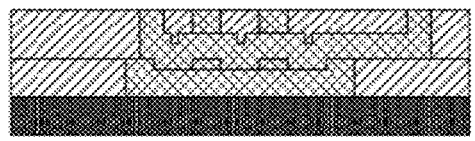

FIG. 31S depicts the state of the process after planarization of the material deposited in association with the second layer to a level that is approximately an incremental amount δ beyond the bounding level of layer "n" as indicated by element 964. The process moves from element 963 to element 964 in the formation of the second layer since the second layer includes type 2(D) regions.

Figure 31T:
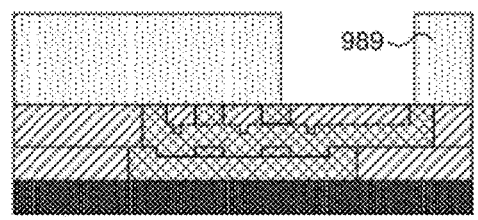
Figure 31U:
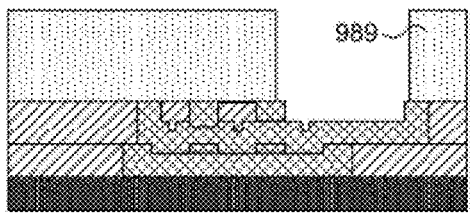

FIG. 31T depicts the state of the process after application of a mask shields sacrificial material not associated with type 2(D) regions, while FIG. 31U depicts the state of the process after etching away sacrificial material associated with the type 2(D) region as dictated by elements 965 and 966, respectively.

Figure 31V:
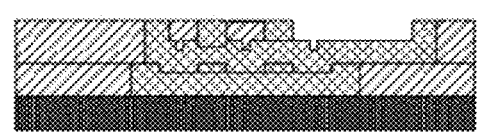

FIG. 31V depicts a state of the process after removal of the mask 989.

Figure 31W:
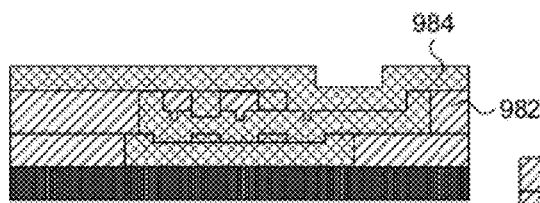

FIG. 31W depicts the state of the process after deposition of structural material according to the requirements of element 968.

Figure 31X:
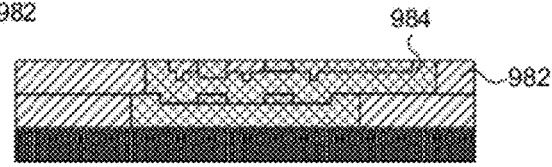

FIG. 31X depicts the state of the process after planarization of the layer to deposit a level that bounds the second layer as indicated by element 969.

Figure 31Y:
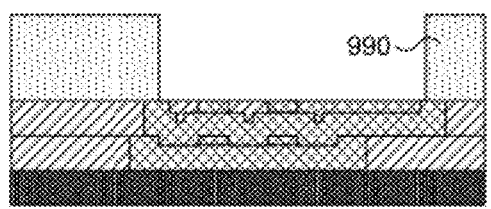

FIG. 31Y depicts the state of the process after application of a mask 990 according to the dictates of element 970 where the mask shields sacrificial material regions with the exception of the type 2(B) regions which will be removed to form voids in preparation for forming interlacing elements in association with the third layer of the structure.

Figure 31Z:
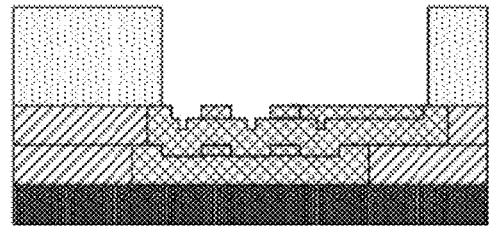
Figure 31A:
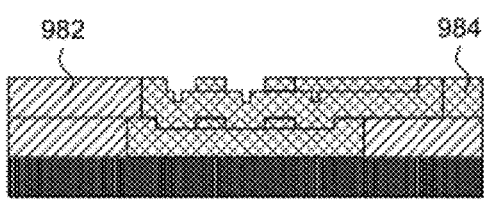
Figure 31B:
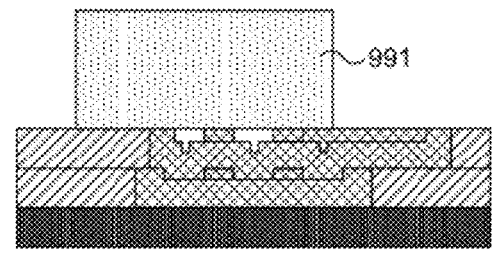
Figure 31C:
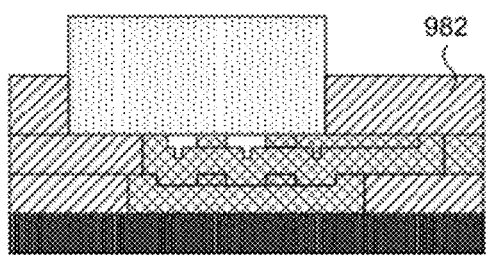
Figure 31D:
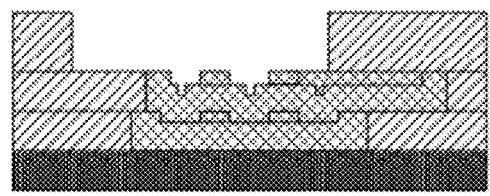
Figure 31E:
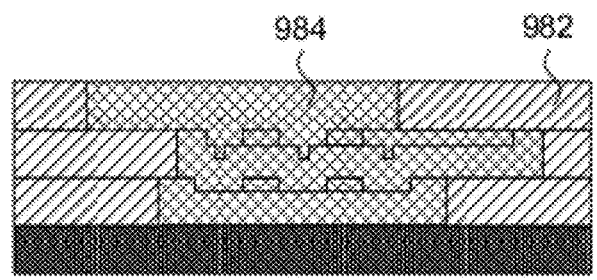
Figure 31F:
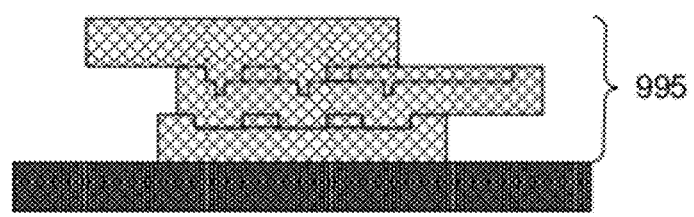

FIG. 31Z depicts the state of the process after etching away exposed sacrificial material as dictated by element 971.

FIG. 31AA depicts the state of the process after removal of the etching mask as indicated by element 972.

FIG. 31BB depicts the state of the process after looping back to element 954 and the associated contacting of a mask 991 to the surface of the second layer.

FIG. 31CC depicts the state of the process after depositing sacrificial material according to element 955, while FIG. 31DD depicts the state of the process after the removal of the mask as indicated by element 956.

FIG. 31EE depicts the state of the process after a blanket deposition (element 974) and a planarization of the deposits to a level that bounds layer "n" (element 975).

FIG. 31FF depicts the state of the process after performance of the inquiry of element 976, the conclusion that layer formation is complete as indicated by element 977, and after removal of sacrificial material as dictated by element 978 to release the final three-dimensional structure 995.

As with the previously presented embodiments various alternatives to the present embodiment are possible and will be apparent to those of skill in the art upon review of the teachings herein. In particular various alternative embodiments may be derived from a combination of the present embodiment with other embodiments explicitly set forth herein. Still further embodiments will be understood by those of skill in the art based on a combination of the teachings explicitly set forth herein and the teachings incorporated herein by reference. Even further embodiments will be understood by those of skill in the art based on numerous alternative layer data representational schemes that can be developed.

It will be understood by those of skill in the art or will be readily ascertainable by them that various additional operations may be added to the processes set forth herein. For example, between performances of the various deposition operations, the various etching operations, and the various planarization operations cleaning operations, activation operations, and the like may be desirable.

The patent applications and patents set forth below are hereby incorporated by reference herein as if set forth in full. The gist of each patent application or patent is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways: For example, enhanced methods of producing structures may be derived from the combination of teachings, enhanced structures may be obtainable, enhanced apparatus may be derived, and the like.

U.S. patent application Ser. No. 09/488,142, filed Jan. 20, 2000, and entitled "An Apparatus for Electrochemical Fabrication Comprising a Conformable Mask" is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks.

U.S. Patent Application No. 60/415,374, filed on Oct. 1, 2002, and entitled "Monolithic Structures Including Alignment and/or Retention Fixtures for Accepting Components" is generally directed to permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components.

U.S. Patent Application No. 60/464,504, filed on Apr. 21, 2003, and entitled "Methods of Reducing Discontinuities Between Layers of Electrochemically Fabricated Structures" is generally directed to various embodiments providing electrochemical fabrication methods and apparatus for the production of three-dimensional structures from a plurality of adhered layers of material including operations or structures for reducing discontinuities in the transitions between adjacent layers. Some embodiments improve the conformance between a size of produced structures (especially in the transition regions associated with layers having offset edges) and the intended size of the structure as derived from original data representing the three-dimensional structures. Some embodiments make use of selective and/or blanket chemical and/or electrochemical deposition processes, selective and or blanket chemical and/or electrochemical etching process, or combinations thereof. Some embodiments make use of multi-step deposition or etching operations during the formation of single layers.

U.S. Patent Application No. 60/468,979, filed on May 7, 2003, and entitled "EFAB With Selective Transfer Via Instant Mask" is generally directed to three-dimensional structures that are electrochemically fabricated by depositing a first material onto previously deposited material through voids in a patterned mask where the patterned mask is at least temporarily adhered to a substrate or previously formed layer of material and is formed and patterned onto the substrate via a transfer tool patterned to enable transfer of a desired pattern of precursor masking material. In some embodiments the precursor material is transformed into masking material after transfer to the substrate while in other embodiments the precursor is transformed during or before transfer. In some embodiments layers are formed one on top of another to build up multi-layer structures. In some embodiments the mask material acts as a build material while in other embodiments the mask material is replaced each layer by a different material which may, for example, be conductive or dielectric.

U.S. Patent Application No. 60/469,053, filed on May 7, 2003, and entitled "Three-Dimensional Object Formation Via Selective Inkjet Printing & Electrodeposition" is generally directed to three-dimensional structures that are electrochemically fabricated by depositing a first material onto previously deposited material through voids in a patterned mask where the patterned mask is at least temporarily adhered to previously deposited material and is formed and patterned directly from material selectively dispensed from a computer controlled dispensing device (e.g. an ink jet nozzle or array or an extrusion device). In some embodiments layers are formed one on top of another to build up multi-layer structures. In some embodiments the mask material acts as a build material while in other embodiments the mask material is replaced each layer by a different material which may, for example, be conductive or dielectric.

U.S. patent application Ser. No. 10/271,574, filed on Oct. 15, 2002, and entitled "Methods of and Apparatus for Making High Aspect Ratio Microelectromechanical Structures" is generally directed to various embodiments for forming structures (e.g. HARMS-type structures) via an electrochemical extrusion (ELEX™) process. Preferred embodiments perform the extrusion processes via depositions through anodeless conformable contact masks that are initially pressed against substrates that are then progressively pulled away or separated as the depositions thicken. A pattern of deposition may vary over the course of deposition by including more complex relative motion between the mask and the substrate elements. Such complex motion may include rotational components or translational motions having components that are not parallel to an axis of separation. More complex structures may be formed by combining the ELEX™ process with the selective deposition, blanket deposition, planarization, etching, and multi-layer operations of EFAB™.

U.S. Patent Application No. 60/435,324, filed on Dec. 20, 2002, and entitled "EFAB Methods and Apparatus Including Spray Metal or Powder Coating Processes", is generally directed to techniques for forming structures via a combined electrochemical fabrication process and a thermal spraying process. In a first set of embodiments, selective deposition occurs via conformable contact masking processes and thermal spraying is used in blanket deposition processes to fill in voids left by selective deposition processes. In a second set of embodiments, selective deposition via a conformable contact masking is used to lay down a first material in a pattern that is similar to a net pattern that is to be occupied by a sprayed metal. In these embodiments a second material is blanket deposited to fill in the voids left in the first pattern, the two depositions are planarized to a common level that may be somewhat greater than a desired layer thickness, the first material is removed (e.g. by etching), and a third material is sprayed into the voids left by the etching operation. The resulting depositions in both the first and second sets of embodiments are planarized to a desired layer thickness in preparation for adding additional layers to form three-dimensional structures from a plurality of adhered layers. In other embodiments, additional materials may be used and different processes may be used.

U.S. Patent Application No. 60/429,483, filed on Nov. 26, 2002, and entitled "Multi-cell Masks and Methods and Apparatus for Using Such Masks to Form Three-Dimensional Structures" is generally directed to multi-layer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibiting significant deposition or etching.

U.S. Patent Application No. 60/429,484, filed on Nov. 26, 2002, and entitled "Non-Conformable Masks and Methods and Apparatus for Forming Three-Dimensional Structures" is generally directed to electrochemical fabrication used to form multi-layer structures (e.g. devices) from a plurality of overlaying and adhered layers. Masks, that are independent of a substrate to be operated on, are generally used to achieve selective patterning. These masks may allow selective deposition of material onto the substrate or they may allow selective etching of a substrate where after the created voids may be filled with a selected material that may be planarized to yield in effect a selective deposition of the selected material. The mask may be used in a contact mode or in a proximity mode. In the contact mode the mask and substrate physically mate to form substantially independent process pockets. In the proximity mode, the mask and substrate are positioned sufficiently close to allow formation of reasonably independent process pockets. In some embodiments, masks may have conformable contact surfaces (i.e. surfaces with sufficient deformability that they can substantially conform to surface of the substrate to form a seal with it) or they may have semi-rigid or even rigid surfaces. Post deposition etching operations may be performed to remove flash deposits (thin undesired deposits).

U.S. patent application Ser. No. 10/309,521, filed on Dec. 3, 2002, and entitled "Miniature RF and Microwave Components and Methods for Fabricating Such Components" is generally directed to RF and microwave radiation directing or controlling components that may be monolithic, that may be formed from a plurality of electrodeposition operations and/or from a plurality of deposited layers of material, that may include switches, inductors, antennae, transmission lines, filters, and/or other active or passive components. Components may include non-radiation-entry and non-radiation-exit channels that are useful in separating sacrificial materials from structural materials. Preferred formation processes use electrochemical fabrication techniques (e.g. including selective depositions, bulk depositions, etching operations and planarization operations) and post-deposition processes (e.g. selective etching operations and/or back filling operations).

U.S. Patent Application No. 60/468,977, filed on May 7, 2003, and entitled "Method for Fabricating Three-Dimensional Structures Including Surface Treatment of a First Material in Preparation for Deposition of a Second Material" is generally directed to a method of fabricating three-dimensional structures from a plurality of adhered layers of at least a first and a second material wherein the first material is a conductive material and wherein each of a plurality of layers includes treating a surface of a first material prior to deposition of the second material. The treatment of the surface of the first material either (1) decreases the susceptibility of deposition of the second material onto the surface of the first material or (2) eases or quickens the removal of any second material deposited on the treated surface of the first material. In some embodiments the treatment of the first surface includes forming a dielectric coating over the surface while the deposition of the second material occurs by an electrodeposition process (e.g. an electroplating or electrophoretic process).

U.S. patent application Ser. No. 10/387,958, filed on Mar. 13, 2003, and entitled "Electrochemical Fabrication Method and Apparatus for Producing Three-Dimensional Structures Having Improved Surface Finish" is generally directed to an electrochemical fabrication process that produces three-dimensional structures (e.g. components or devices) from a plurality of layers of deposited materials wherein the formation of at least some portions of some layers are produced by operations that remove material or condition selected surfaces of a deposited material. In some embodiments, removal or conditioning operations are varied between layers or between different portions of a layer such that different surface qualities are obtained. In other embodiments varying surface quality may be obtained without varying removal or conditioning operations but instead by relying on differential interaction between removal or conditioning operations and different materials encountered by these operations.

U.S. patent application Ser. No. 10/434,494, filed on May 7, 2003, and entitled "Methods and Apparatus for Monitoring Deposition Quality During Conformable Contact Mask Plating Operations" is generally directed to a electrochemical fabrication (e.g. EFAB) processes and apparatus are disclosed that provide monitoring of at least one electrical parameter (e.g. voltage) during selective deposition where the monitored parameter is used to help determine the quality of the deposition that was made. If the monitored parameter indicates that a problem occurred with the deposition, various remedial operations may be undertaken to allow successful formation of the structure to be completed.

U.S. patent application Ser. No. 10/434,289, filed on May 7, 2003, and entitled "Conformable Contact Masking Methods and Apparatus Utilizing In Situ Cathodic Activation of a Substrate" is generally directed to an electroplating processes (e.g. conformable contact mask plating and electrochemical fabrication processes) that includes in situ activation of a surface onto which a deposit will be made. At least one material to be deposited has an effective deposition voltage that is higher than an open circuit voltage, and wherein a deposition control parameter is capable of being set to such a value that a voltage can be controlled to a value between the effective deposition voltage and the open circuit voltage such that no significant deposition occurs but such that surface activation of at least a portion of the substrate can occur. After making electrical contact between an anode, that comprises the at least one material, and the substrate via a plating solution, applying a voltage or current to activate the surface without any significant deposition occurring, and thereafter without breaking the electrical contact, causing deposition to occur.

U.S. patent application Ser. No. 10/434,294, filed on May 7, 2003, and entitled "Electrochemical Fabrication Methods With Enhanced Post Deposition Processing" is generally directed to a electrochemical fabrication process for producing three-dimensional structures from a plurality of adhered layers is provided where each layer comprises at least one structural material (e.g. nickel) and at least one sacrificial material (e.g. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. A simple process for drying the etched structure without the drying process causing surfaces to stick together includes immersion of the structure in water after etching and then immersion in alcohol and then placing the structure in an oven for drying.

U.S. patent application Ser. No. 10/434,295, filed on May 7, 2003, and entitled "Method of and Apparatus for Forming Three-Dimensional Structures Integral with Semiconductor Based Circuitry" is generally directed to enhanced electrochemical fabrication processes that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion damage by application of appropriate barrier layers. In some embodiments, nickel is applied to the aluminum contact pads via solder bump formation techniques using electroless nickel plating. In other embodiments, selective electroless copper plating or direct metallization is used to plate sacrificial material directly onto dielectric passivation layers. In still other embodiments, structural material deposition locations are shielded, then sacrificial material is deposited, the shielding is removed, and then structural material is deposited.

U.S. patent application Ser. No. 10/434,315, filed on May 7, 2003, and entitled "Methods of and Apparatus for Molding Structures Using Sacrificial Metal Patterns" is generally directed to molded structures, methods of and apparatus for producing the molded structures. At least a portion of the surface features for the molds are formed from multi-layer electrochemically fabricated structures (e.g. fabricated by the EFAB™ formation process), and typically contain features having resolutions within the 1 to 100 µm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure.

U.S. patent application Ser. No. 10/434,493, filed on May 7, 2003, and entitled "Electrochemically Fabricated Structures Having Dielectric or Active Bases and Methods of and Apparatus for Producing Such Structures" is generally directed to multi-layer structures that are electrochemically fabricated on a temporary (e.g. conductive) substrate and are thereafter bonded to a permanent (e.g. dielectric, patterned, multi-material, or otherwise functional) substrate and removed from the temporary substrate. In some embodiments, the structures are formed from top layer to bottom layer, such that the bottom layer of the structure becomes adhered to the permanent substrate, while in other embodiments the structures are formed from bottom layer to top layer and then a double substrate swap occurs. The permanent substrate may be a solid that is bonded (e.g. by an adhesive) to the layered structure or it may start out as a flowable material that is solidified adjacent to or partially surrounding a portion of the structure with bonding occurs during solidification. The multi-layer structure may be released from a sacrificial material prior to attaching the permanent substrate or it may be released after attachment.

U.S. patent application Ser. No. 10/434,103, filed on May 7, 2003, and entitled "Electrochemically Fabricated Hermetically Sealed Microstructures and Methods of and Apparatus for Producing Such Structures" is generally directed to multi-layer structures that are electrochemically fabricated from at least one structural material (e.g. nickel), at least one sacrificial material (e.g. copper), and at least one sealing material (e.g. solder). In some embodiments, the layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. In other embodiments, a post-layer formation lid or other enclosure completing structure is added.

U.S. patent application Ser. No. 10/434,497, filed on May 7, 2003, and entitled "Multistep Release Method for Electrochemically Fabricated Structures" is generally directed to multi-layer structures that are electrochemically fabricated from at least one structural material (e.g. nickel), that is configured to define a desired structure and which may be attached to a substrate, and from at least one sacrificial material (e.g. copper) that surrounds the desired structure. After structure formation, the sacrificial material is removed by a multi-stage etching operation. In some embodiments sacrificial material to be removed may be located within passages or the like on a substrate or within an add-on component. The multi-stage etching operations may be separated by intermediate post processing activities, they may be separated by cleaning operations, or barrier material removal operations, or the like. Barriers may be fixed in position by contact with structural material or with a substrate or they may be solely fixed in position by sacrificial material and are thus free to be removed after all retaining sacrificial material is etched.

Various other embodiments exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use one or more structural materials (e.g. nickel, gold, copper, or silver). Still other processes may use other materials whether or not electrodepositable. Some processes may use one or more sacrificial materials (e.g. copper). Some embodiments may use copper as the structural material with or without a sacrificial material. Some embodiments may remove a sacrificial material while other embodiments may not. In some embodiments, the depth of deposition will be enhanced by separating a conformable contact mask away from the substrate as deposition is occurring in a manner that allows the seal between the conformable portion of the mask and the substrate to shift from the face of the conformal material to the inside edges of the conformable material.

In view of the teachings herein, many further embodiments, alternatives in design and uses are possible and will be apparent to those of skill in the art. As such, it is not intended that the invention be limited to the particular illustrative embodiments, alternatives, and uses described above but instead that it be solely limited by the claims presented hereafter.

I claim:

1. A method for processing data representing a three-dimensional structure to obtain cross-sectional data for use in forming the three-dimensional structure from a plurality of adhered layers, comprising:
    (a) receiving data representing a three-dimensional structure to be formed;
    (b) deriving preliminary cross-sectional data for each layer that will be used during the formation of the three-dimensional structure;
    (c) deriving common data for each layer n-1, representing intersections between structural material that will exist on layer n and on layer n-1 during formation of the three-dimensional structure;
    (d) deriving offset data from the common data that has a boundary that is offset inward relative to the common data;
    (e) deriving a pattern of etching holes from the offset data for each layer using a predefined grid pattern of etching hole patterns; and
    using the preliminary cross-sectional data and the pattern of etching holes to create a three-dimensional structure from the plurality of adhered multi-material layers.

* * * * *